US012733511B2

(12) United States Patent
Saito et al.

(10) Patent No.: US 12,733,511 B2
(45) Date of Patent: Sep. 8, 2026

(54) METHOD FOR MANUFACTURING SEMICONDUCTOR APPARATUS AND SEMICONDUCTOR APPARATUS

(71) Applicant: ROHM CO., LTD., Kyoto (JP)

(72) Inventors: Koshun Saito, Kyoto (JP); Kota Ise, Kyoto (JP); Kosuke Yamada, Kyoto (JP)

(73) Assignee: ROHM CO., LTD., Kyoto (JP)

( * ) Notice: Subject to any disclaimer, the term of this patent is extended or adjusted under 35 U.S.C. 154(b) by 578 days.

(21) Appl. No.: 18/249,473

(22) PCT Filed: Dec. 14, 2021

(86) PCT No.: PCT/JP2021/045986

§ 371 (c)(1),
(2) Date: Apr. 18, 2023

(87) PCT Pub. No.: WO2022/138318

PCT Pub. Date: Jun. 30, 2022

(65) Prior Publication Data

US 2024/0112990 A1 Apr. 4, 2024

(30) Foreign Application Priority Data

Dec. 23, 2020 (JP) ................................ 2020-213393
Nov. 25, 2021 (JP) ................................ 2021-191514

(51) Int. Cl.
*H10W 70/40* (2026.01)
*H10W 72/00* (2026.01)
(Continued)

(52) U.S. Cl.
CPC ......... *H10W 70/40* (2026.01); *H10W 70/415* (2026.01); *H10W 70/417* (2026.01);
(Continued)

(58) Field of Classification Search
CPC ............................................ H01L 2924/13064
See application file for complete search history.

(56) References Cited

U.S. PATENT DOCUMENTS 9,620,471 B2 * 4/2017 Standing ................. H01L 24/97
2004/0164407 A1 * 8/2004 Nakajima ............ H10D 64/257
257/E29.12

(Continued)

FOREIGN PATENT DOCUMENTS

CN 101685810 3/2010
JP 11-177007 7/1999

(Continued)

OTHER PUBLICATIONS

International Search Report issued in International Application No. PCT/JP2021/045986, Mar. 15, 2022, 2 pages.

(Continued)

*Primary Examiner* — Eliseo Ramos Feliciano
*Assistant Examiner* — Adam Joseph Mott
(74) *Attorney, Agent, or Firm* — HSML P.C.

(57) ABSTRACT

A semiconductor device manufacturing method includes a first preparation step, a second preparation step, a mounting step, a third preparation step, a placing step and a curing step. In the first preparation step, a first leadframe including an island part is prepared. In the second preparation step, a semiconductor element including an element obverse surface, an element reverse surface, a first electrode and a second electrode is prepared. In the mounting step, the (Continued)

semiconductor element is mounted on the island part with a first conductive paste interposed between the element reverse surface and the island part. In the third preparation step, a second leadframe including a first part, a second part, a frame part, a first connecting part and a second connecting part is prepared. In the placing step, the second leadframe is placed with a second conductive paste interposed between the first part and the first electrode and with a third conductive paste interposed between the second part and the second electrode. In the curing step, the first conductive paste, the second conductive paste and the third conductive paste are hardened.

23 Claims, 49 Drawing Sheets

(51) Int. Cl.

| | |
|---|---|
| ***H10W 72/60*** | (2026.01) |
| ***H10W 72/90*** | (2026.01) |
| ***H10W 90/00*** | (2026.01) |
| *H10D 12/00* | (2025.01) |
| *H10D 30/47* | (2025.01) |

(52) U.S. Cl.

CPC ......... *H10W 70/442* (2026.01); *H10W 72/60* (2026.01); *H10W 72/647* (2026.01); *H10W 72/886* (2026.01); *H10W 72/932* (2026.01); *H10W 90/736* (2026.01); *H10W 90/767* (2026.01); *H10D 12/411* (2025.01); *H10D 30/471* (2025.01); *H10W 70/424* (2026.01); *H10W 70/427* (2026.01); *H10W 70/438* (2026.01); *H10W 70/466* (2026.01); *H10W 70/481* (2026.01); *H10W 72/01361* (2026.01); *H10W 72/016* (2026.01); *H10W 72/642* (2026.01); *H10W 72/871* (2026.01); *H10W 72/884* (2026.01); *H10W 90/757* (2026.01)

(56) References Cited

U.S. PATENT DOCUMENTS

2007/0181934 A1* 8/2007 Hu .................... H01L 23/49575 257/E23.044
2014/0103510 A1* 4/2014 Andou ................ H01L 21/4842 257/676
2016/0268190 A1* 9/2016 McKnight-MacNeil .................... H01L 24/97
2016/0307826 A1* 10/2016 McKnight-MacNeil .................... H10D 30/65
2018/0138134 A1* 5/2018 Chikamatsu ...... H01L 23/49562
2020/0251409 A1* 8/2020 Saito ....................... H01L 24/05
2020/0365497 A1* 11/2020 Saito ................. H01L 23/49524

FOREIGN PATENT DOCUMENTS

JP 2010-118577 5/2010
JP 2010118577 A * 5/2010
JP 2012-038885 2/2012
JP 2020-115524 7/2020
JP 2020188085 A * 11/2020 ......... H01L 23/5386
KR 10-1534463 7/2015

OTHER PUBLICATIONS

Office Action issued in corresponding German Patent Application No. 11 2021 005 639.5, Nov. 14, 2023, 4 pages w/translation.
Office Action issued in corresponding German Patent Application No. 11 2021 005 639.5, Jul. 5, 2023, 14 pages w/translation.
Office Action issued in corresponding Japanese Patent application No. 2022-572186, Aug. 12, 2025, and machine translation (6 pages).
Office Action issued in corresponding German Patent application No. 11 2021 005 639.5, Apr. 27, 2026, and machine translation (12 pages).

* cited by examiner

FIG.46
B1
8
81
241(24,2)
86
85
331 (33,3)
82
331 (33,3)
83
331 (33,3)
331 (33,3)
z(z1)
x(x2)
x(x1)
z(z2)
FIG.47
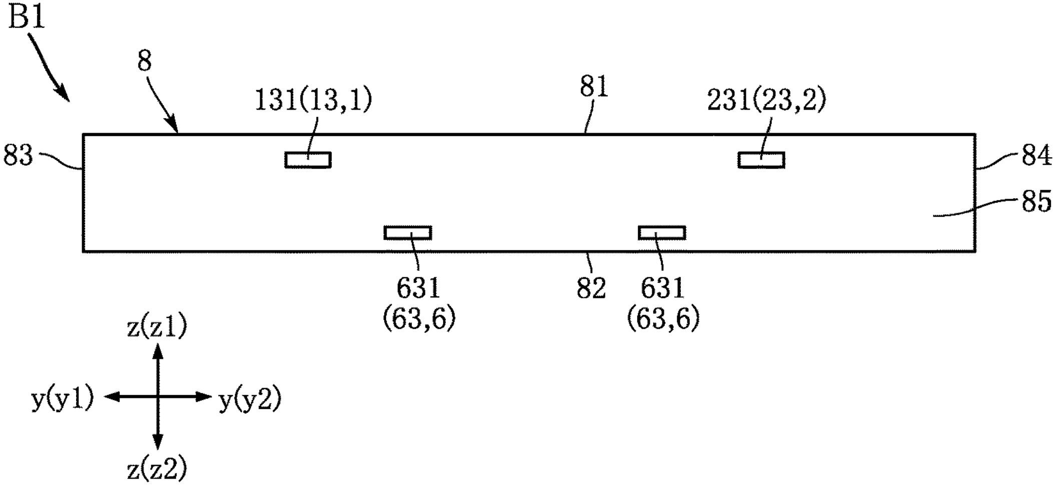
FIG.48
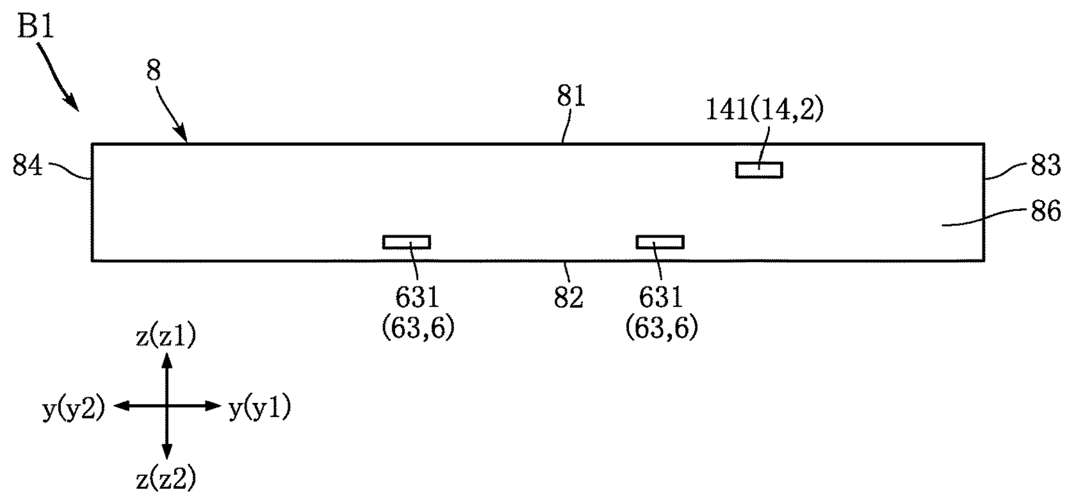

METHOD FOR MANUFACTURING SEMICONDUCTOR APPARATUS AND SEMICONDUCTOR APPARATUS

TECHNICAL FIELD

The present disclosure relates to a method for manufacturing a semiconductor device and also to a semiconductor device.

BACKGROUND ART

With recent developments, some semiconductor elements are fabricated using III-V group nitride semiconductors (hereinafter "nitride semiconductors"), such as gallium nitride (GaN). Patent document 1 discloses a semiconductor element using a nitride semiconductor. The semiconductor element includes an element body made of a semiconductor, a nitride semiconductor layer disposed on an obverse surface of the element body, and electrodes. The electrodes include a source electrode, a drain electrode and a gate electrode disposed on the nitride semiconductor layer.

PRIOR ART DOCUMENT

Patent Document

Patent Document 1: JP-A-2012-38885

SUMMARY OF THE INVENTION

Problem to be Solved by the Invention

The semiconductor element described above is built into a semiconductor device by bonding conducting members to the source electrode and the drain electrode disposed on the obverse surface of the element body. Preferably, these conducting members are more precisely placed relative to each other.

The present disclosure has been conceived in view of the circumstances described above and may aim to provide a method for manufacturing a semiconductor device and a semiconductor device enabling more precise placement of conducting members.

Means to Solve the Problem

According to a first aspect of the present disclosure, there is provided a method for manufacturing a semiconductor device, the method including: a first preparation step of preparing a first leadframe that includes an island part; a second preparation step of preparing a semiconductor element that includes an element obverse surface and an element reverse surface respectively facing in a first sense and a second sense of a thickness direction, where the element obverse surface is provided with at least one first electrode and at least one second electrode; a mounting step of mounting the semiconductor element on the island part with a first conductive paste interposed between the element reverse surface and the island part; a third preparation step of preparing a second leadframe that includes a first part, a second part, a frame part, a first connecting part connecting the first part and the frame part, and a second connecting part connecting the second part and the frame part; a placing step of placing the second leadframe with a second conductive paste interposed between the first part and the at least one first electrode and with a third conductive paste interposed between the second part and the at least one second electrode; and a curing step of curing the first conductive paste, the second conductive paste and the third conductive paste.

According to a second aspect of the present disclosure, there is provided a semiconductor device including: a plurality of leads; a semiconductor element; and a sealing resin covering a portion of each of the plurality of leads and the semiconductor element. The plurality of leads include an island lead, a first lead and a second lead that are spaced apart from each other. The semiconductor element includes an element obverse surface and an element reverse surface respectively facing in a first sense and a second sense of a thickness direction, where the element obverse surface is provided with at least one first electrode and at least one second electrode. The element reverse surface and the island lead are bonded to each other by a first conductive-bonding part. The first lead includes a first main part, at least one first prong and a first extended part. The second lead includes a second main part, at least one second prong and a second extended part. The at least one first prong and the at least one first electrode are bonded to each other by a second conductive-bonding part. The at least one second prong and the at least one second electrode are bonded to each other by a third conductive-bonding part. The first extended part includes a first end face exposed from the sealing resin. The second extended part includes a second end face exposed from the sealing resin.

Advantages of the Invention

The present disclosure enables more precise placement conducting members.

Other features and advantages of the present disclosure will be more apparent from the detailed description given below with reference to the accompanying drawings.

BRIEF DESCRIPTION OF THE DRAWINGS

Figure 17:
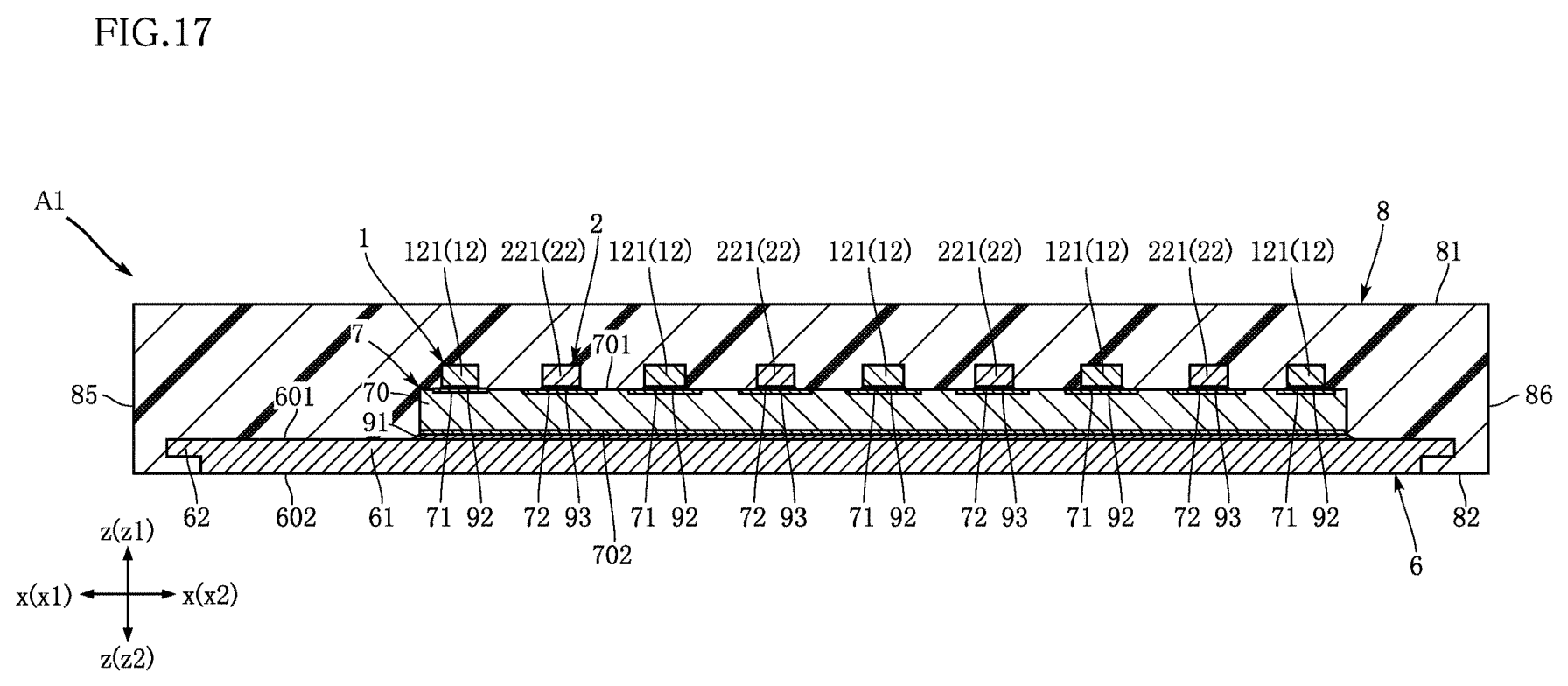

FIG. 17 is a sectional view taken along line XVII-XVII of FIG. 10.

FIG. 46 is a rear view of the semiconductor device according to the third embodiment of the present disclosure.

FIG. 47 is a left-side view of the semiconductor device according to the third embodiment of the present disclosure.

FIG. 48 is a right-side view of the semiconductor device according to the third embodiment of the present disclosure.

MODE FOR CARRYING OUT THE INVENTION

The following describes preferred embodiments of the present disclosure, with reference to the drawings.

In the present disclosure, such terms as "first", "second" and "third" are used merely as labels and are not intended to impose ordinal requirements on the items to which these terms refer.

First Embodiment

FIGS. 1 to 29 show a semiconductor device according to a first embodiment of the present disclosure. A semiconductor device A1 of this embodiment includes a plurality of leads 1 to 6, a semiconductor element 7, a wire 99 and a sealing resin 8. The semiconductor device A1 may be mounting on, for example, a substrate and used for switching of an electric current. The semiconductor device A1, however, is not limited to a particular use.

Figure 1:
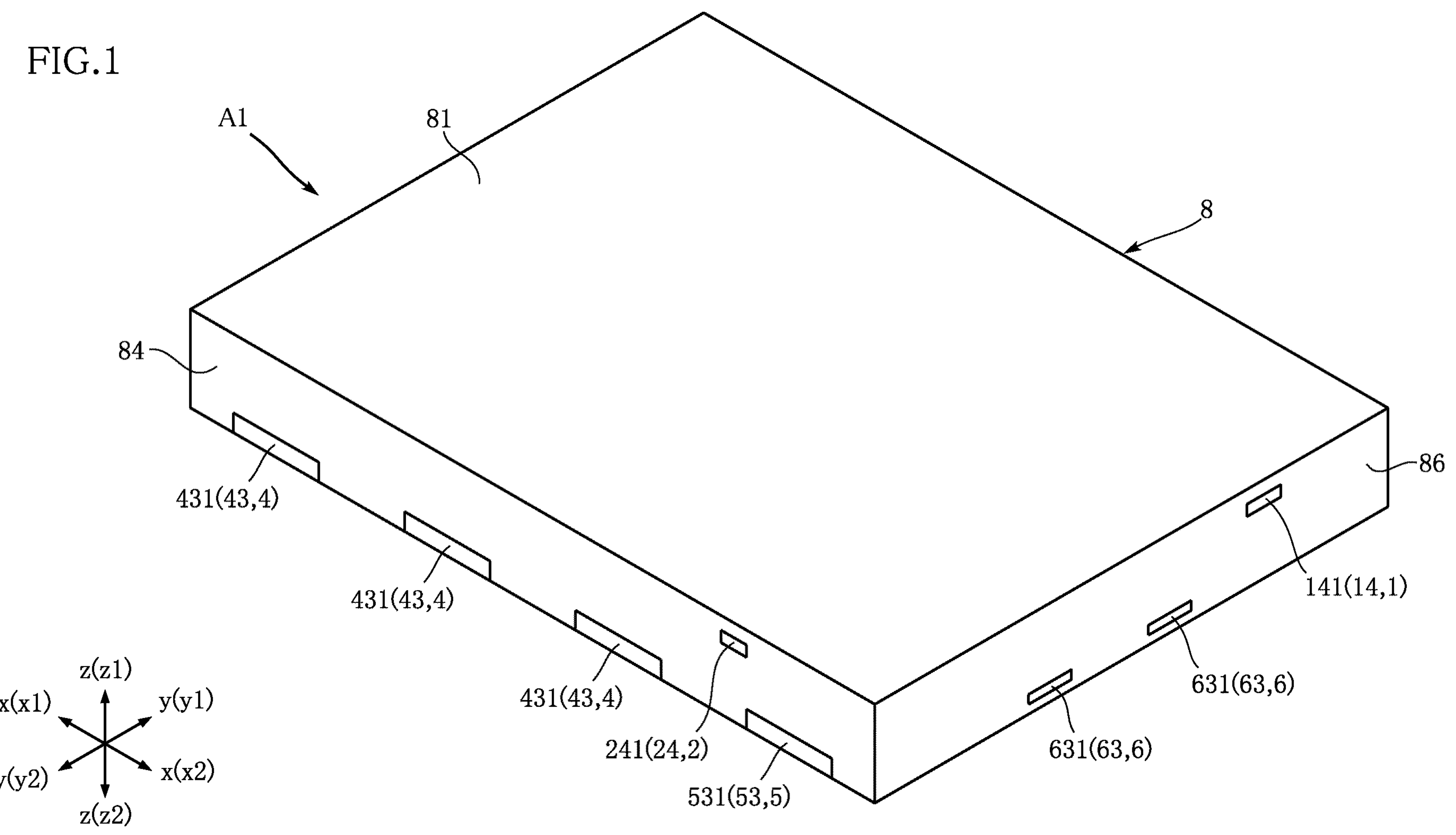
FIG. 1 is a perspective view of a semiconductor device according to a first embodiment of the present disclosure.
Figure 2:
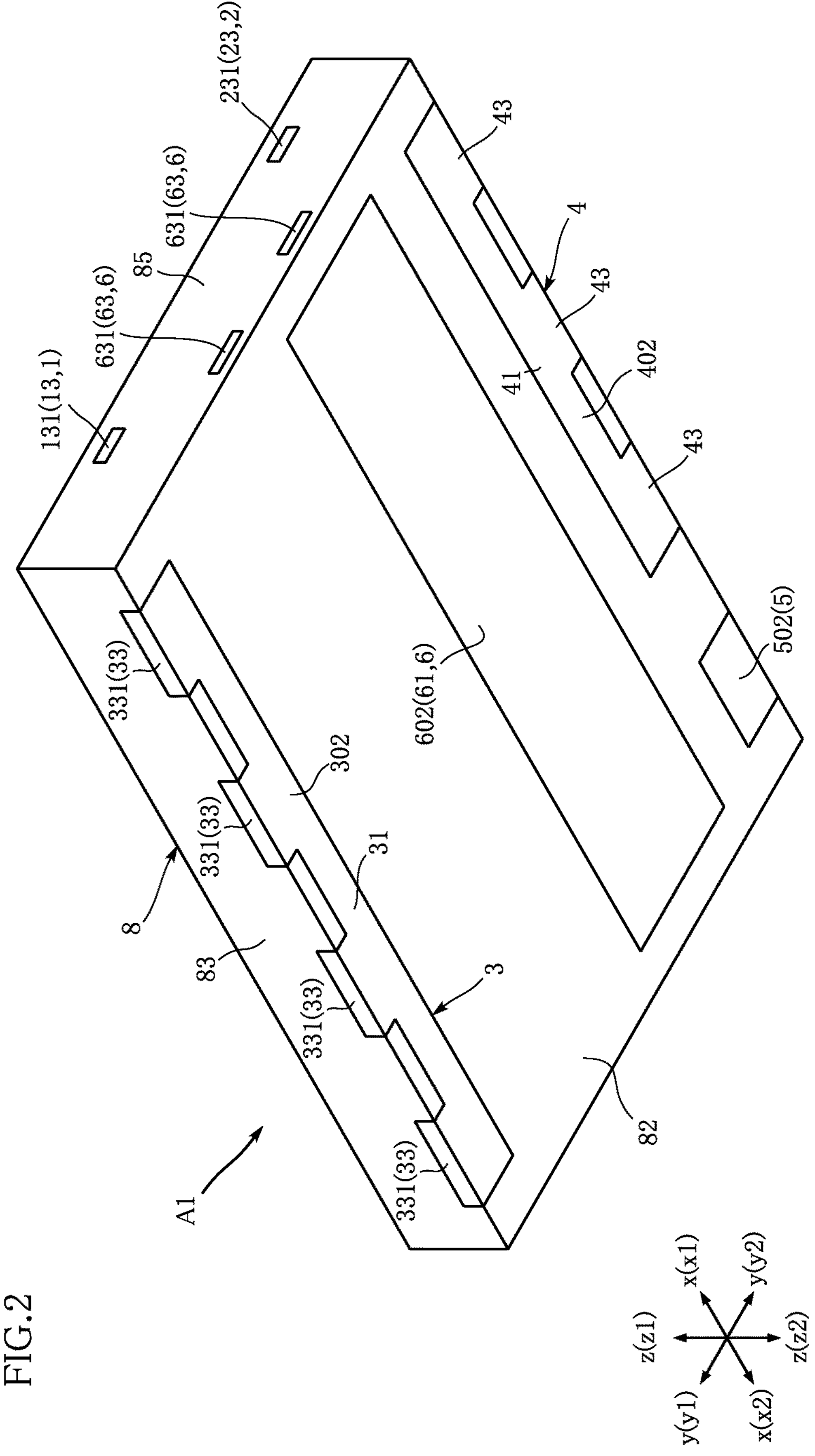
FIG. 2 is a perspective view of the semiconductor device according to the first embodiment of the present disclosure.
Figure 3:
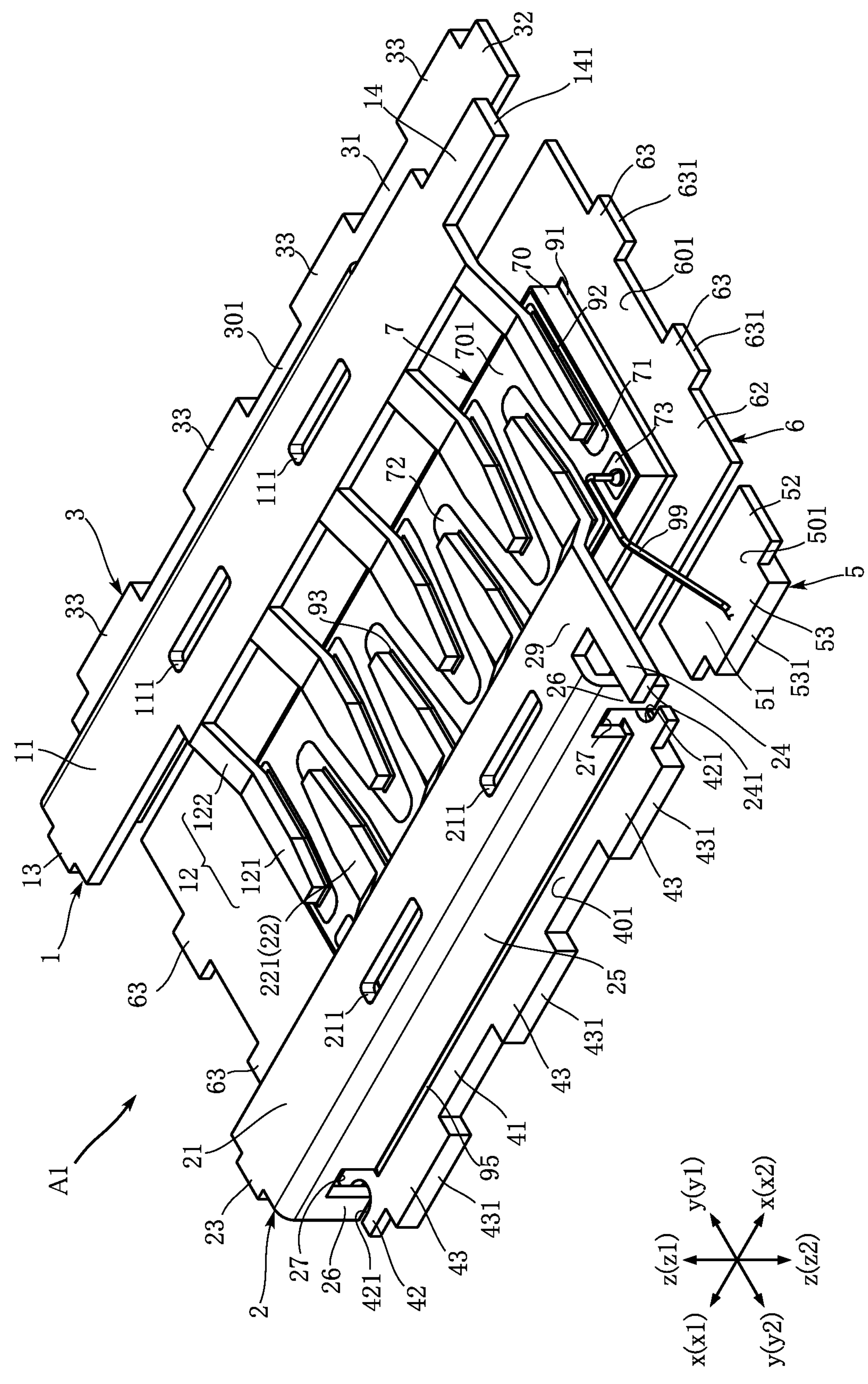
FIG. 3 is a fragmentary perspective view of the semiconductor device according to the first embodiment of the present disclosure.
Figure 4:
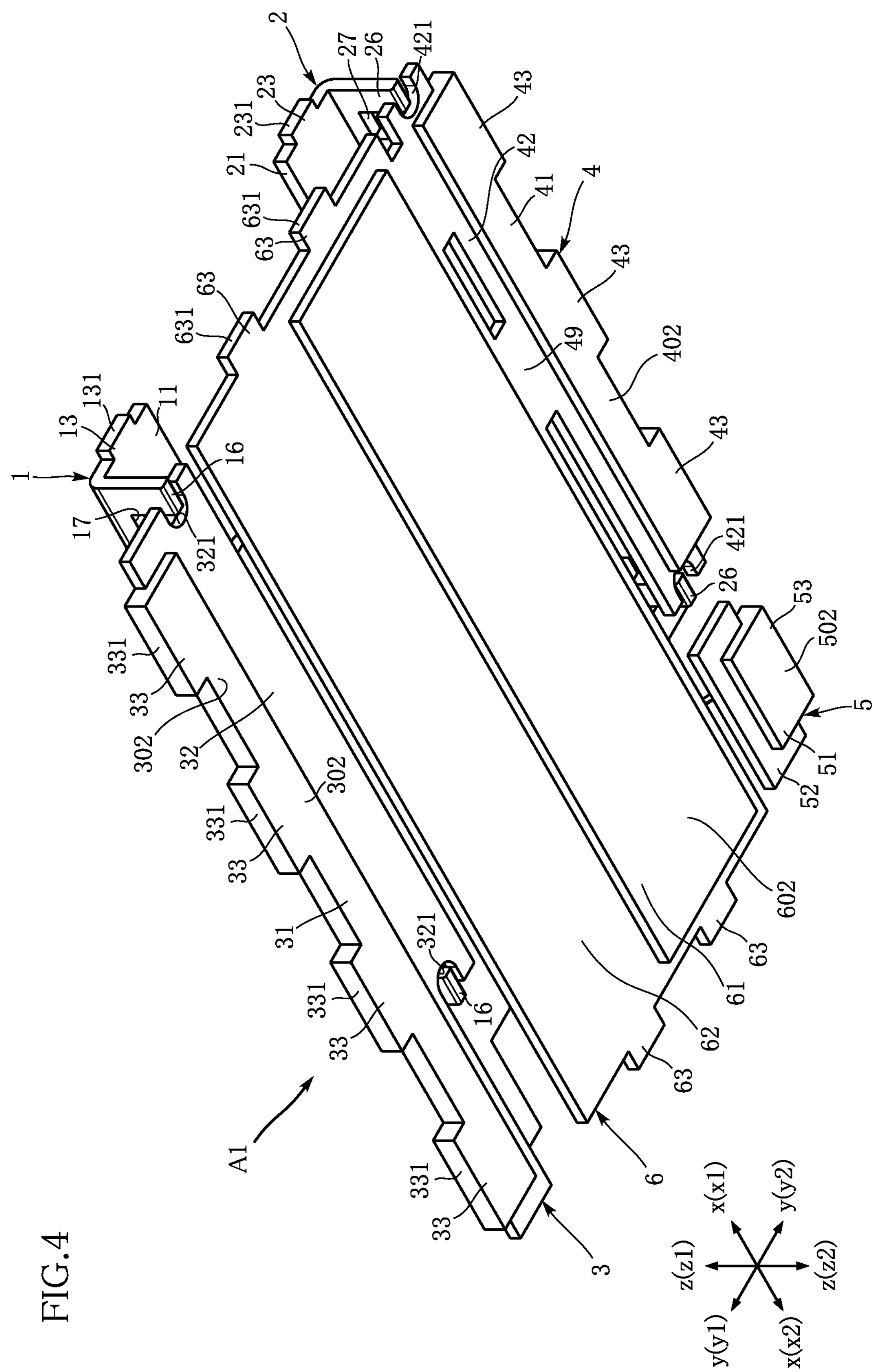
FIG. 4 is a fragmentary perspective view of the semiconductor device according to the first embodiment of the present disclosure.
Figure 5:
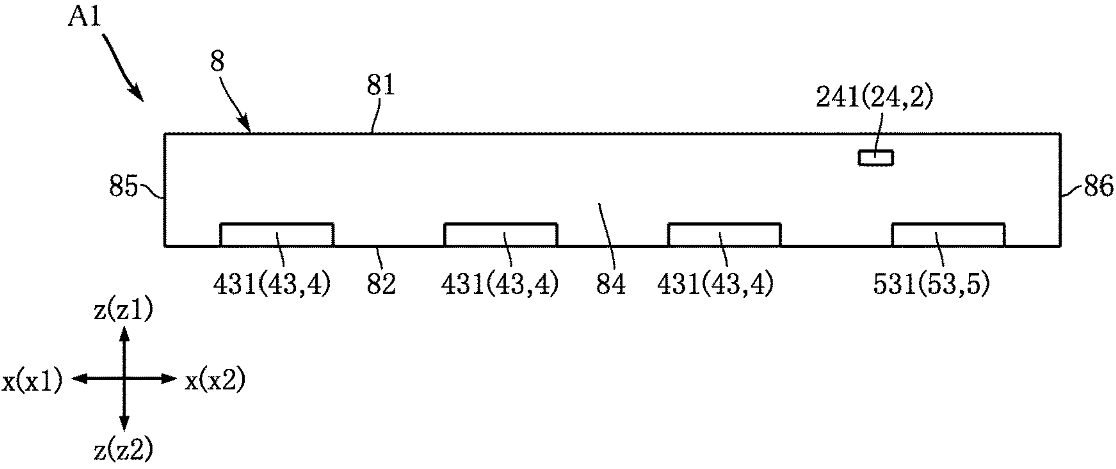
FIG. 5 is a front view of the semiconductor device according to the first embodiment of the present disclosure.
Figure 6:
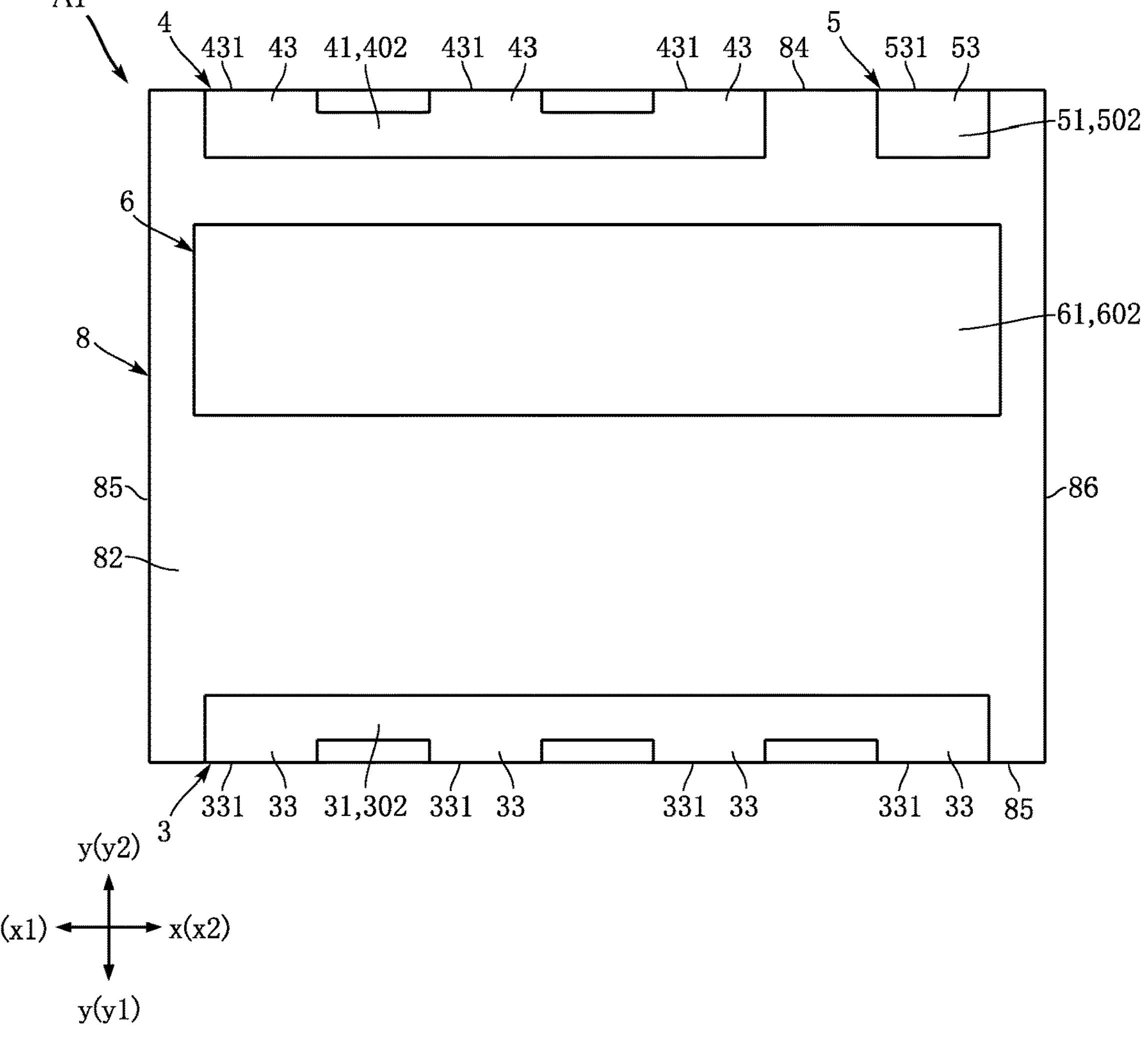
FIG. 6 is a bottom view of the semiconductor device according to the first embodiment of the present disclosure.
Figure 7:
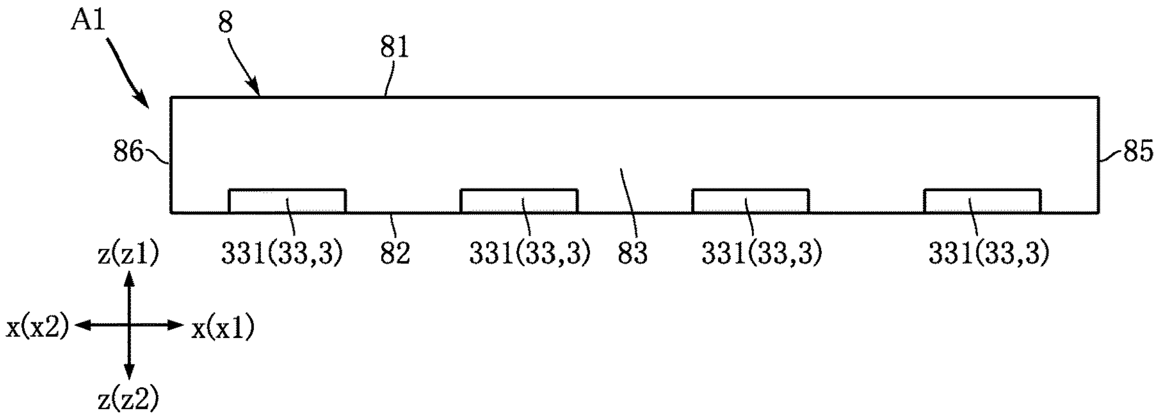
FIG. 7 is a rear view of the semiconductor device according to the first embodiment of the present disclosure.
Figure 8:
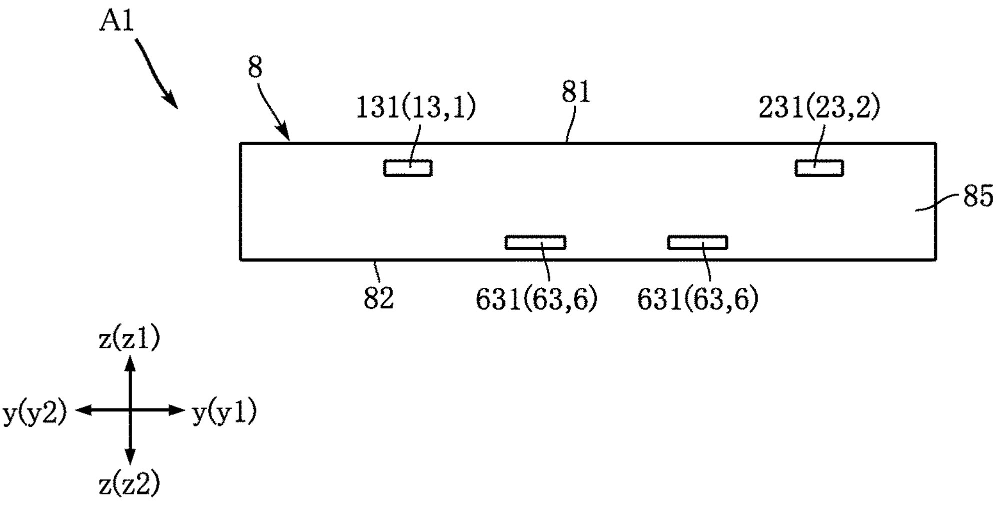
FIG. 8 is a left-side view of the semiconductor device according to the first embodiment of the present disclosure.
Figure 9:
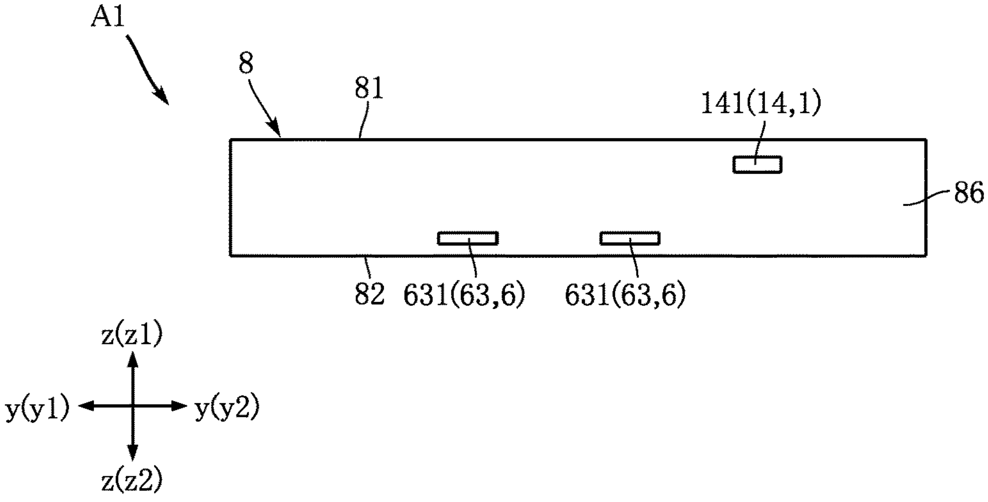
FIG. 9 is a right-side view of the semiconductor device according to the first embodiment of the present disclosure.
Figure 10:
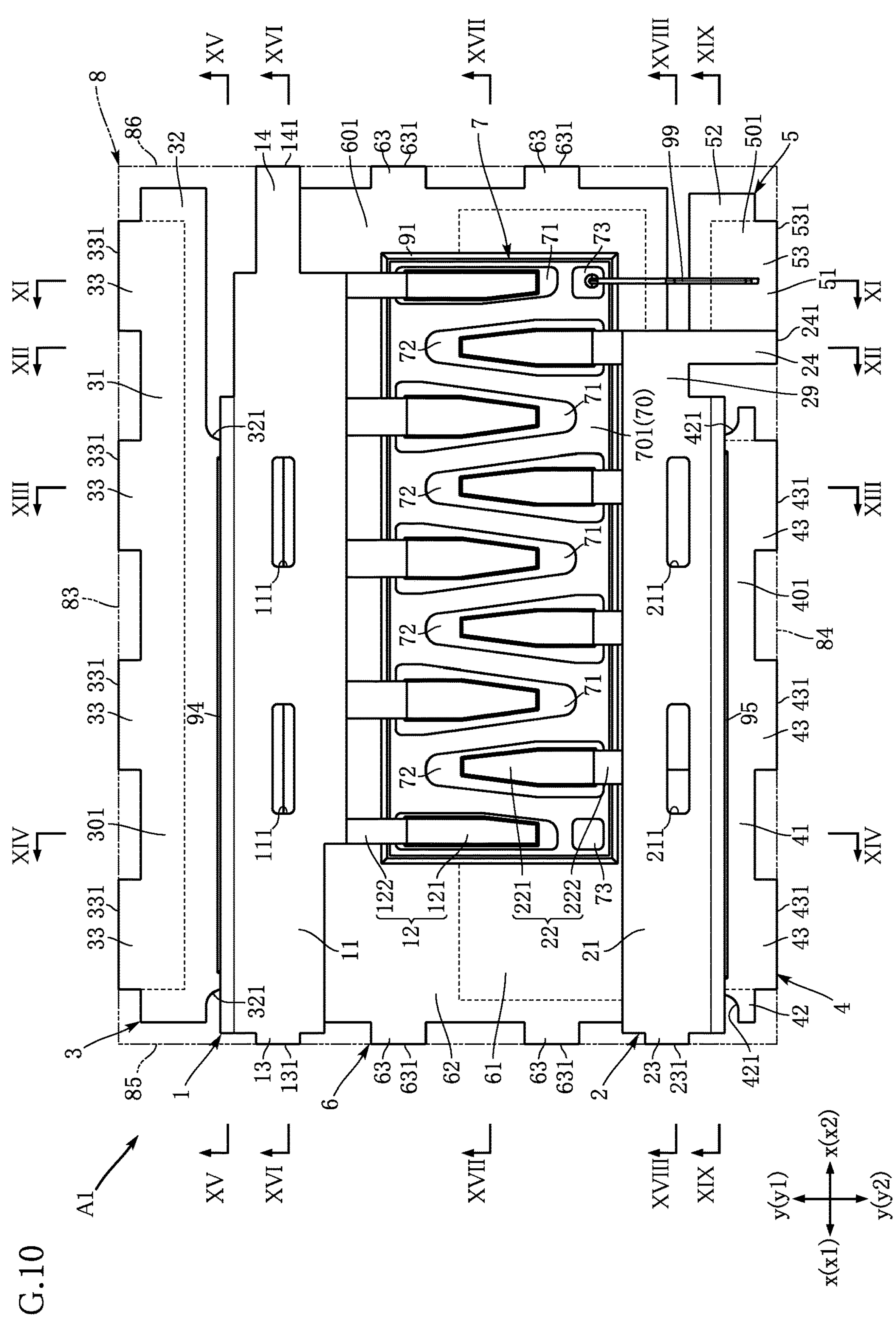
FIG. 10 is a fragmentary plan view of the semiconductor device according to the first embodiment of the present disclosure.
Figure 11:
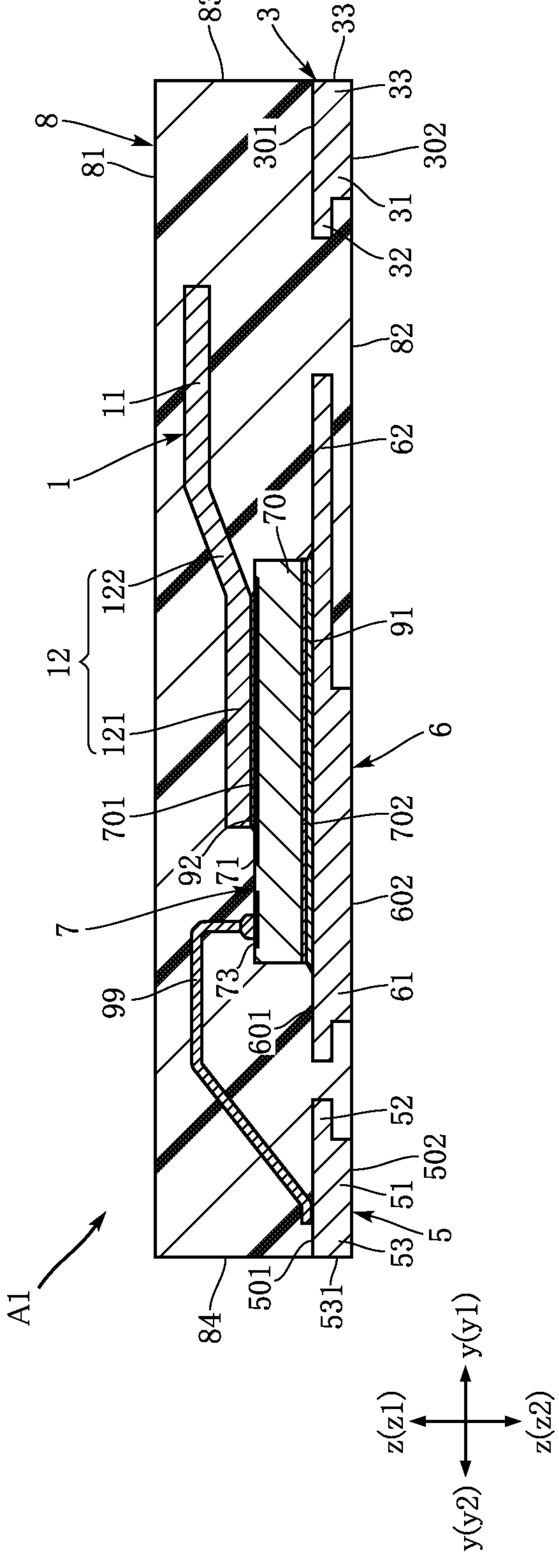
FIG. 11 is a sectional view taken along line XI-XI of FIG. 10.
Figure 12:
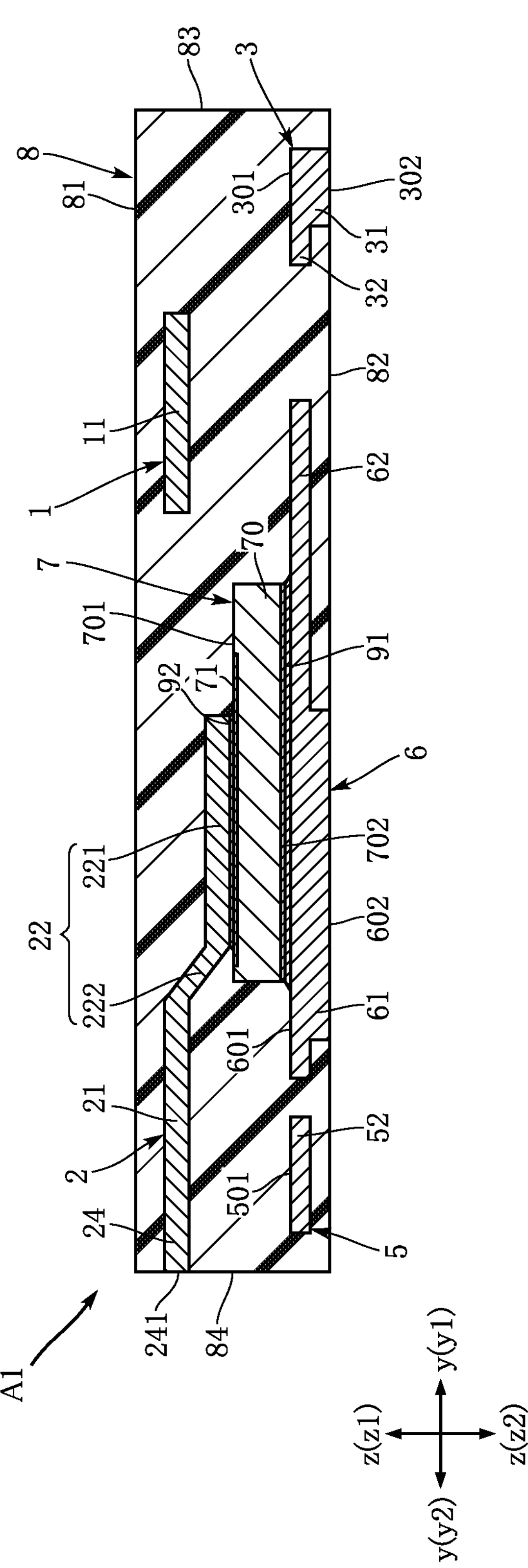
FIG. 12 is a sectional view taken along line XII-XII of FIG. 10.
Figure 13:
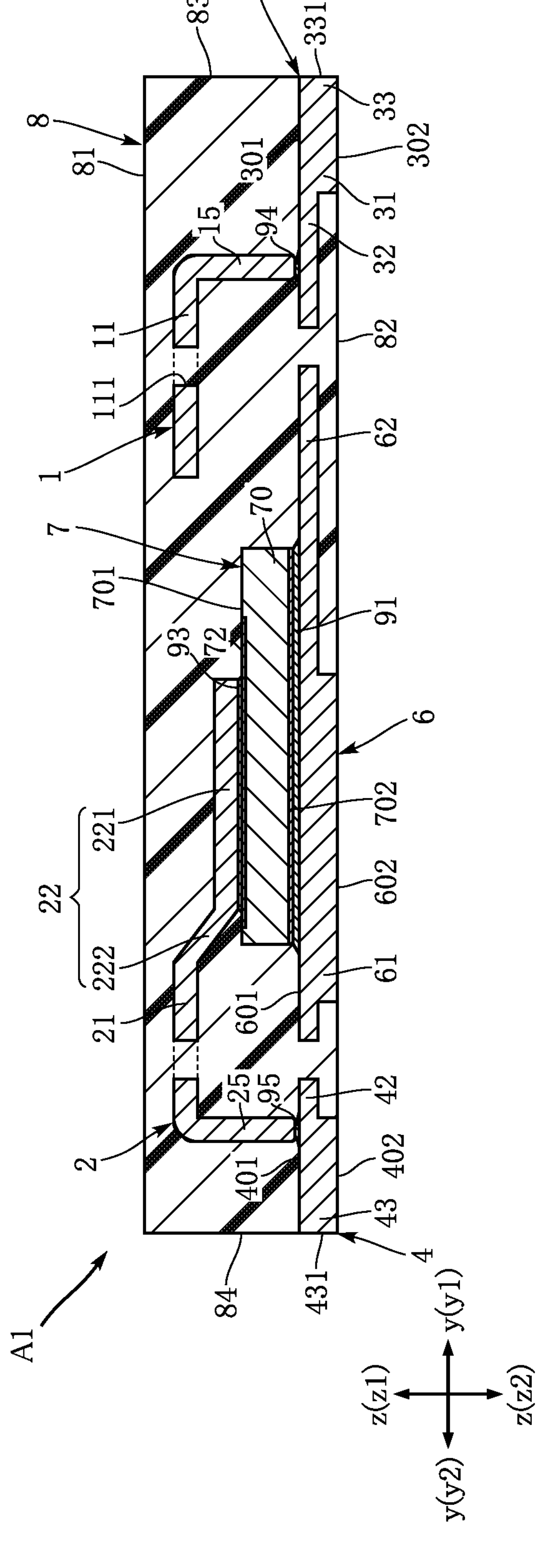
FIG. 13 is a sectional view taken along line XIII-XIII of FIG. 10.
Figure 14:
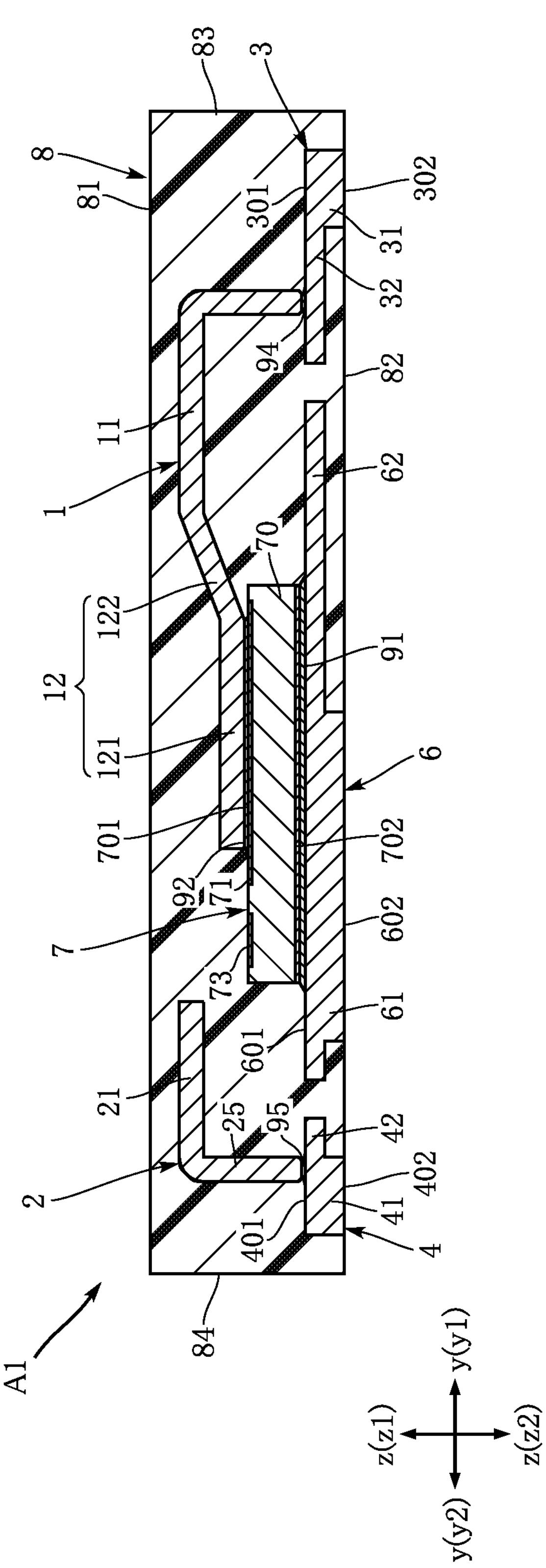
FIG. 14 is a sectional view taken along line XIV-XIV of FIG. 10.
Figure 15:
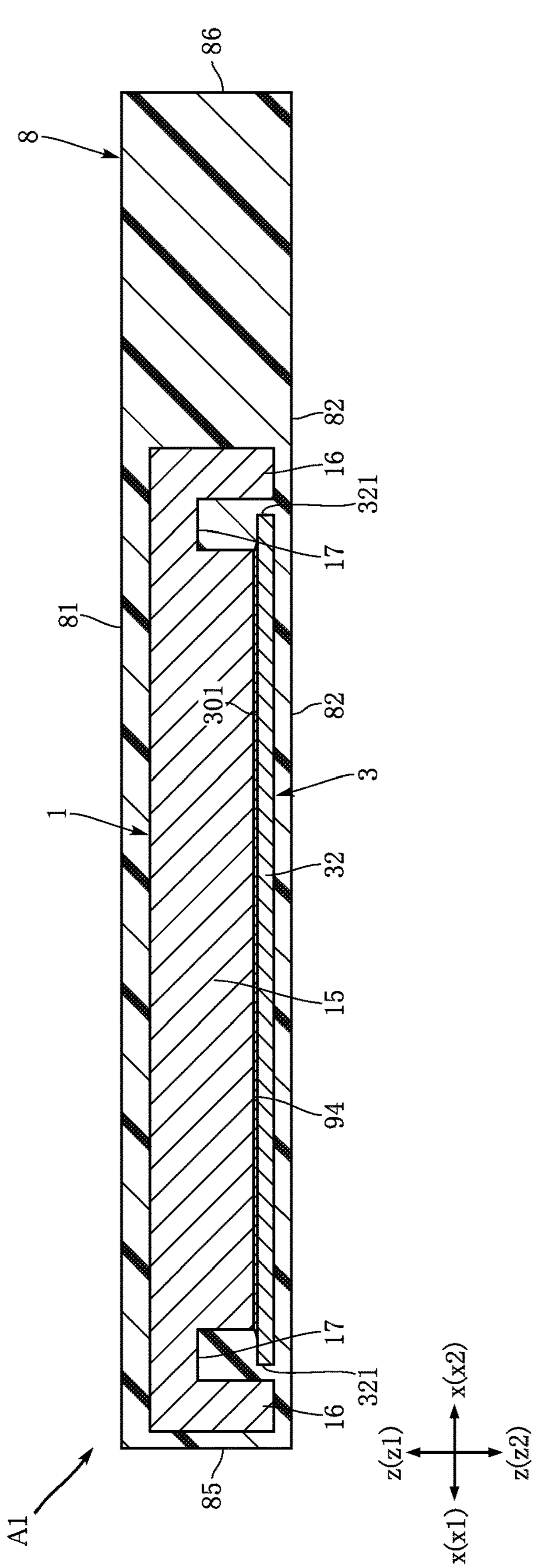
FIG. 15 is a sectional view taken along line XV-XV of FIG. 10.
Figure 16:
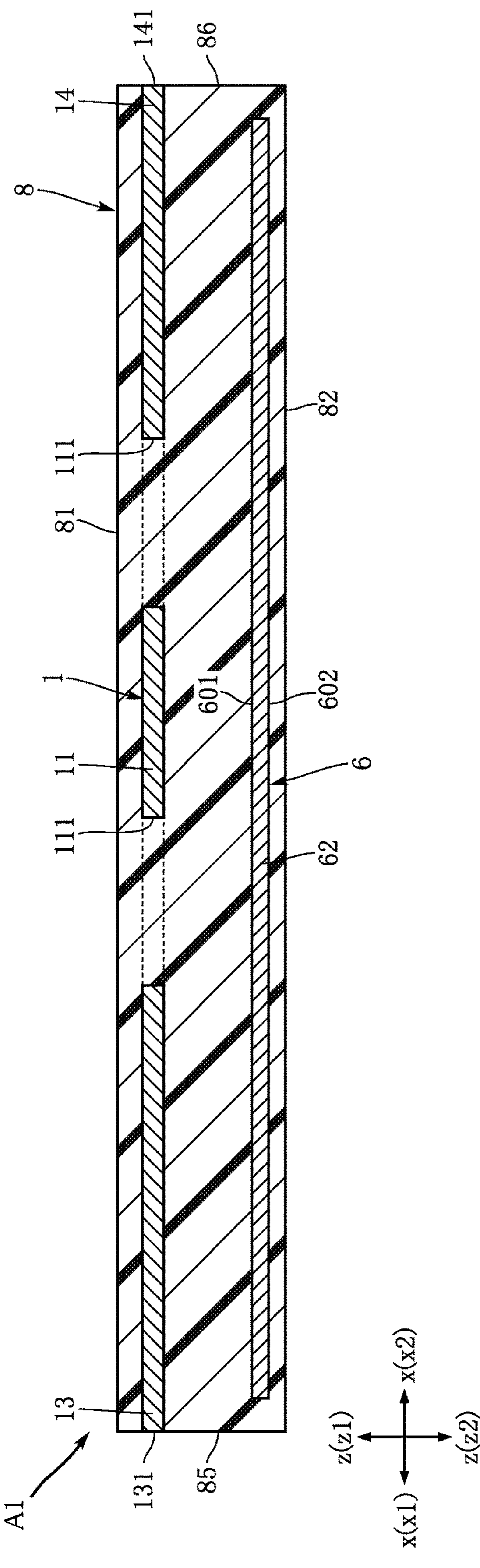
FIG. 16 is a sectional view taken along line XVI-XVI of FIG. 10.
Figure 18:
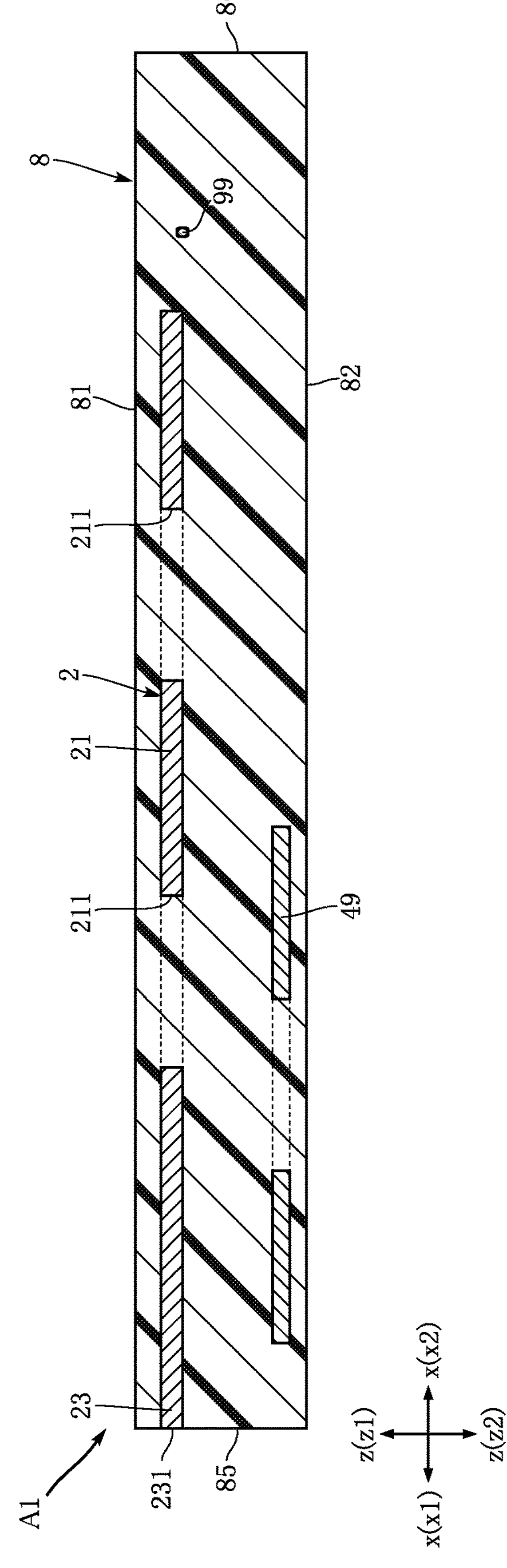
FIG. 18 is a sectional view taken along line XVIII-XVIII of FIG. 10.
Figure 19:
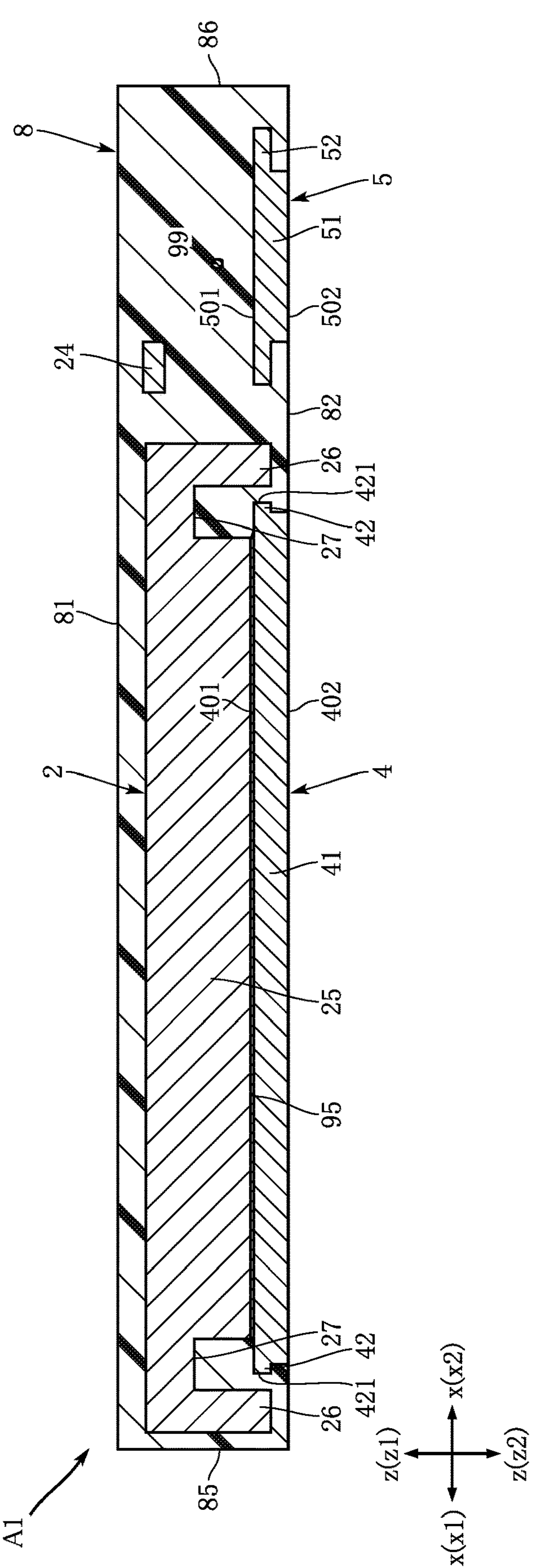
FIG. 19 is a sectional view taken along line XIX-XIX of FIG. 10.
Figure 20:
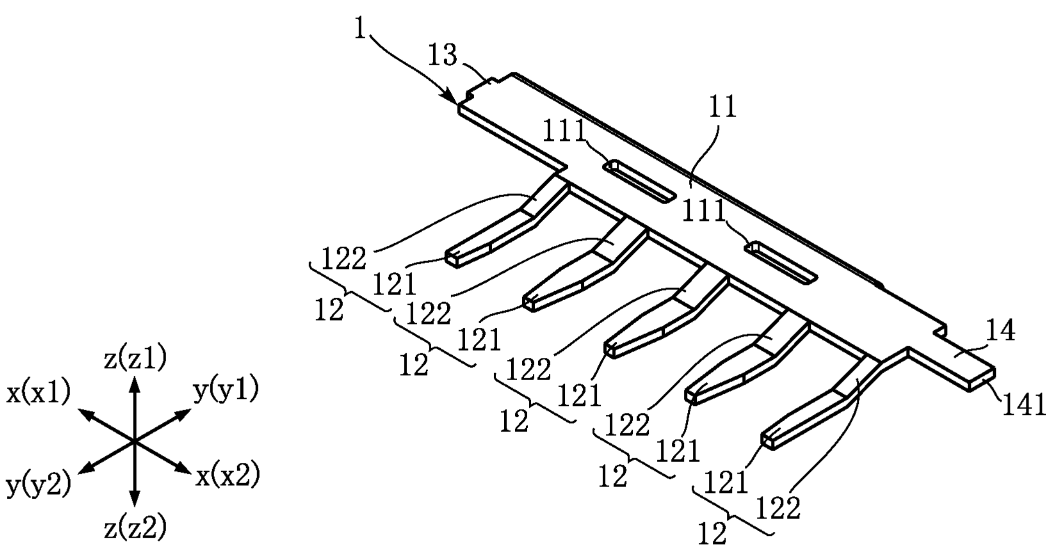
FIG. 20 is a perspective view of a first lead of the semiconductor device according to the first embodiment of the present disclosure.
Figure 21:
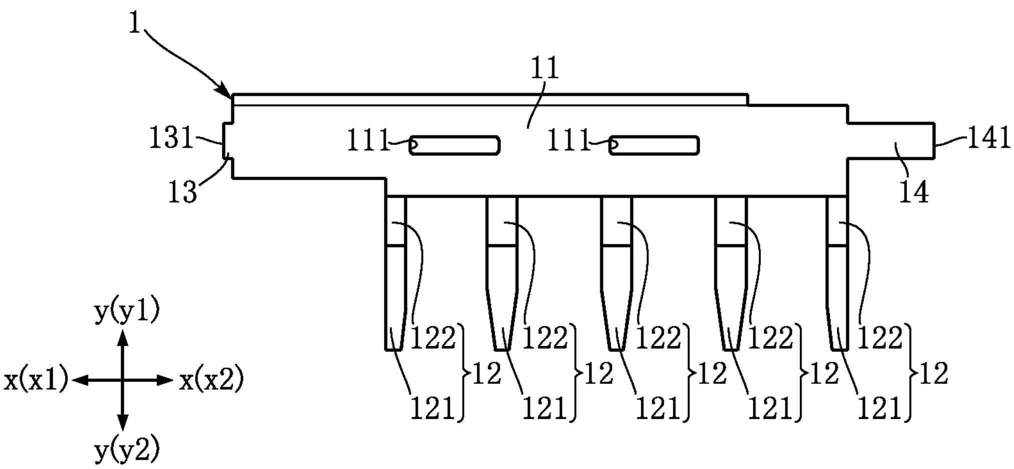
FIG. 21 is a plan view of the first lead of the semiconductor device according to the first embodiment of the present disclosure.
Figure 22:
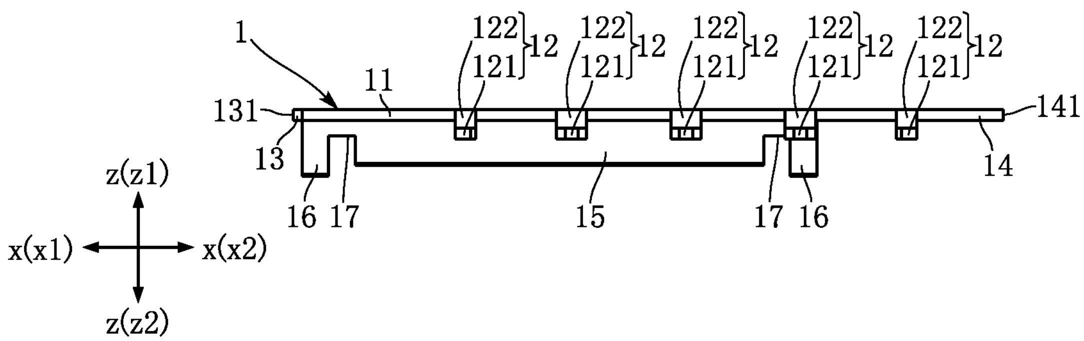
FIG. 22 is a front view of the first lead of the semiconductor device according to the first embodiment of the present disclosure.
Figure 23:
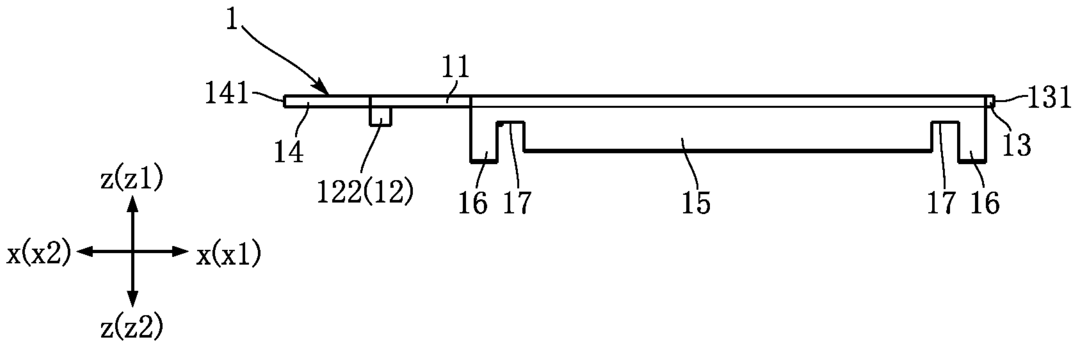
FIG. 23 is a rear view of the first lead of the semiconductor device according to the first embodiment of the present disclosure.
Figure 24:
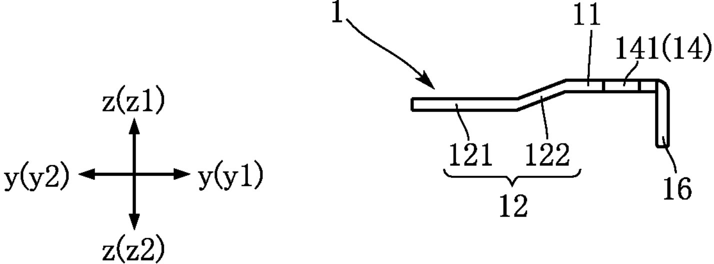
FIG. 24 is a side view of the first lead of the semiconductor device according to the first embodiment of the present disclosure.
Figure 25:
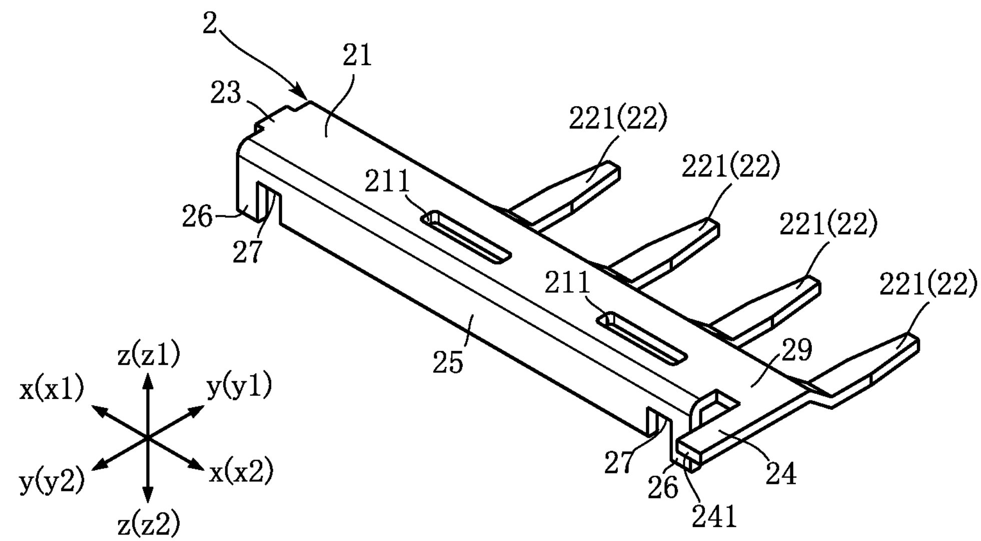
FIG. 25 is a perspective view of a second lead of the semiconductor device according to the first embodiment of the present disclosure.
Figure 26:
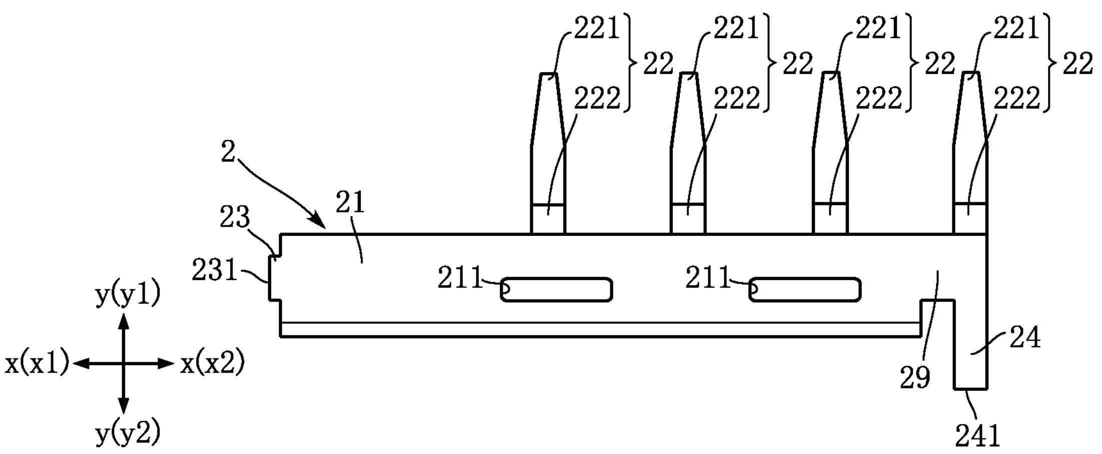
FIG. 26 is a plan view of the second lead of the semiconductor device according to the first embodiment of the present disclosure.
Figure 27:
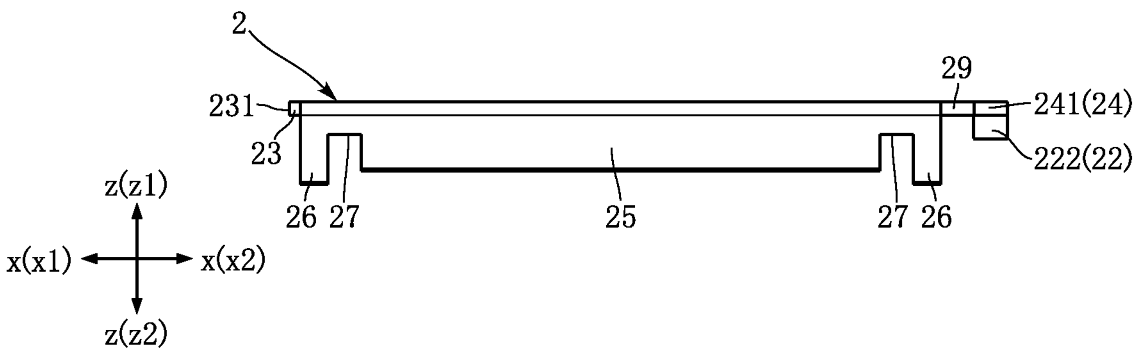
FIG. 27 is a rear view of the second lead of the semiconductor device according to the first embodiment of the present disclosure.
Figure 28:
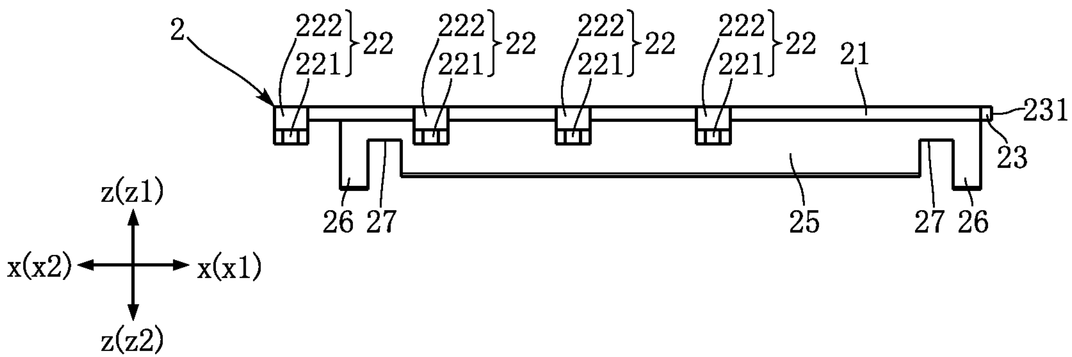
FIG. 28 is a front view of the second lead of the semiconductor device according to the first embodiment of the present disclosure.
Figure 29:
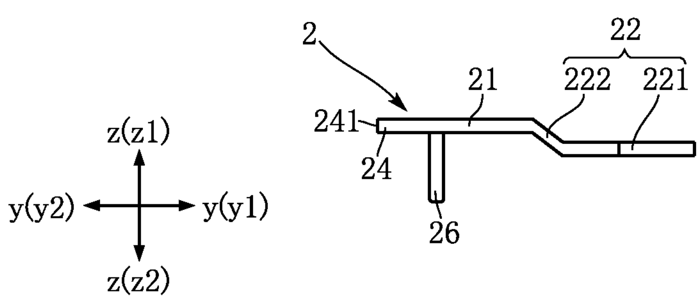
FIG. 29 is a side view of the second lead of the semiconductor device according to the first embodiment of the present disclosure.

FIG. 1 is a perspective view of the semiconductor device A1. FIG. 2 is a perspective view of the semiconductor device A1. FIG. 3 is a fragmentary perspective view of the semiconductor device A1. FIG. 4 is a fragmentary perspective view of the semiconductor device A1. FIG. 5 is a front view of the semiconductor device A1. FIG. 6 is a bottom view of the semiconductor device A1. FIG. 7 is a rear view of the semiconductor device A1. FIG. 8 is a left-side view of the semiconductor device A1. FIG. 9 is a right-side view of the semiconductor device A1. FIG. 10 is a fragmentary plan view of the semiconductor device A1. FIG. 11 is a sectional view taken along line XI-XI of FIG. 10. FIG. 12 is a sectional view taken along line XII-XII of FIG. 10. FIG. 13 is a sectional view taken along line XIII-XIII of FIG. 10. FIG. 14 is a sectional view taken along line XIV-XIV of FIG. 10. FIG. 15 is a sectional view taken along line XV-XV of FIG. 10. FIG. 16 is a sectional view taken along line XVI-XVI of FIG. 10. FIG. 17 is a sectional view taken along line XVII-XVII of FIG. 10. FIG. 18 is a sectional view taken along line XVIII-XVIII of FIG. 10. FIG. 19 is a sectional view taken along line XIX-XIX of FIG. 10.

For convenience in the following description, the thickness direction of the semiconductor device A1 is designated as "z direction". In addition, the side in a first sense of the z direction is designated as z1 side, and the side in a second sense of the z direction as z2 side. Such terms as "above", "below", "upward", "downward", "upper surface" and "lower surface" describe the positions of components and elements relative to the z direction and not necessarily describe the positions relative to the gravity direction. A first direction perpendicular to the z direction is designated as "x direction". The side in a first sense of the x direction is designated as x2 side, and the side in a second sense of the x direction as x1 side. A second direction perpendicular to the z direction and the x direction is designated as "y direction". The side in a first sense of the y direction is designated as y1 side, and the side in a second sense of the y direction as y2 side.

[Leads 1 to 6]

The leads 1 to 6 serve various functions, including supporting the semiconductor element 7 and forming conduction paths to the semiconductor element 7. The leads 1 to 6 may be made of a metal, such as Cu (copper), Ni (nickel) or Fe (iron). The leads 1 to 6 may be formed from a metal sheet by selectively applying appropriate processes, including stamping, bending and etching. The leads 1 to 6 may be plated with metal, such as Ag (silver), Ni, or Au (gold), covering appropriate portions of the leads.

In this embodiment, the plurality of leads 1 to 6 are specifically identified as a first lead 1, a second lead 2, a third lead 3, a fourth lead 4, a fifth lead 5 and an island lead 6. In other words, the plurality of leads 1 to 6 include the first lead 1, the second lead 2, the third lead 3, the fourth lead 4, the fifth lead 5 and the island lead 6. As will be described later, the fourth lead 4 and the island lead 6 are integral in this embodiment. Depending on the conduction paths to be formed and/or other requirements, the leads may be provided as separate pieces or one or more of the leads may be made integral. The following description is directed to the first lead 1 and the second lead 2 fabricated from a metal sheet by stamping and bending, and the third lead 3, the fourth lead 4, the fifth lead 5 and the island lead 6 fabricated from a metal sheet by etching.

[Island Lead 6]

As shown in FIGS. 1 to 14, 16 and 17, the island lead 6 has an obverse surface 601, a reverse surface 602, a thick part 61, a thin part 62 and a plurality of extended parts 63. The obverse surface 601 is on the z1 side in the z direction. In the illustrated example, the obverse surface 601 is a smooth surface perpendicular to the z direction. The island lead 6 may have one or more recesses and/or grooves recessed from the obverse surface 601 as necessary. The reverse surface 602 is on the z2 side in the z direction, facing away from the obverse surface 601. In the illustrated example, the reverse surface 602 is a smooth surface perpendicular to the z direction. The reverse surface 602 may be plated with, for example, Ni or Ti as necessary.

The thick part 61 is a portion where the obverse surface 601 and the reverse surface 602 overlap as viewed in the z direction. In the illustrated example, the thick part 61 is rectangular as viewed in the z direction. Note that the shape of the thick part 61 is not limited to such. The thickness of the thick part 61 in the z direction is equal to the distance between the obverse surface 601 and the reverse surface 602. The thin part 62 is a portion that overlaps with the obverse surface 601 but not with the reverse surface 602 as viewed in the z direction. In the illustrated example, the thin part 62 as viewed in the z direction extends outward from the opposite ends of the thick part 61 in the x direction and the y direction. The thickness of the thin part 62 in the z direction is less than the distance between the obverse surface 601 and the reverse surface 602. The thick part 61 and the thin part 62 are not limited to specific thicknesses. In one example, the thick part 61 may have a thickness of about 0.2 to 0.5 mm, and the thin part 62 may have a thickness of about 0.1 to 0.4 mm. In the illustrated example, the portion of the thin part 62 extending on the y1 side in the y direction is larger than the portion extending on the y2 side.

Each extended part 63 extends from an end of the thin part 62. In the illustrated example, the extended parts 63 are provided on either end of the thin part 62 to extend outward in the x direction. Note that the number of the extended parts 63 to be provided is not limited, including one or more than one. In the illustrated example, two extended parts 63 are provided on the x1 side in the x direction and two extended part 63 are provided on the x2 side. Each extended part 63 has an end face 631. The end face 631 faces away from the thin part 62 in the x direction. In other words, the end face 631 faces outward in the x direction. Each end face 631 illustrated in the figures is perpendicular to the x direction.

The two end faces 631 on the x1 side have the same position in the x direction. Similarly, the two end faces 631 on the x2 side have the same position in the x direction.

[Third Lead 3]

As shown in FIGS. 2 to 4, 6, 7 and 10 to 15, the third lead 3 is spaced apart from the island lead 6 toward the y1 side in the y direction. The third lead 3 has the center in the x direction that substantially coincides with the center of the island lead 6 in the x direction. The third lead 3 has an obverse surface 301, a reverse surface 302, a thick part 31, a thin part 32 and a plurality of extended parts 33. The obverse surface 301 is on the z1 side in the z direction. In the illustrated example, the obverse surface 301 is a smooth surface perpendicular to the z direction. The third lead 3 may have one or more recesses and/or grooves recessed from the obverse surface 301 as necessary. The reverse surface 302 is on the z2 side in the z direction, facing away from the obverse surface 301. In the illustrated example, the reverse surface 302 is a smooth surface perpendicular to the z direction. The reverse surface 302 may be plated with, for example, Ni or Ti as necessary. In this embodiment, the obverse surface 301 has substantially the same position in the z direction as the obverse surface 601, and the reverse surface 302 has substantially the same position in the z direction as the reverse surface 602.

The thick part 31 is a portion where the obverse surface 301 and the reverse surface 302 overlap as viewed in the z direction. In the illustrated example, the thick part 31 as viewed in the z direction has a rectangular shape that is longer in the x direction. Note that the shape of the thick part 31 is not limited to such. The thickness of the thick part 31 in the z direction is equal to the distance between the obverse surface 301 and the reverse surface 302. The thin part 32 is a portion that overlaps with the obverse surface 301 but not with the reverse surface 302 as viewed in the z direction. In the illustrated example, the thin part 32 as viewed in the z direction extends outward from the opposite ends of the thick part 31 in the x direction and also from the end on the y2 side in the y direction. The thickness of the thin part 32 in the z direction is less than the distance between the obverse surface 301 and the reverse surface 302. The thick part 31 and the thin part 32 are not limited to specific thicknesses. In this embodiment, the thick part 31 has substantially the same thickness as the thick part 61, and the thin part 32 has substantially the same thickness as the thin part 62.

In the illustrated example, the thin part 32 has recesses 321. The recesses 321 are recessed inward in the x direction. In the illustrated example, the thin part 32 is provided with one recess 321 on each end in the x direction. The shape of the recesses 321 is not specifically limited. In the illustrated example, the recesses have a semicircular shape.

The extended parts 33 extend outward from an end of the thick part 31. In the illustrated example, the extended parts 33 extend from the thick part 31 toward the y1 side in the y direction. Note that the number of the extended parts 33 to be provided is not limited, including one or more than one. In the illustrated example, four extended parts 33 are provided. Each extended part 33 has an end face 331. The end face 331 faces away from the thick part 31 in the y direction. In other words, the end face 331 faces outward, which is the y1 side in the y direction. The respective end faces 331 illustrated in the figures are perpendicular to the y direction. The end faces 331 have the same position in the y direction.

[Fourth Lead 4]

As shown in FIGS. 1 to 6, 10, 13, 14, 18 and 19, the fourth lead 4 is offset from the island lead 6 toward the y2 side in the y direction. The center of the fourth lead 4 in the x direction is offset toward the x1 side from the center of the island lead 6 in the x direction. The fourth lead 4 has an obverse surface 401, a reverse surface 402, a thick part 41, a thin part 42 and a plurality of extended parts 43. The obverse surface 401 is on the z1 side in the z direction. In the illustrated example, the obverse surface 401 is a smooth surface perpendicular to the z direction. The fourth lead 4 may have one or more recesses and/or grooves recessed from the obverse surface 401 as necessary. The reverse surface 402 is on the z2 side in the z direction, facing away from the obverse surface 401. In the illustrated example, the reverse surface 402 is a smooth surface perpendicular to the z direction. The reverse surface 402 may be plated with, for example, Ni or Ti as necessary. In this embodiment, the obverse surface 401 has substantially the same position in the z direction as the obverse surface 601, and the reverse surface 402 has substantially the same position in the z direction as the reverse surface 602.

The thick part 41 is a portion where the obverse surface 401 and the reverse surface 402 overlap as viewed in the z direction. In the illustrated example, the thick part 41 as viewed in the z direction has a rectangular shape that is longer in the x direction. Note that the shape of the thick part 41 is not limited to such. The thickness of the thick part 41 in the z direction is equal to the distance between the obverse surface 401 and the reverse surface 402. In this embodiment, the thick part 41 has a smaller x-direction dimension than the thick part 31. The thin part 42 is a portion that overlaps with the obverse surface 401 but not with the reverse surface 402. In the illustrated example, the thin part 42 as viewed in the z direction extends outward from the opposite ends of the thick part 41 in the x direction and also from the end on the y1 side in the y direction. The thin part 42 is connected to the island lead 6 by an interconnecting part 49. The thickness of the thin part 42 in the z direction is less than the distance between the obverse surface 401 and the reverse surface 402. The thick part 41 and the thin part 42 are not limited to specific thicknesses. In this embodiment, the thick part 41 has substantially the same thickness as the thick part 61, and the thin part 42 has substantially the same thickness as the thin part 62.

In the illustrated example, the thin part 42 has recesses 421. The recesses 421 are recessed inward in the x direction. In the illustrated example, the thin part 42 is provided with one recess 421 on each end in the x direction. The shape of the recesses 421 is not specifically limited. In the illustrated example, the recesses have a semicircular shape.

The extended parts 43 extend outward from an end of the thick part 41. In the illustrated example, the extended parts 43 extend from the thick part 41 toward the y2 side in the y direction. Note that the number of the extended parts 43 to be provided is not limited, including one or more than one. In the illustrated example, three extended parts 43 are provided. The three extended parts 43 have substantially the same position in the x direction as the three extended part 33 provided on the x1 side. Each extended part 43 has an end face 431. The end face 431 faces away from the thick part 41 in the y direction. In other words, the end face 431 faces outward, which is the y2 side in the y direction. The respective end faces 431 illustrated in the figures are perpendicular to the y direction. The end faces 431 have the same position in the y direction.

[Fifth Lead 5]

As shown in FIGS. 1 to 6, 10 to 12 and 19, the fifth lead 5 is offset from the island lead 6 toward the y2 side in the y direction. The center of the fifth lead 5 in the x direction is offset toward the x2 side from the center of the island lead 6 in the x direction. The fifth lead 5 is offset from the fourth lead 4 toward the x2 side in the x direction. The fifth lead 5 has an obverse surface 501, a reverse surface 502, a thick part 51, a thin part 52 and an extended part 53. The obverse surface 501 is on the z1 side in the z direction. In the illustrated example, the obverse surface 501 is a smooth surface perpendicular to the z direction. The fifth lead 5 may have one or more recesses and/or grooves recessed from the obverse surface 501 as necessary. The reverse surface 502 is on the z2 side in the z direction, facing away from the obverse surface 501. In the illustrated example, the reverse surface 502 is a smooth surface perpendicular to the z direction. The reverse surface 502 may be plated with, for example, Ni or Ti as necessary. In this embodiment, the obverse surface 501 has substantially the same position in the z direction as the obverse surface 601, and the reverse surface 502 has substantially the same position in the z direction as the reverse surface 602.

The thick part 51 is a portion where the obverse surface 501 and the reverse surface 502 overlap as viewed in the z direction. In the illustrated example, the thick part 51 as viewed in the z direction has a rectangular shape that is longer in the x direction. Note that the shape of the thick part 51 is not limited to such. The thickness of the thick part 51 in the z direction is equal to the distance between the obverse surface 501 and the reverse surface 502. In this embodiment, the thick part 51 has a smaller x-direction dimension than the thick part 31 and the thick part 41. The thin part 52 is a portion that overlaps with the obverse surface 501 but not with the reverse surface 502 as viewed in the z direction. In the illustrated example, the thin part 52 as viewed in the z direction extends outward from the opposite ends of the thick part 51 in the x direction and also from the end on the y1 side in the y direction. The thickness of the thin part 52 in the z direction is less than the distance between the obverse surface 501 and the reverse surface 502. The thick part 51 and the thin part 52 are not limited to specific thicknesses. In this embodiment, the thick part 51 has substantially the same thickness as the thick part 61, and the thin part 52 has substantially the same thickness as the thin part 62.

The extended part 53 extends outward from an end of the thick part 51. In the illustrated example, the extended part 53 extends from the thick part 51 toward the y2 side in the y direction. The number of the extended parts 53 to be provided is not limited, including one or more than one. In the illustrated example, one extended part 51 is provided. The extended part 53 has substantially the same position in the x direction as the outermost one of the extended parts 33 on the x2 side. The extended part 53 has an end face 531. The end face 531 faces away from the thick part 51 in the y direction. In other words, the end face 531 faces outward, which is the y2 side in the y direction. The end face 531 illustrated in the figures is perpendicular to the y direction. The end face 531 has the same position in the y direction as the end faces 431.

[First Lead 1]

As shown in FIGS. 1 to 4, 8 to 16 and 19, the first lead 1 is offset toward the z1 side in the z direction form the third lead 3, the fourth lead 4, the fifth lead 5 and the island lead 6. The first lead 1 of this embodiment includes a first main part 11, a plurality of first prongs 12, a first extended part 13, a third extended part 14, a first contacting part 15, a first projection 16 and a first recess 17. The first lead 1 is shown alone in FIGS. 20 to 24.

The first main part 11 has the shape of a plate extending in the x direction and the y direction. In the illustrated example, the first main part 11 generally has a rectangular shape that is longer in the x direction. In the illustrated example, the first main part 11 has through-holes 111. The through-holes 111 penetrate the first main part 11 in the z direction. The number of the through-holes 111 to be provided is not limited, including one or more than one. In the illustrated example, the first main part 11 is provided with two through-holes 111. The shape of the through-holes 111 is not specifically limited and may be selected from a variety of shapes, including circular, elliptical or oval, rectangular, polygonal shapes as necessary. In the illustrated example, each through-hole 111 as viewed in z direction has an elliptical or oval shape that is longer in the x direction.

The first prongs 12 extend from the first main part 11 toward the y2 side in the y direction. The number of the first prongs 12 to be provided is not limited. In the illustrated example, five first prongs 12 are provided. The first prongs 12 are arranged side by side in the x direction. In the illustrated example, each first prong 12 has a tip 121 and a root 122. The tip 121 is offset from the first main part 11 toward the y2 side in the y direction. In the z direction, the tip 121 is offset from the first main part 11 toward the z2 side. The shape of the tip 121 is not specifically limited. In the illustrated example, the tip 121 is tapered and has an x-direction dimension diminishing toward the y2 side in the y direction. Also, the tip 121 is elongated in the y direction, forming substantially a right angle to the z direction. The root 122 of each first prong 12 is located between the tip 121 and the first main part 11, connecting the tip 121 and the first main part 11. The root 122 is inclined toward the tip 121 in the z direction (toward the z2 side) with approach from the first main part 11 to the tip 121 in the y direction (from the y1 side to the y2 side). In the illustrated example, two of the first prongs 12 located at the opposite ends in the x direction have a smaller x-direction dimension than the other first prongs 12 located between them. The five first prongs 12 all have the same y-direction dimension. The five first prongs 12 are arranged in a portion of the first main part 11 offset toward the x2 side in the x direction.

The first extended part 13 is provided on an end of the first main part 11. In this embodiment, the first extended part 13 extends in the x direction from the first main part 11, and more specifically extends outward from the end of the first main part 11 on the x1 side in the x direction. The first extended part 13 has a first end face 131. The first end face 131 faces away from the first main part 11 in the x direction. In other words, the first end face 131 faces outward, which is the x1 side in the x direction. The first end face 131 illustrated in the figures is perpendicular to the x direction. The first end face 131 has the same position in the x direction as the end faces 631 on the x1 side.

The third extended part 14 is provided on an end of the first main part 11. In this embodiment, the third extended part 14 extends in the x direction from the first main part 11, and more specifically extends outward from the end of the first main part 11 on the x2 side in the x direction. The third extended part 14 has a third end face 141. The third end face 141 faces away from the first main part 11 in the x direction. In other words, the third end face 141 faces outward, which is the x2 side in the x direction. The third end face 141 illustrated in the figures is perpendicular to the x direction. The third end face 141 has the same position in the x direction as the end faces 631 located on the x2 side.

The first contacting part 15 is connected to the end of the first main part 11 in the y direction on the y1 side opposite the first prongs 12. The first contacting part 15 extends from the first main part 11 toward the z2 side in the z direction. The shape of the first contacting part 15 is not specifically limited. In the illustrated example, the first contacting part 15 has a rectangular shape that is longer in the x direction. In the illustrated example, the center of the first contacting part 15 in the x direction is offset toward the x1 side from the center of the first main part 11 in the x direction.

The first projection 16 is connected to the end of the first main part 11 on the y1 side in the y direction opposite the first prong 12 and is located outward in the x direction from the first contacting part 15. In the illustrated example, two first projections 16 are provided on the opposite sides in the x direction across the first contacting part 15. The first projections 16 extend from the first main part 11 toward the z2 side in the z direction. The shape of the first projections 16 is not specifically limited. In the illustrated example, the first projections 16 have a rectangular shape that is longer in the z direction. The first projections 16 have a greater z-direction dimension than the first contacting part 15. That is, the end of each first projection 16 in the z direction is located further toward the z2 side than the end of the first contacting part 15 in the z direction. One first recess 17 is provided between the first contacting part 15 and each first projection 16. Each first recess 17 is recessed in the z direction toward the z1 side.

The first contacting part 15 of the first lead 1 has an end on the z2 side in the z direction that is electrically bonded to the obverse surface 301 of the third lead 3 via a fourth conductive-bonding part 94. The fourth conductive-bonding part 94 may be made of solder, Ag paste, sintered Ag or sintered Cu, for example. In the illustrated example, the first contacting part 15 is electrically bonded to the thin part 32 of the third lead 3.

The first lead 1 is placed relative to the third lead 3 by inserting the end of each first projection 16 into a recess 321 of the thin part 32 from the z1 side in the z direction. In the illustrated example, clearance is left between each first projection 16 and the corresponding recess 321. In a different example, each first projection 16 may abut against a portion of the recess 321.

[Second Lead 2]

As shown in FIGS. 1 to 5, 8, 10, 12 to 14 and 17 to 19, the second lead 2 is offset toward the z1 side in the z direction from the third lead 3, the fourth lead 4, the fifth lead 5 and the island lead 6. The second lead 2 is offset from the first lead 1 toward the y2 side in the y direction. The second lead 2 of this embodiment includes a second main part 21, a plurality of second prongs 22, a second extended part 23, a fourth extended part 24, a second contacting part 25, a second projection 26, a second recess 27 and a connecting part 29. The second lead 2 is shown alone in FIGS. 25 to 29.

The second main part 21 has the shape of a plate extending in the x direction and the y direction. In the illustrated example, the second main part 21 generally has a rectangular shape that is longer in the x direction. In the illustrated example, the second main part 21 has through-holes 211. The through-holes 211 penetrate the second main part 21 in the z direction. The number of the through-holes 211 to be provided is not limited, including one or more than one. In the illustrated example, the second main part 21 is provided with two through-holes 211. The shape of the through-holes 211 is not specifically limited and may be selected from a variety of shapes, including circular, elliptical or oval, rectangular, polygonal shapes as necessary. In the illustrated example, each through-hole 211 as viewed in z direction has an elliptical or oval shape that is longer in the x direction. In this embodiment, the second main part 21 has substantially the same position in the z direction as the first main part 11.

The second prongs 22 extend from the second main part 21 toward the y1 side in the y direction. The number of the second prongs 22 to be provided is not limited. In the illustrated example, four second prongs 22 are provided. The second prongs 22 are arranged side by side in the x direction. In this embodiment, the first prongs 12 and the second prongs 22 are alternately arranged in the x direction. In the illustrated example, each second prong 22 has a tip 221 and a root 222. The tip 221 is offset from the second main part 21 toward the y1 side in the y direction. In the z direction, the tip 221 is offset from the second main part 21 toward the z2 side. In this embodiment, the respective tips 221 have substantially the same position in the z direction as the tips 121. The shape of each tip 221 is not specifically limited. In the illustrated example, the tip 221 is tapered and has an x-direction dimension diminishing toward the y1 side in the y direction. Also, the tip 221 is elongated in the y direction, forming substantially a right angle to the z direction. The root 222 of each second prong 22 is located between the tip 221 and the second main part 21, connecting the tip 221 and the second main part 21. The root 222 is inclined toward the tip 221 in the z direction (toward the z2 side) with approach from the second main part 21 to the tip 221 in the y direction (from the y2 side to the y1 side). In the illustrated example, the second prongs 22 all have the same x-direction dimension and the same y-direction dimension. The second prongs 22 are arranged in a portion of the second main part 21 offset toward the x2 side in the x direction.

The second extended part 23 is provided on an end of the second main part 21. In this embodiment, the second extended part 23 extends in the x direction from the second main part 21, and more specifically extends outward from the end of the second main part 21 on the x1 side in the x direction. The second extended part 23 has a second end face 231. The second end face 231 faces away from the second main part 21 in the x direction. In other words, the second end face 231 faces outward, which is the x1 side in the x direction. The second end face 231 illustrated in the figures is perpendicular to the x direction. In this embodiment, the second end face 231 has substantially the same position in the x direction as the first end face 131 and the end faces 631 located on the x1 side.

The fourth extended part 24 is provided on an end of the second main part 21. In this embodiment, the fourth extended part 24 is connected to the second main part 21 by the connecting part 29. The y-direction dimension of the connecting part 29 is smaller than that of the second main part 21 and the fourth extended part 24. As such, the fourth extended part 24 of the present disclosure is not limited to the structure directly connected to the second main part 21 and may be connected to the second main part 21 via another part. The same applies to the second extended part 23. Similarly, the first extended part 13 and the third extended part 14 are not limited to structure directly connected to the first main part 11 and may be connected to the first main part 11 via another part. The fourth extended part 24 extends in the y direction and toward the y2 side in the y direction. The fourth extended part 24 has a fourth end face 241. The fourth end face 241 faces away from the second main part 21 in the y direction. In other words, the fourth end face 241 faces outward, which is the y2 side in the y direction. The fourth end face 241 illustrated in the figures is perpendicular to the y direction. The fourth end face 241 has substantially the same position in the y direction as the end faces 431 and 531.

In the illustrated example, the fourth extended part 24 has the same position in the x direction as the outermost one of the second prongs 22 on the x2 side.

The second contacting part 25 is connected to the end of the second main part 21 on the y2 side in the y direction opposite the second prongs 22. The second contacting part 25 extends from the second main part 21 toward the z2 side in the z direction. The shape of the second contacting part 25 is not specifically limited. In the illustrated example, the second contacting part 25 has a rectangular shape that is longer in the x direction. In the illustrated example, the second contacting part 25 has the center in the x direction that coincides with the center of the second main part 21 in the x direction.

The second projection 26 is connected to the end of the second main part 21 on the y2 side in the y direction opposite the second prong 22 and is located outward in the x direction from the second contacting part 25. In the illustrated example, two second projections 26 are provided on the opposite sides in the x direction across the second contacting part 25. The second projections 26 extend from the second main part 21 toward the z2 side in the z direction. The shape of the second projections 26 is not specifically limited. In the illustrated example, the second projections 26 have a rectangular shape that is longer in the z direction. The second projections 26 have a greater z-direction dimension than the second contacting part 25. That is, the end of each second projection 26 in the z direction is located farther toward the z2 side than the end of the second contacting part 25 in the z direction. A second recess 27 is provided between the second contacting part 25 and each second projection 26. Each second recess 27 is recessed in the z direction toward the z1 side.

The second contacting part 25 of the second lead 2 has an end on the z2 side in the z direction that is electrically bonded to the obverse surface 401 of the fourth lead 4 via a fifth conductive-bonding part 95. The fifth conductive-bonding part 95 may be made of solder, for example. In the illustrated example, the second contacting part 25 is electrically bonded to the thick part 41 of the fourth lead 4.

The second lead 2 is placed relative to the fourth lead 4 by inserting the end of each second projection 26 into a recess 421 of the thin part 42 of from the z1 side in the z direction. In the illustrated example, clearance is left between each second projection 26 and the corresponding recess 421. In a different example, each second projection 26 may abut against a portion of the corresponding recess 421.

[Semiconductor Element 7]

The semiconductor element 7 is a component performing the electrical functions of the semiconductor device A1. The specific configuration of the semiconductor element 7 is not specifically limited. In this embodiment, the semiconductor element 7 is fabricated using a nitride semiconductor or, more specifically, is a high electron mobility transistor (HEMT) using gallium nitride (GaN). As shown in FIGS. 3, 10 to 14 and 17, the semiconductor element 7 includes an element body 70, a first electrode 71, a second electrode 72 and a third electrode 73.

The element body 70 is a laminate of layers, such as a substrate layer, a buffer layer and a nitride layer (the layers are not illustrated). The element body 70 has an element obverse surface 701 and an element reverse surface 702. The element obverse surface 701 is on the z1 side in the z direction. The element reverse surface 702 is on the z2 side in the z direction, facing away from the element obverse surface 701. In the illustrated example, the element reverse surface 702 is provided with a metal layer. The metal layer is bonded to the obverse surface 601 of the island lead 6 via a first conductive-bonding part 91. The first conductive-bonding part 91 may be made of solder, Ag paste, sintered Ag or sintered Cu, for example. The metal layer is provided for bonding by the first conductive-bonding part 91 but this metal layer may be omitted. In a different example, the metal layer may be configured to be at the same potential as e.g. the second electrodes 72. In the illustrated example, the semiconductor element 7 as viewed in the z direction overlaps with a portion of the thick part 61 and a portion of the thin part 62 of the island lead 6.

The first electrode 71, the second electrode 72 and the third electrode 73 are disposed on the element obverse surface 701. In this embodiment, a plurality of first electrodes 71 and a plurality of second electrodes 72 are provided. The number of the first electrodes 71 and the second electrodes 72 to be provided are not specifically limited. In the illustrated example, five first electrodes 71 and four second electrodes 72 are provided. Each first electrode 71 serves as a drain electrode. Each second electrode 72 serves as a source electrode. The first electrodes 71 and the second electrodes 72 are alternately arranged in the x direction. In the illustrated example, the first electrodes 71 and the second electrodes 72 have an elongated shape in the y direction, without being limited to a specific shape. Each first electrode 71 has a portion with a diminishing x-direction dimension from the y1 side toward the y2 side in the y direction. Each second electrode 72 has a portion with a diminishing x-direction dimension from the y2 side toward the y1 side in the y direction.

The first electrodes 71 are electrically bonded to the tips 121 of the first prongs 12 of the first lead 1 via a second conductive-bonding part 92. The second conductive-bonding part 92 may be made of solder, Ag paste, sintered Ag or sintered Cu, for example. The second electrodes 72 are electrically bonded to the tips 221 of the second prongs 22 of the second lead 2 via a third conductive-bonding part 93. The third conductive-bonding part 93 may be made of solder, for example.

The third electrode 73 serves as a gate electrode. The third electrode 73 is offset from the first electrodes 71 toward the y2 side in the y direction and is located outward from the second electrodes 72 in the x direction. In the illustrated example, two third electrodes 73 are provided on the opposite sides in the x direction across the second electrodes 72. In the illustrated example, one of the third electrodes 73 on the x2 side is made operable by being connected to the fifth lead 5 by a wire 99. Instead of the wire 99, a conducting member made from a metal sheet may be used to electrically connect the third electrode 73 and the fifth lead 5. In another example, only one third electrode 73 may be provided and located on the x2 side.

[Sealing Resin 8]

The sealing resin 8 covers a portion of each of the leads 1 to 6, the semiconductor element 7 and the wire 99 and may be made of an insulating material such as epoxy resin. As shown in FIGS. 1, 2, 5 to 9 and 11 to 19, the sealing resin 8 of this embodiment has the shape of a rectangular parallelepiped with a first face 81, a second face 82, a third face 83, a fourth face 84, a fifth face 85 and a sixth face 86.

The first face 81 is on the z1 side in the z direction. In the illustrated example, the first face 81 is a flat surface perpendicular to the z direction. The second face 82 is on the z2 side in the z direction. In the illustrated example, the second face 82 is a flat surface perpendicular to the z direction. The third face 83 is on the y1 side in the y direction. In the illustrated example, the third face 83 is a flat surface perpendicular to the y direction. The fourth face 84 is on the y2 side in the y direction. In the illustrated example, the fourth face 84 is a flat surface perpendicular to the y direction. The fifth face 85 is on the x1 side in the x direction. In the illustrated example, the fifth face 85 is a flat surface perpendicular to the x direction. The sixth face 86 is on the x2 side in the x direction. In the illustrated example, the sixth face 86 is a flat surface perpendicular to the x direction.

In this embodiment, the second face 82 exposes the reverse surfaces 602, 302, 402 and 502 respectively of the island lead 6, the third lead 3, the fourth lead 4 and the fifth lead 5 toward the z2 side in the z direction. The second face 82 is flush with the reverse surfaces 602, 302, 402 and 502 respectively of the island lead 6, the third lead 3, the fourth lead 4 and the fifth lead 5. It may be acceptable that all or any of the reverse surfaces 602, 302, 402 and 502 respectively of the island lead 6, the third lead 3, the fourth lead 4 and the fifth lead 5 protrudes slightly from the second face 82.

The third face 83 exposes the end faces 331 of the third lead 3 toward the y1 side in the y direction. The third face 83 is flush with the end faces 331 of the third lead 3. It may be acceptable that all or any of the end faces 331 protrudes slightly from the third face 83.

The fourth face 84 exposes the fourth end face 241 of the second lead 2, the end faces 431 of the fourth lead 4 and the end face 531 of the fifth lead 5 toward the y2 side in the y direction. The fourth face 84 is flush with the fourth end face 241 of the second lead 2, the end faces 431 of the fourth lead 4 and the end face 531 of the fifth lead 5. It may be acceptable that all or any of the fourth end face 241 of the second lead 2, the end faces 431 of the fourth lead 4 and the end face 531 of the fifth lead 5 protrudes slightly from the fourth face 84.

The fifth face 85 exposes the first end face 131 of the first lead 1, the second end face 231 of the second lead 2 and the end faces 631 of the island lead 6 toward the x1 side in the x direction. The fifth face 85 is flush with the first end face 131 of the first lead 1, the second end face 231 of the second lead 2 and the end faces 631 of the island lead 6. It may be acceptable that all or any of the first end face 131 of the first lead 1, the second end face 231 of the second lead 2 and the end faces 631 of the island lead 6 protrudes slightly from the fifth face 85.

The sixth face 86 exposes the third end face 141 of the first lead 1 and the end faces 631 of the island lead 6 toward the x2 side in the x direction. The sixth face 86 is flush with the third end face 141 of the first lead 1 and the end faces 631 of the island lead 6. It may be acceptable that all or any of the third end face 141 of the first lead 1 and the end faces 631 of the island lead 6 protrudes slightly from the sixth face 86.

The following describes an example of a method for manufacturing a semiconductor device A1, with reference to FIGS. 30 to 35.

The manufacturing method of this embodiment includes a first preparation step, a second preparation step, a mounting step, a third preparation step, a placing step and a curing step.

[First Preparation Step]

Figure 30:
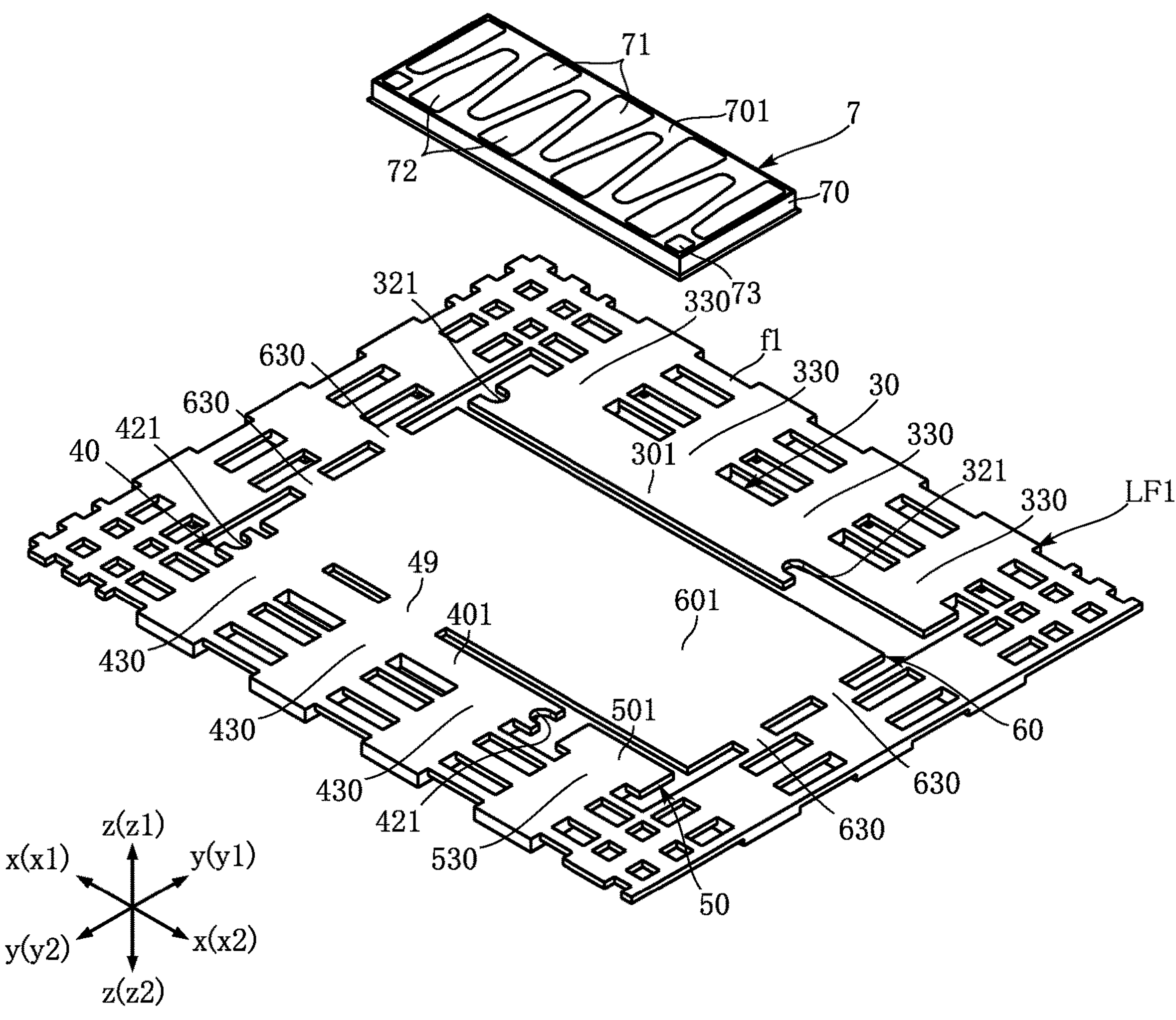
FIG. 30 is a perspective view illustrating an example of a method for manufacturing a semiconductor device according to the first embodiment of the present disclosure.

First, a first leadframe LF1 is prepared as shown in FIG. 30. The first leadframe LF1 includes a frame part f1, a third part 30, a fourth part 40, a fifth part 50 and an island part 60. The frame part f1 is a portion extending in the x and y directions, surrounding the third part 30, the fourth part 40, the fifth part 50 and the island part 60.

The third part 30 is a portion for forming the thick part 31 and the thin part 32 of the third lead 3 of the semiconductor device A1 described above. The third part 30 is connected to the frame part f1 by a plurality of connecting parts 330. The fourth part 40 is a portion for forming the thick part 41 and the thin part 42 of the fourth lead 4 of the semiconductor device A1 described above. The fourth part 40 is connected to the frame part f1 by a plurality of connecting parts 430. The fifth part 50 is a portion for forming the thick part 51 and the thin part 52 of the fifth lead 5 of the semiconductor device A1 described above. The fifth part 50 is connected to the frame part f1 by a plurality of connecting parts 530. The island part 60 is a portion for forming the thick part 61 and the thin part 62 of the semiconductor device A1 described above. The island part 60 is connected to the frame part f1 by a plurality of connecting parts 630. The island part 60 is also connected to the fourth part 40 by the interconnecting part 49. In the first leadframe LF1, the obverse surfaces 301, 401, 501 and 601 are flush with each other. Similarly, the reverse surfaces 302, 402, 502 and 602 are flush with each other.

[Second Preparation Step]

Next, a semiconductor element 7 is prepared. The semiconductor element 7 has the configuration as described above regarding the semiconductor device A1. The order in which the first preparation step and the second preparation step are performed is not specifically limited.

[Mounting Step]

Figure 31:
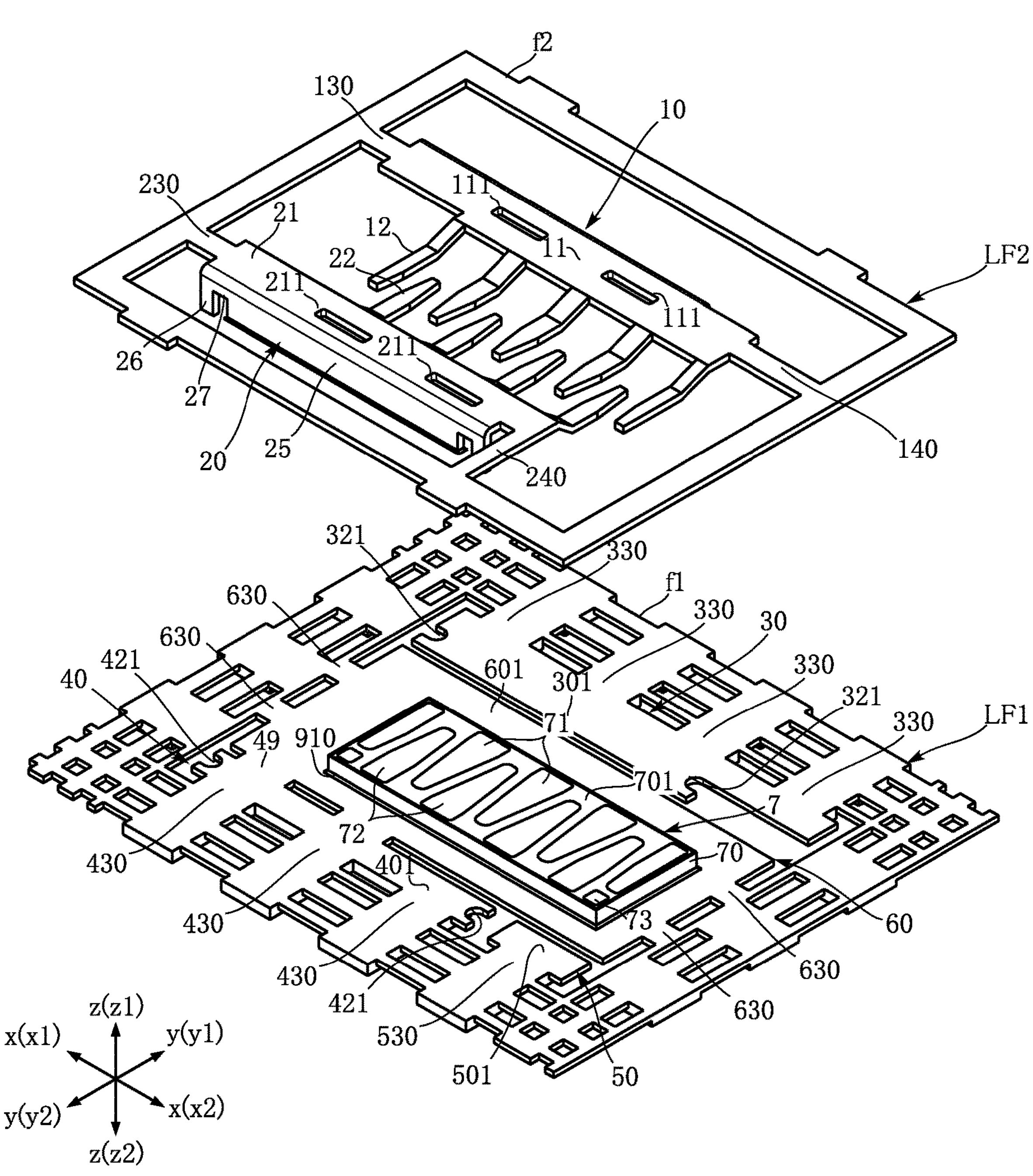
FIG. 31 is a perspective view illustrating an example of the method for manufacturing a semiconductor device according to the first embodiment of the present disclosure.

Next, as shown in FIG. 31, the semiconductor element 7 is mounted on the island part 60. In the mounting step, a first conductive paste 910 is interposed between the element reverse surface 702 of the semiconductor element 7 and the obverse surface 601 of the island part 60. The first conductive paste 910 may be a solder paste, for example.

[Third Preparation Step]

Next, a second leadframe LF2 is prepared. The second leadframe LF2 includes a frame part f2, a first part 10 and a second part 20. The frame part f2 is a portion surrounding the first part 10 and the second part 20.

The first part 10 is a portion for forming the first main part 11, the first prongs 12, the first contacting part 15, the first projections 16 and the first recesses 17 of the first lead 1 of the semiconductor device A1 described above. The first part 10 is connected to the frame part f2 by a first connecting part 130 and a third connecting part 140. The first connecting part 130 and the third connecting part 140 extend outward from the opposite ends of the first part 10 in the x direction. The second part 20 is a portion for forming the second main part 21, the second prongs 22, the second contacting part 25, the second projections 26, the second recesses 27 and the connecting part 29 of the second lead 2 of the semiconductor device A1 described above. The second part 20 is connected to the frame part f2 by a second connecting part 230 and a fourth connecting part 240. The second connecting part 230 extends from the second part 20 toward the x1 side in the x direction. The fourth connecting part 240 extends from the second part 20 toward the y2 side in the y direction. Note that the order is not limited in which the third preparation step is performed relative to the first preparation step, the second preparation step and the mounting step.

[Placing Step]

Figure 32:
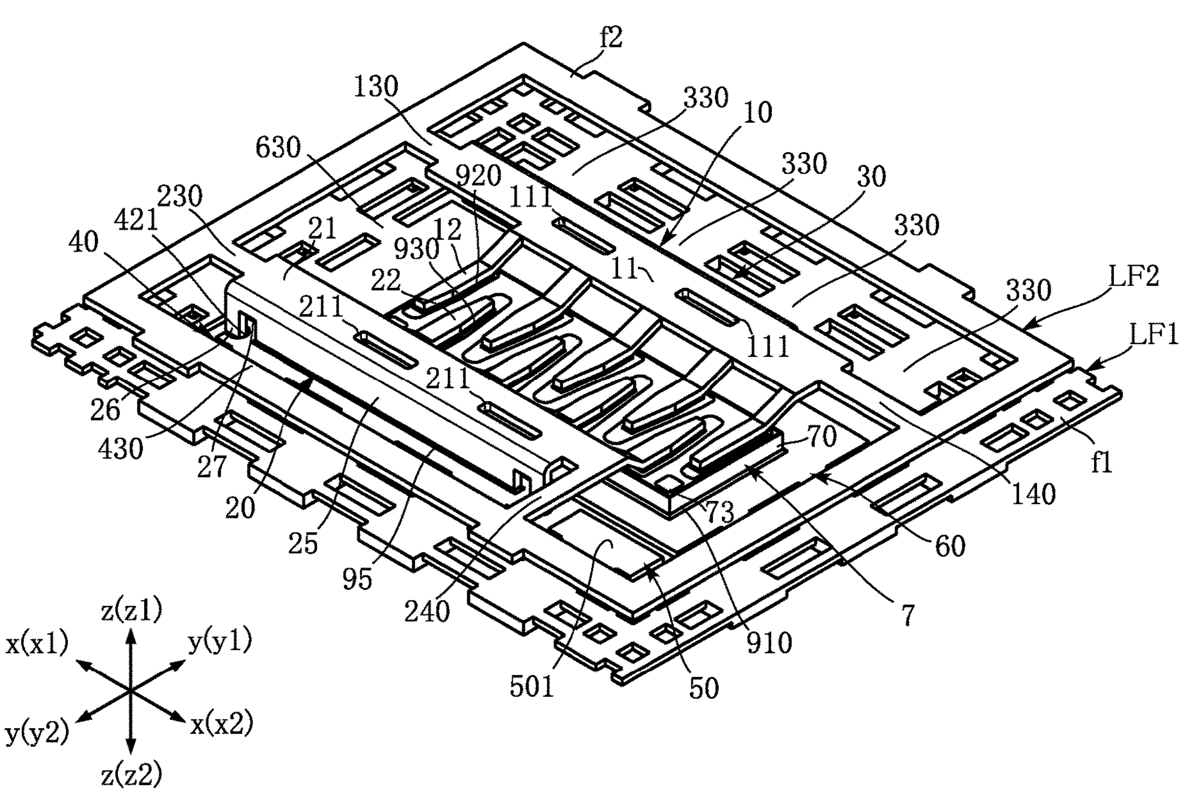
FIG. 32 is a perspective view illustrating an example of the method for manufacturing a semiconductor device according to the first embodiment of the present disclosure.
Figure 33:
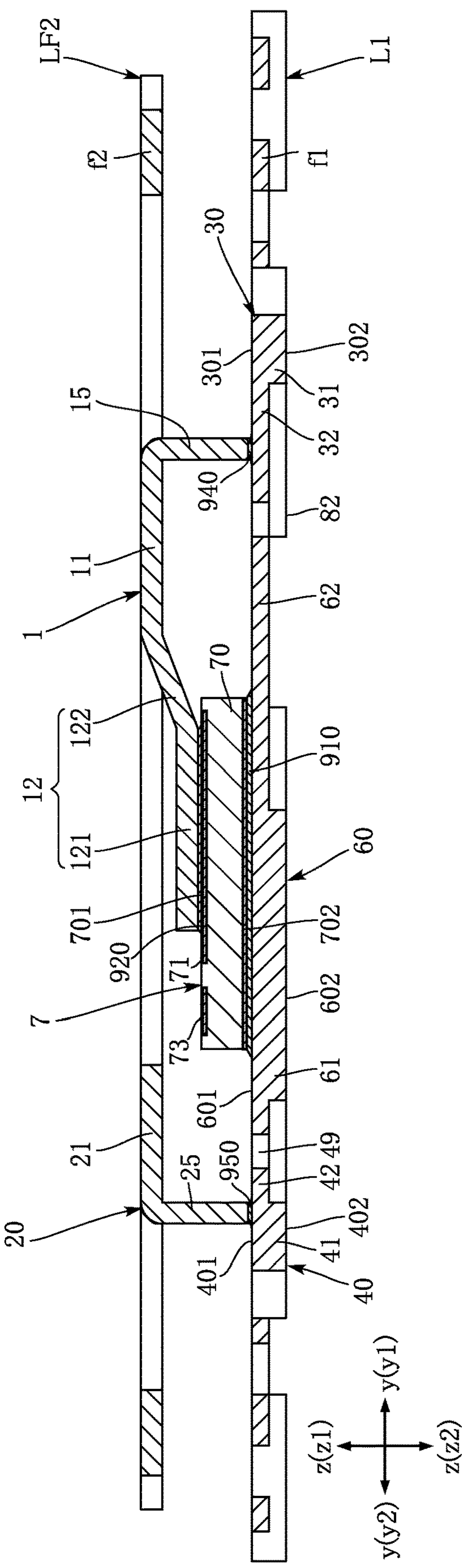
FIG. 33 is a sectional view illustrating an example of the method for manufacturing a semiconductor device according to the first embodiment of the present disclosure.
Figure 34:
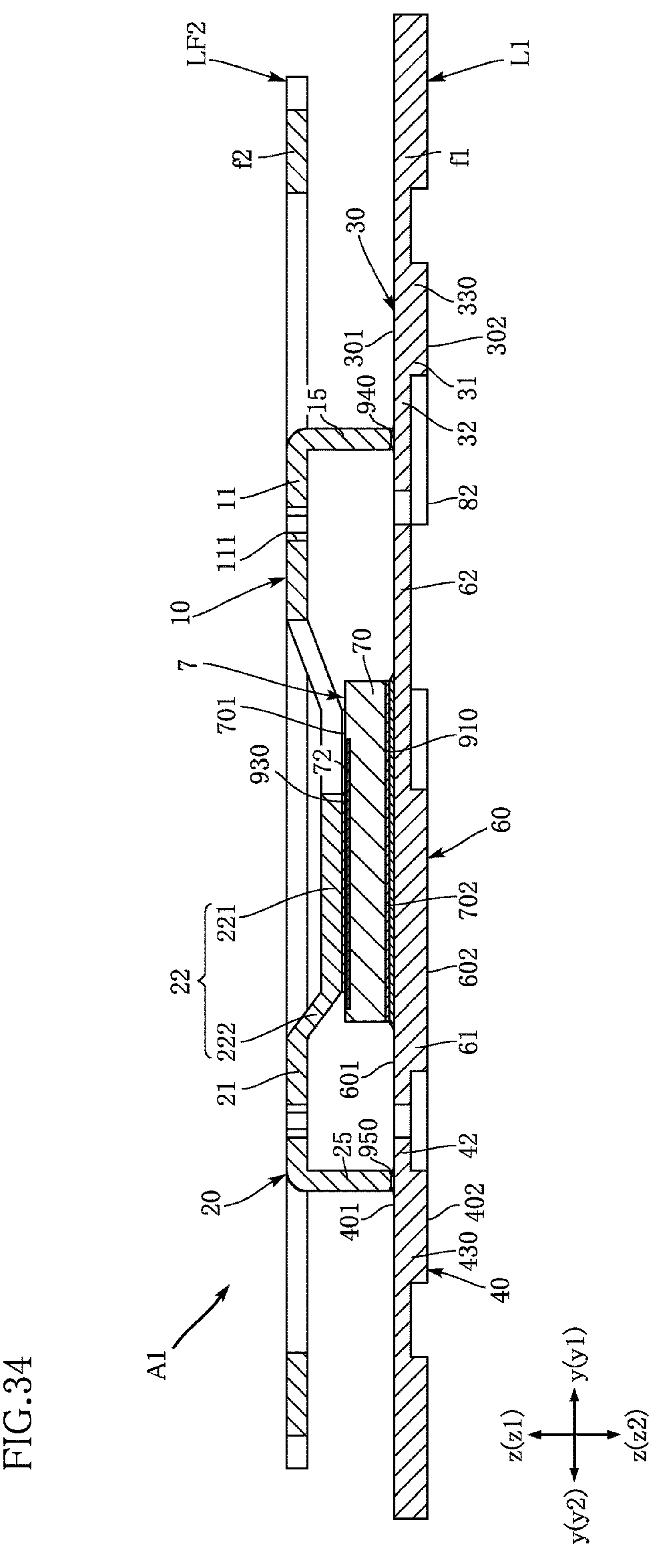
FIG. 34 is a sectional view illustrating an example of the method for manufacturing a semiconductor device according to the first embodiment of the present disclosure.

Next, the second leadframe LF2 is placed as shown in FIGS. 32 to 34. FIG. 33 shows a section taken along a yz plane intersecting a first prong 12. FIG. 34 shows a section taken along a yz plane intersecting a second prong 22. In the placing step, the second conductive paste 920 is interposed between the tip 121 of each first prong 12 of the first part 10 and a corresponding first electrode 71 of the semiconductor element 7. In addition, the third conductive paste 930 is interposed between the tip 221 of each second prong 22 of the second part 20 and a corresponding second electrode 72 of the semiconductor element 7. The second conductive paste 920 and the third conductive paste 930 may be a solder paste, for example. In addition, a fourth conductive paste 940 is interposed between the obverse surface 301 of the third part 30 and the end of the first contacting part 15 of the first part 10 on the z2 side in the z direction. In addition, a fifth conductive paste 950 is interposed between the obverse surface 401 of the fourth part 40 and the end of the second contacting part 25 of the second part 20 on the z2 side in the z direction. The fourth conductive paste 940 and the fifth conductive paste 950 may be a solder paste, for example.

[Curing Step]

The next step is to cure or harden the first conductive paste 910, the second conductive paste 920, the third conductive paste 930, the fourth conductive paste 940 and the fifth conductive paste 950. The curing is performed after the placing step and by heating the first leadframe LF1, the second leadframe LF2 and the semiconductor element 7 in a reflow furnace to a predetermined temperature, followed by cooling. The respective pastes 910, 920, 930, 940 and 950 cured in this way form the first conductive-bonding part 91, the second conductive-bonding part 92, the third conductive-bonding part 93, the fourth conductive-bonding part 94 and the fifth conductive-bonding part 95 of the semiconductor device A1 described above. Then, the first leadframe LF1, the second leadframe LF2 and the semiconductor element 7 are electrically connected to each other by bonding appropriate portions.

Figure 35:
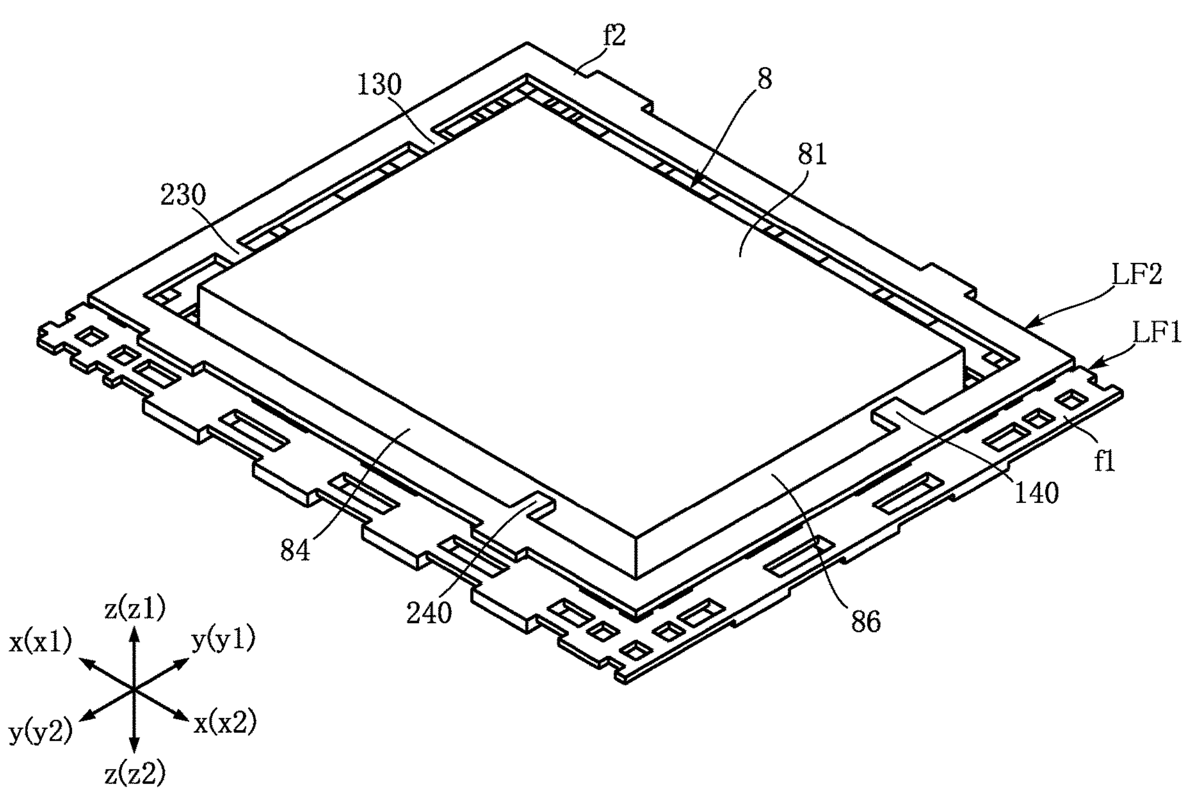
FIG. 35 is a perspective view illustrating an example of the method for manufacturing a semiconductor device according to the first embodiment of the present disclosure.

Then, a third electrode 73 is electrically connected to the obverse surface 501 of the fifth lead 5 by a wire 99. Next, a sealing resin 8 is formed as shown in FIG. 35 to encapsulate a portion of the first leadframe LF1, a portion of the second leadframe LF2 and the semiconductor element 7 and the wire 99. Then, the first connecting part 130, the third connecting part 140, the second connecting part 230, the fourth connecting part 240 and the connecting parts 330, 430, 530 and 630 are cut off outside the sealing resin 8. As a result, portions of the first connecting part 130, the third connecting part 140, the second connecting part 230, the fourth connecting part 240 and the connecting parts 330, 430, 530 and 630 are left within the sealing resin 8, and these remaining portions form the first extended part 13, the third extended part 14, the second extended part 23, the fourth extended part 24 and the extended parts 33, 43, 53 and 63 described above. In addition, the cut surfaces of the respective connecting parts provide the first end face 131, the third end face 141, the second end face 231, the fourth end face 241 and the end faces 331, 431, 531 and 631. Trough the above steps, the semiconductor device A1 is obtained.

Next, the following describes advantages of the semiconductor device A1 and the method for manufacturing the semiconductor device A1.

The present embodiment employs the second leadframe LF2 as shown in FIG. 31, where the first part 10 and the second part 20 are connected to the frame part f2 respectively by the first connecting part 130 and the second connecting part 230. This can prevent undesirable displacement of the first part 10 and the second part 20 while the first conductive paste 910, the second conductive paste 920 and the third conductive paste 930 are in the molten state in the placing step and the subsequent curing step shown in FIG. 32. The present embodiment can therefore enable more precise placement of the conducting members, namely the first lead 1 (the first part 10) and the second lead 2 (the second part 20).

The first part 10 is connected to the frame part f2 by the first connecting part 130 and also by the third connecting part 140. As such, the first part 10 is more firmly held by the frame part f2. This facilitates more precise placement of the first lead 1 (the first part 10). In addition to the second connecting part 230, the fourth connecting part 240 is provided to connect the second part 20 to the frame part f2. As such, the frame part f2 can more firmly support the second part 20. This is preferable for more precise placement of the second lead 2 (the second part 20). In some example, the action of the third connecting part 140 and the fourth connecting part 240 may not be necessary, in which case the third connecting part 140 (the third extended part 14) and the fourth connecting part 240 (the fourth extended part 24) may be omitted.

The first connecting part 130 and the third connecting part 140 are located opposite in the x direction across the first part 10. The connecting parts of such arrangement can more securely support the first part 10.

The fourth connecting part 240 extends toward the y2 side in the y direction and does not extend toward the x2 side in the x direction. As such, it is avoided that most of the third electrode 73 and the fifth lead 5 are covered by the fourth connecting part 240. This arrangement permits access to the third electrode 73 and the fifth lead 5 without being unduly obstructed in the process of electrically bonding the wire 99.

To correspond with the first electrodes 71 and the second electrodes 72 that are alternately arranged in the x direction, the first prongs 12 and the second prongs 22 are provided alternately in the x direction. Precise placement of the first part 10 and the second part 20 is therefore desirable for electrically bonding the first electrodes 71 and the second electrode 72 to the first prongs 12 and the second prongs 22 properly. For example, the present embodiment can avoid placing the first prongs 12 undesirably close to the second prongs 22.

The first lead 1 and the third lead 3 can be electrically bonded through a smaller bonding area by bonding the end of the first contacting part 15 on the z2 side in the z direction to the obverse surface 301 of the third lead 3. Similarly, the second lead 2 and the fourth lead 4 can be electrically bonded through a smaller bonding area by bonding the end of the second contacting part 25 on the z2 side in the z direction to the obverse surface 401 of the fourth lead 4. This enables the semiconductor device A1 to be more compact. This advantage is achieved more easily with the frame part f2 being able to more firmly support the first part 10 and the second part 20.

FIGS. 36 to 64 show other variations and embodiments of the present disclosure. In these figures, elements identical or similar to those of the embodiment described above are denoted by the same reference numerals. The configurations of the parts and elements described in the embodiments and variations may be combined unless technical inconsistencies arise.

First Variation of First Embodiment

Figure 36:
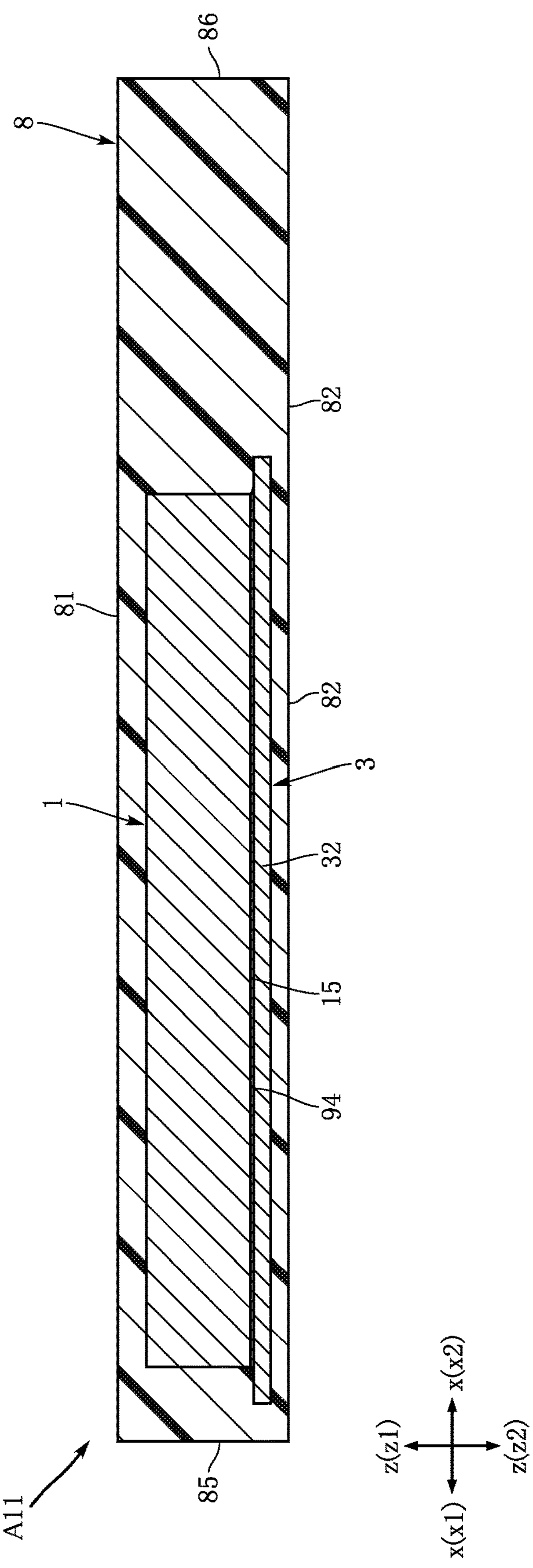
FIG. 36 is a sectional view illustrating a semiconductor device according to a first variation of the first embodiment of the present disclosure.
Figure 37:
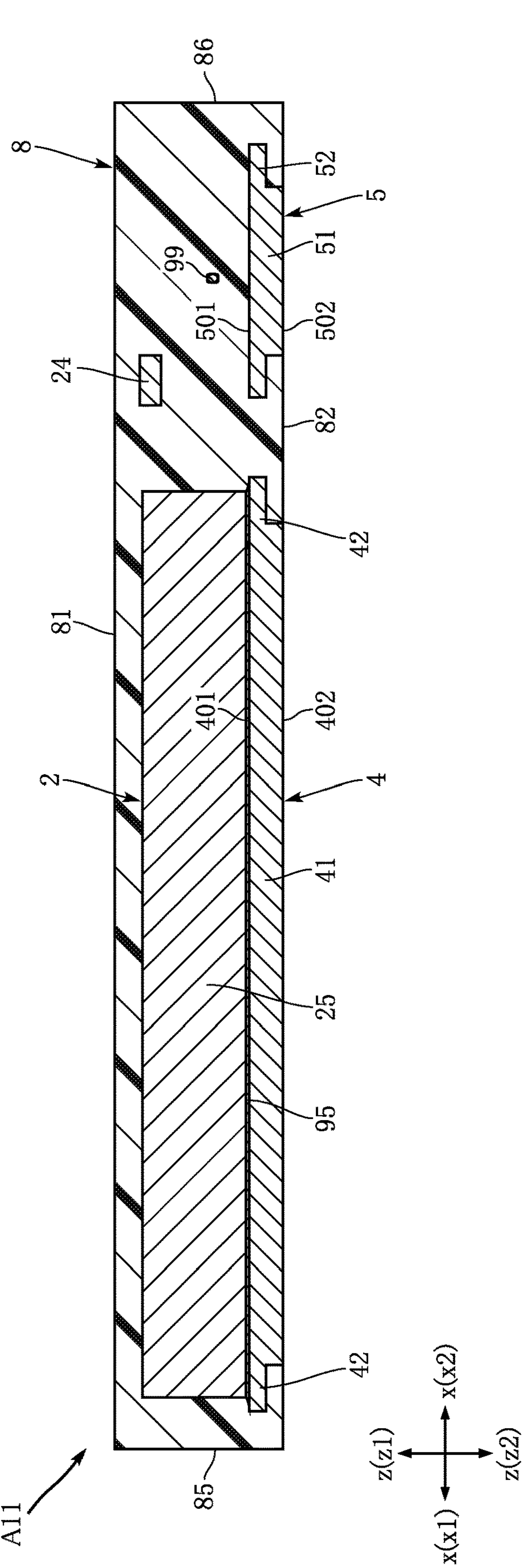
FIG. 37 is a sectional view illustrating the semiconductor device according to the first variation of the first embodiment of the present disclosure.

FIGS. 36 and 37 show a first variation of the semiconductor device A1. A semiconductor device A11 of this variation differs from the semiconductor device A1 described above in the configurations of the first lead 1, the second lead 2, the third lead 3 and the fourth lead 4.

The first lead 1 of this variation includes the first main part 11, the first prongs 12, the first extended part 13, the third extended part 14 and the first contacting part 15 but without the first projections 16 and the first recesses 17 described above. In addition, the thin part 32 of the third lead 3 does not have the recesses 321 described above. The end of the first contacting part 15 on the z2 side of the z direction is electrically bonded to the obverse surface 301 of the third lead 3 via the fourth conductive-bonding part 94.

The second lead 2 of this variation includes the second main part 21, the second prongs 22, the second extended part 23, the fourth extended part 24, the second contacting part 25 and the connecting part 29 but without the second projections 26 and the second recesses 27 described above. In addition, the thin part 42 of the fourth lead 4 does not have the recesses 421 described above. The end of the second contacting part 25 on the z2 side of the z direction is electrically bonded to the obverse surface 401 of the fourth lead 4 via the fifth conductive-bonding part 95.

This variations can enable more precise placement of the first lead 1 and the second lead 2 as in the semiconductor device A1 described above. In addition, this variation shows that various changes can be made to the specific configurations of the first lead 1, the second lead 2, the third lead 3 and the fourth lead 4.

Second Embodiment

Figure 38:
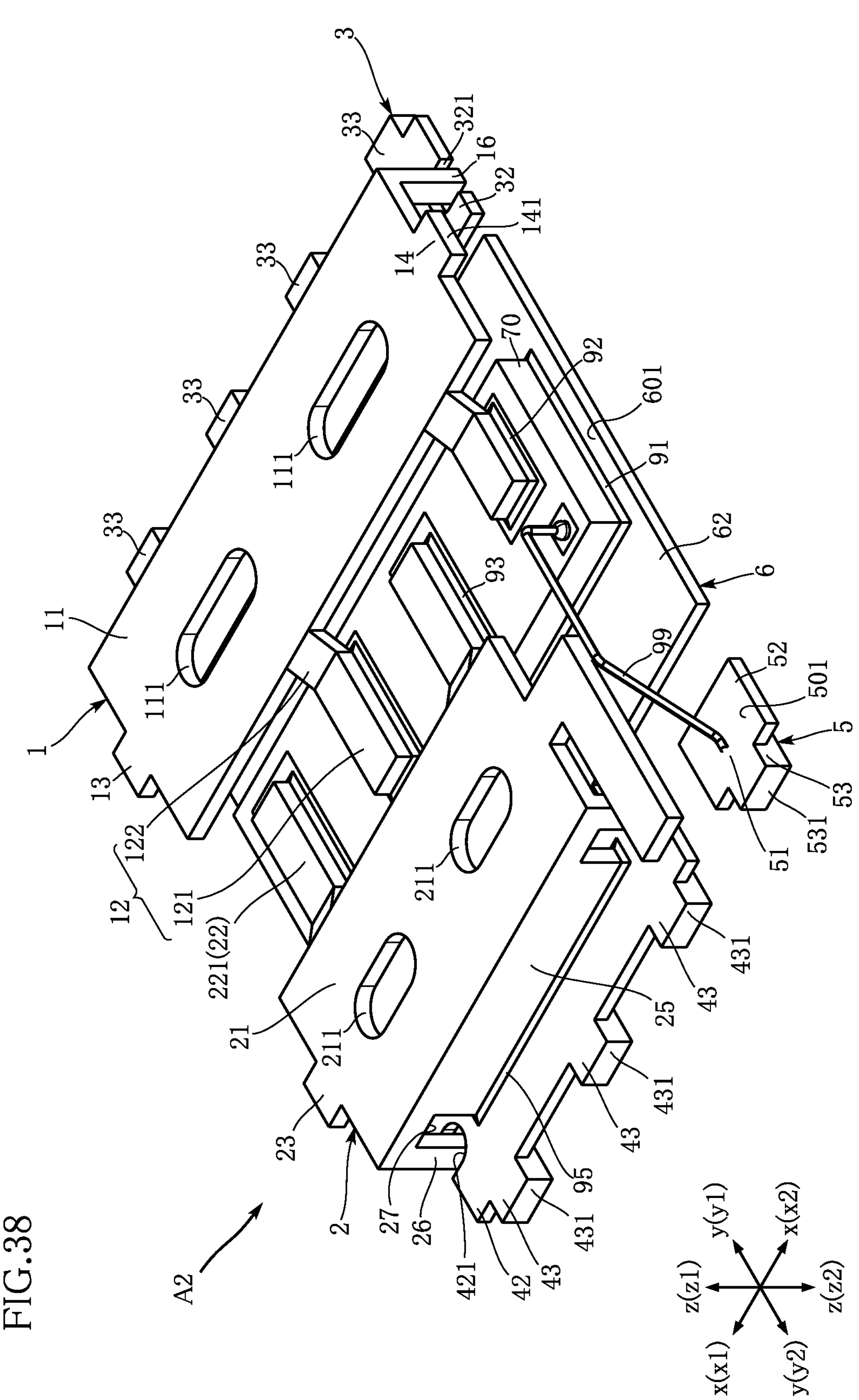
FIG. 38 is a fragmentary perspective view of a semiconductor device according to a second embodiment of the present disclosure.
Figure 39:
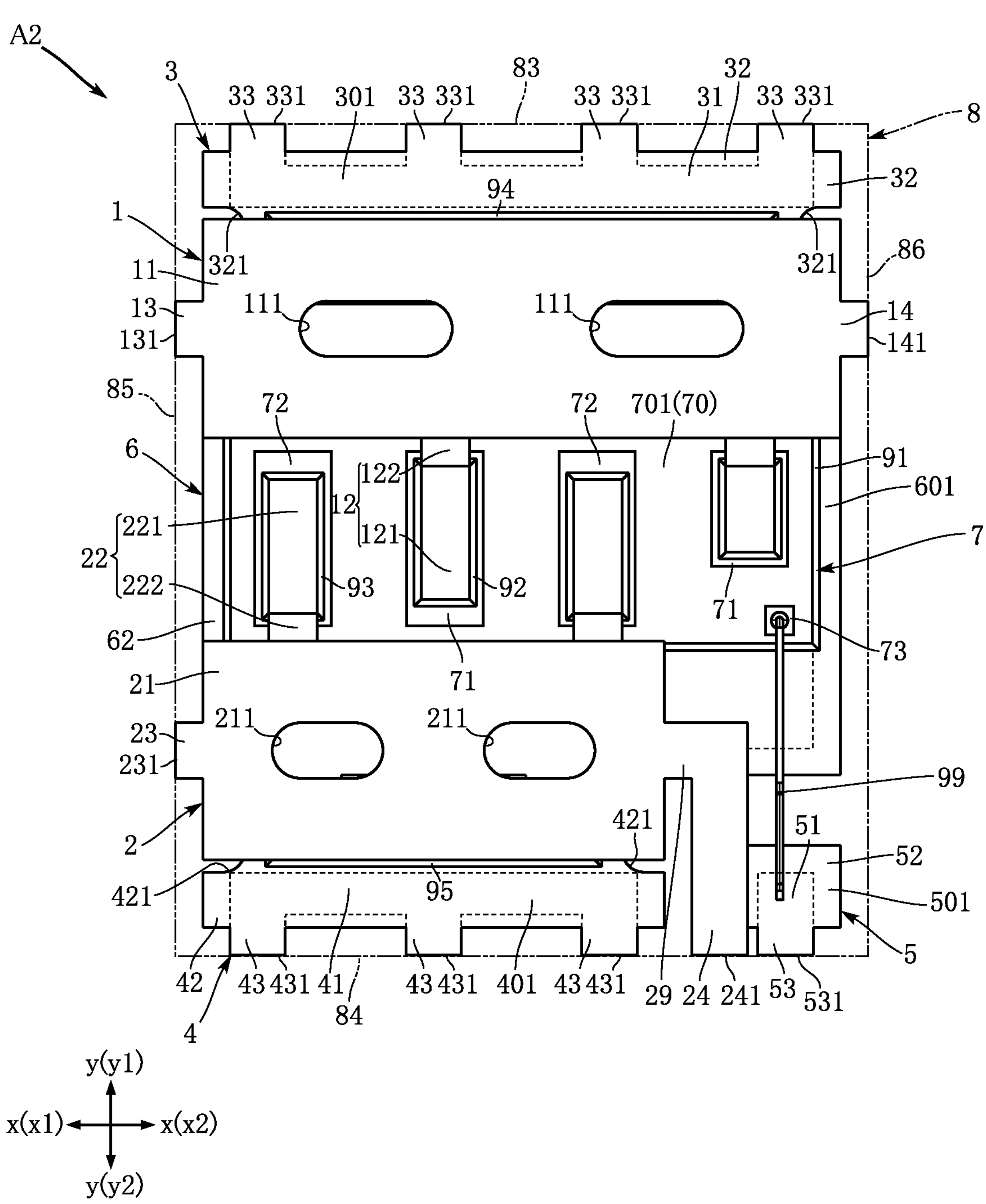
FIG. 39 is a fragmentary plan view of the semiconductor device according to the second embodiment of the present disclosure.
Figure 40:
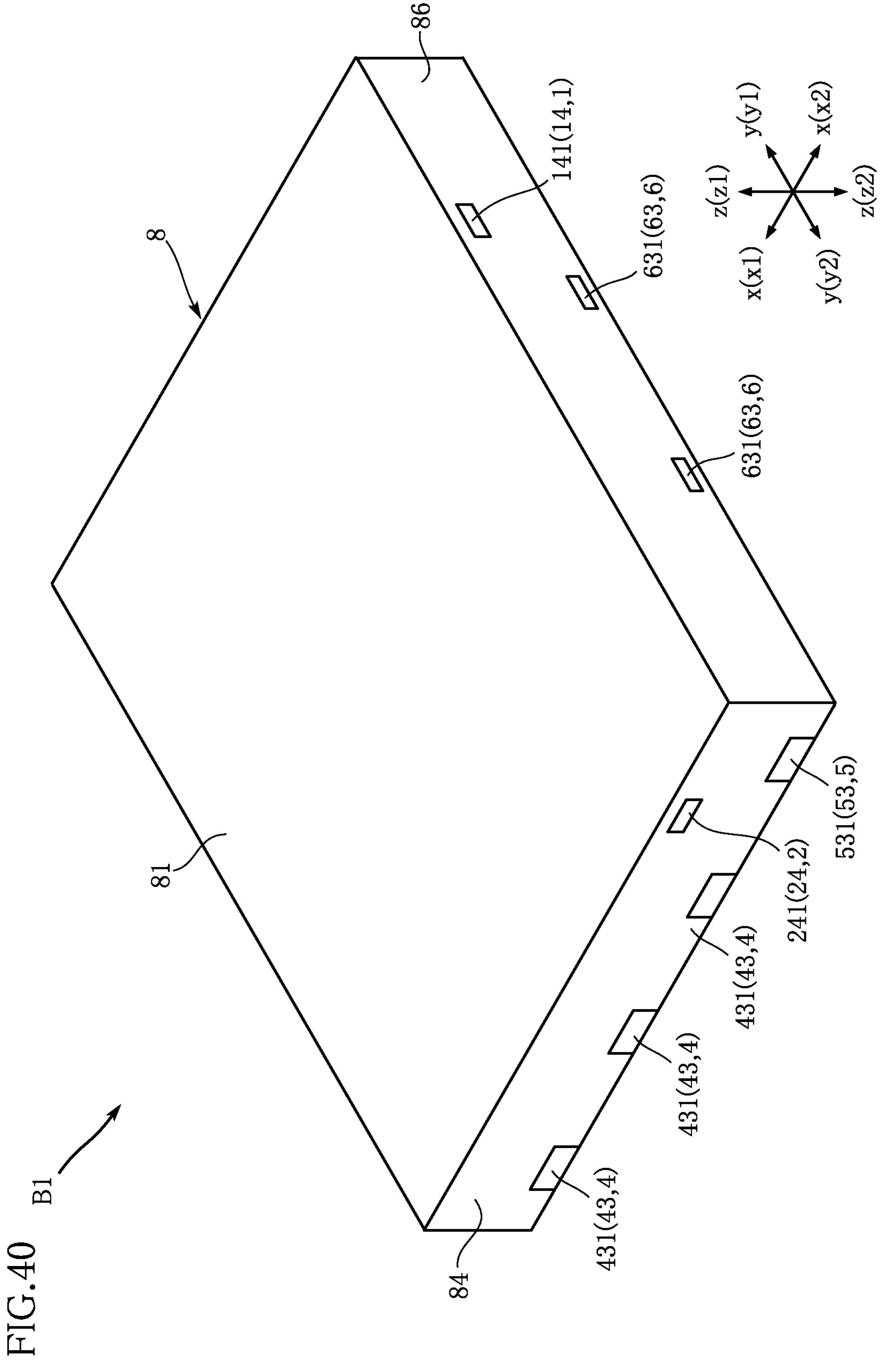
FIG. 40 is a perspective view of a semiconductor device according to a third embodiment of the present disclosure.
Figure 41:
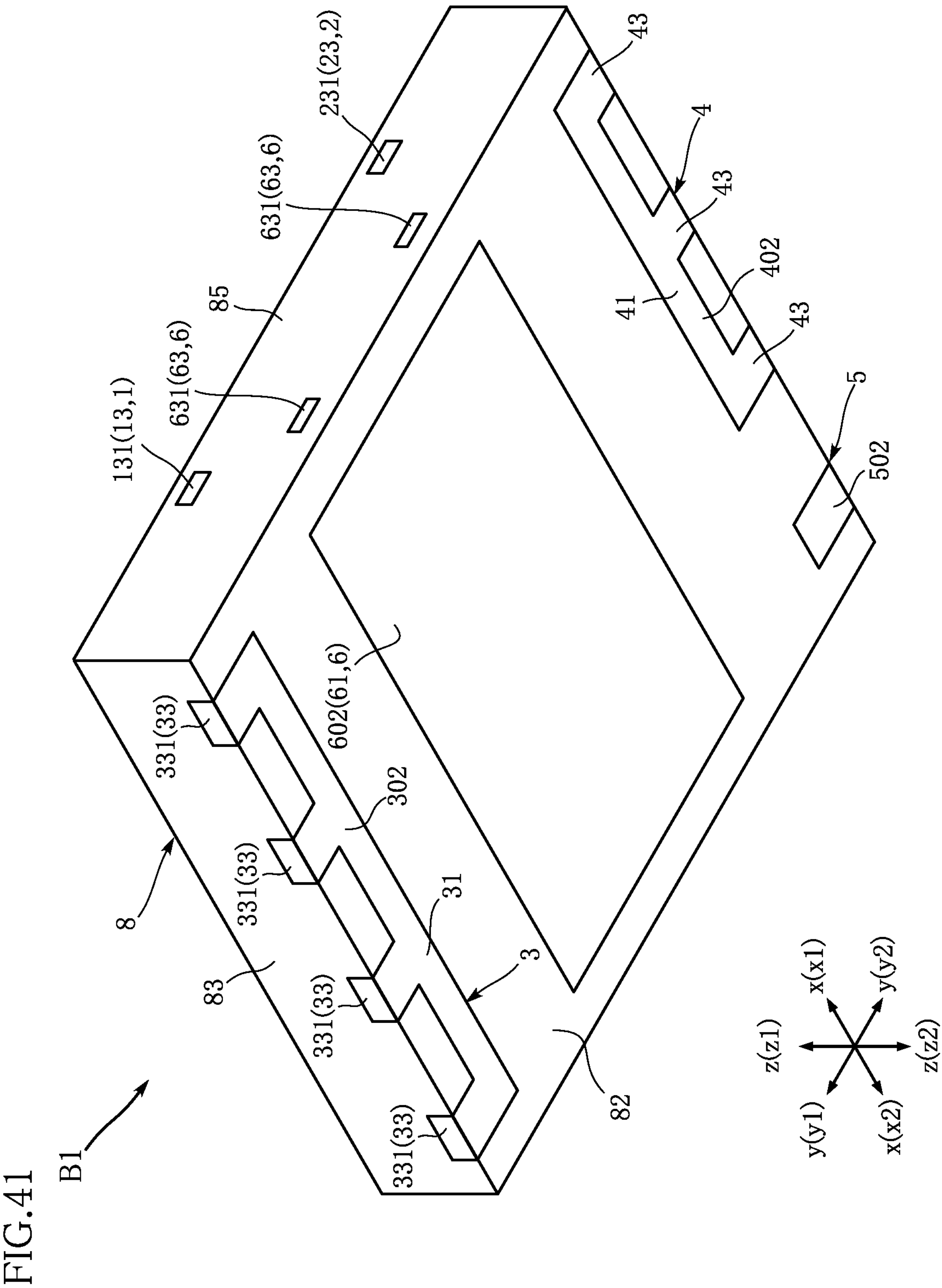
FIG. 41 is a perspective view of the semiconductor device according to the third embodiment of the present disclosure.

FIGS. 38 and 39 show a semiconductor device according to a second embodiment of the present disclosure. As in the semiconductor device A1 described above, a semiconductor device A2 of this embodiment includes a first lead 1, a second lead 2, a third lead 3, a fourth lead 4, a fifth lead 5, an island lead 6 a semiconductor element 7, a wire 99 and a sealing resin 8. The semiconductor device A2 is manufactured by a method similar to the same method for manufacturing the semiconductor device A1.

The semiconductor element 7 of this embodiments includes fewer electrodes than the semiconductor element 7 of the semiconductor device A1. Specifically, the semiconductor element 7 of this embodiment includes two first electrodes 71, two second electrodes 72 and one third electrode 73. Correspondingly, the first lead 1 includes two first prongs 12, and the second lead 2 includes two second prongs 22.

The two first prongs 12 of this embodiment have different lengths in the y direction. The first prong 12 located on the x1 side in the x direction is longer in the y direction than the first prong 12 located on the x2. The first prong 12 located on the x2 in the x direction is closer to the third electrode 73 and the wire 99.

The semiconductor element 7 of this embodiment is mounted with its center in the x direction coinciding or substantially coinciding with the center of the island lead 6 in the x direction. This is in contrast to the semiconductor device A1 having the center of the semiconductor element 7 in the x direction offset toward the x2 side from the center of the island lead 6 in the x direction. That is, the semiconductor device A2 has a smaller center-to-center distance between the semiconductor element 7 and the island lead 6 in the x direction than in the semiconductor device A1. For the semiconductor device A2, the island lead 6 as viewed in the z direction extends substantially equally on the x1 side and the on the x2 side from the semiconductor element 7 in the x direction. This is in contrast to the semiconductor device A1 in which the island lead 6 extends more on the x2 side than on the x1 side from the semiconductor element 7.

The island lead 6 of this embodiment is not provided with the extended parts 63 of the semiconductor device A1 described above. The island lead 6 is connected to the fourth lead 4 by the interconnecting part 49 described above. In the leadframe used in the manufacture of the semiconductor device A2, the island part 60 for forming the island lead 6 is connected to the frame part f2 by the fourth part 40 for forming the fourth lead 4.

This embodiment can enable more precise placement of the first lead 1 and the second lead 2. In addition, the semiconductor device A2 can be made more compact in the x direction than the semiconductor device A1, by virtue of the number and arrangement of the first electrodes 71 and the second electrodes 72 in the semiconductor element 7 and/or the relative positions of the island lead 6 and the semiconductor element 7 of this embodiment.

Third Embodiment

FIGS. 40 to 53 show a semiconductor device according to a third embodiment of the present disclosure. A semiconductor device B1 of this embodiment includes a plurality of leads 1 to 6, a semiconductor element 7, a wire 99 and a sealing resin 8. The semiconductor device B1 may be mounting on, for example, a substrate and used for switching of an electric current. The semiconductor device B1, however, is not limited to a particular use.

[Leads 1 to 6]

The leads 1 to 6 serve various functions, including supporting the semiconductor element 7 and forming conduction paths to the semiconductor element 7. The leads 1 to 6 may be made of a metal, such as Cu, Ni or Fe. The leads 1 to 6 may be formed from a metal sheet by selectively applying appropriate processes, including stamping, bending and etching. The leads 1 to 6 may be plated with metal, such as Ag, Ni, or Au, covering appropriate portions of the leads.

In this embodiment, the plurality of leads 1 to 6 are specifically identified as a first lead 1, a second lead 2, a third lead 3, a fourth lead 4, a fifth lead 5 and an island lead 6. In other words, the plurality of leads 1 to 6 include the first lead 1, the second lead 2, the third lead 3, the fourth lead 4, the fifth lead 5 and the island lead 6. As will be described later, the fourth lead 4 and the island lead 6 are integral in this embodiment. Depending on the conduction paths to be formed and/or other requirements, the leads 1 to 6 may be provided as separate pieces or one or more of the leads may be made integral. The following description is directed to the first lead 1 and the second lead 2 fabricated from a metal sheet by stamping and bending, and the third lead 3, the fourth lead 4, the fifth lead 5 and the island lead 6 fabricated from a metal sheet by etching.

[Island Lead 6]

As shown in FIGS. 40 to 42, 45 and 47 to 53, the island lead 6 has an obverse surface 601, a reverse surface 602, a thick part 61, a thin part 62 and a plurality of extended parts 63. The obverse surface 601 is on the z1 side in the z direction. In the illustrated example, the obverse surface 601 is a smooth surface perpendicular to the z direction. The island lead 6 may have one or more recesses and/or grooves recessed from the obverse surface 601 as necessary. The reverse surface 602 is on the z2 side in the z direction, facing away from the obverse surface 601. In the illustrated example, the reverse surface 602 is a smooth surface perpendicular to the z direction. The reverse surface 602 may be plated with, for example, Ni or Ti as necessary.

The thick part 61 is a portion where the obverse surface 601 and the reverse surface 602 overlap as viewed in the z direction. In the illustrated example, the thick part 61 is rectangular as viewed in the z direction. Note that the shape of the thick part 61 is not limited to such. The thickness of the thick part 61 in the z direction is equal to the distance between the obverse surface 601 and the reverse surface 602. The thin part 62 is a portion that overlaps with the obverse surface 601 but not with the reverse surface 602 as viewed in the z direction. In the illustrated example, the thin part 62 as viewed in the z direction extends outward from the opposite ends of the thick part 61 in the x direction and the y direction. The thickness of the thin part 62 in the z direction is less than the distance between the obverse surface 601 and the reverse surface 602. The thick part 61 and the thin part 62 are not limited to specific thicknesses. In one example, the thick part 61 may have a thickness of about 0.2 to 0.5 mm, and the thin part 62 may have a thickness of about 0.1 to 0.4 mm. In the illustrated example, the portion of the thin part 62 extending on the y1 side in the y direction is larger than the portion extending on the y2 side.

Each extended part 63 extends from an end of the thin part 62. In the illustrated example, the extended parts 63 are provided on either end of the thin part 62 to extend outward in the x direction. The number of the extended parts 63 to be provided is not limited, including one or more than one. In the illustrated example, two extended parts 63 are provided on the x1 side in the x direction and two extended part 63 are provided on the x2 side. The extended part 63 has an end face 631. The end face 631 faces away from the thin part 62 in the x direction. In other words, the end face 631 faces outward in the x direction. The respective end faces 631 illustrated in the figures are perpendicular to the x direction. The two end faces 631 on the x1 side have the same position in the x direction. Similarly, the two end faces 631 on the x2 side have the same position in the x direction.

[First Lead 1]

Figure 42:
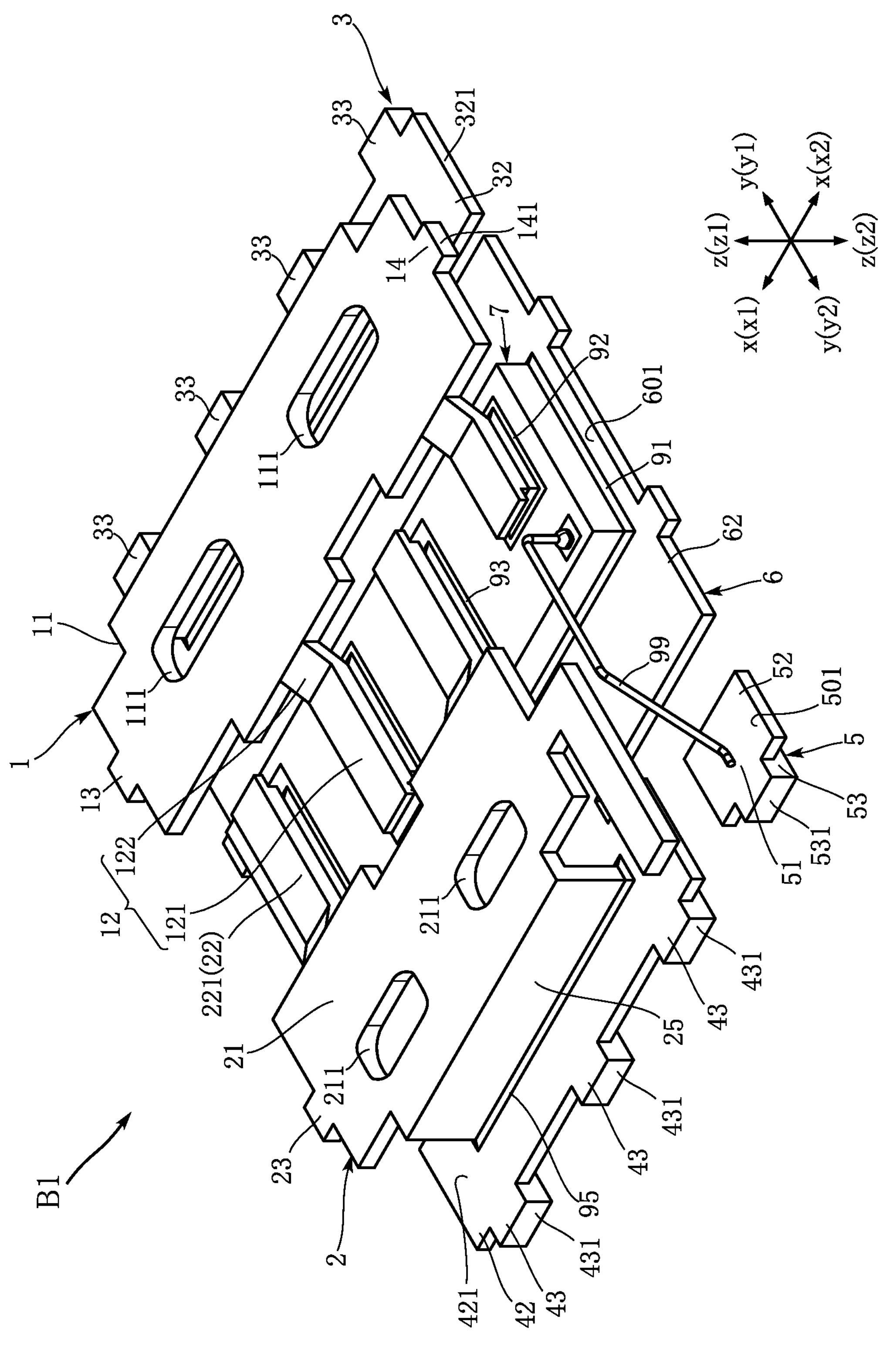
FIG. 42 is a fragmentary perspective view of the semiconductor device according to the third embodiment of the present disclosure.
Figure 43:
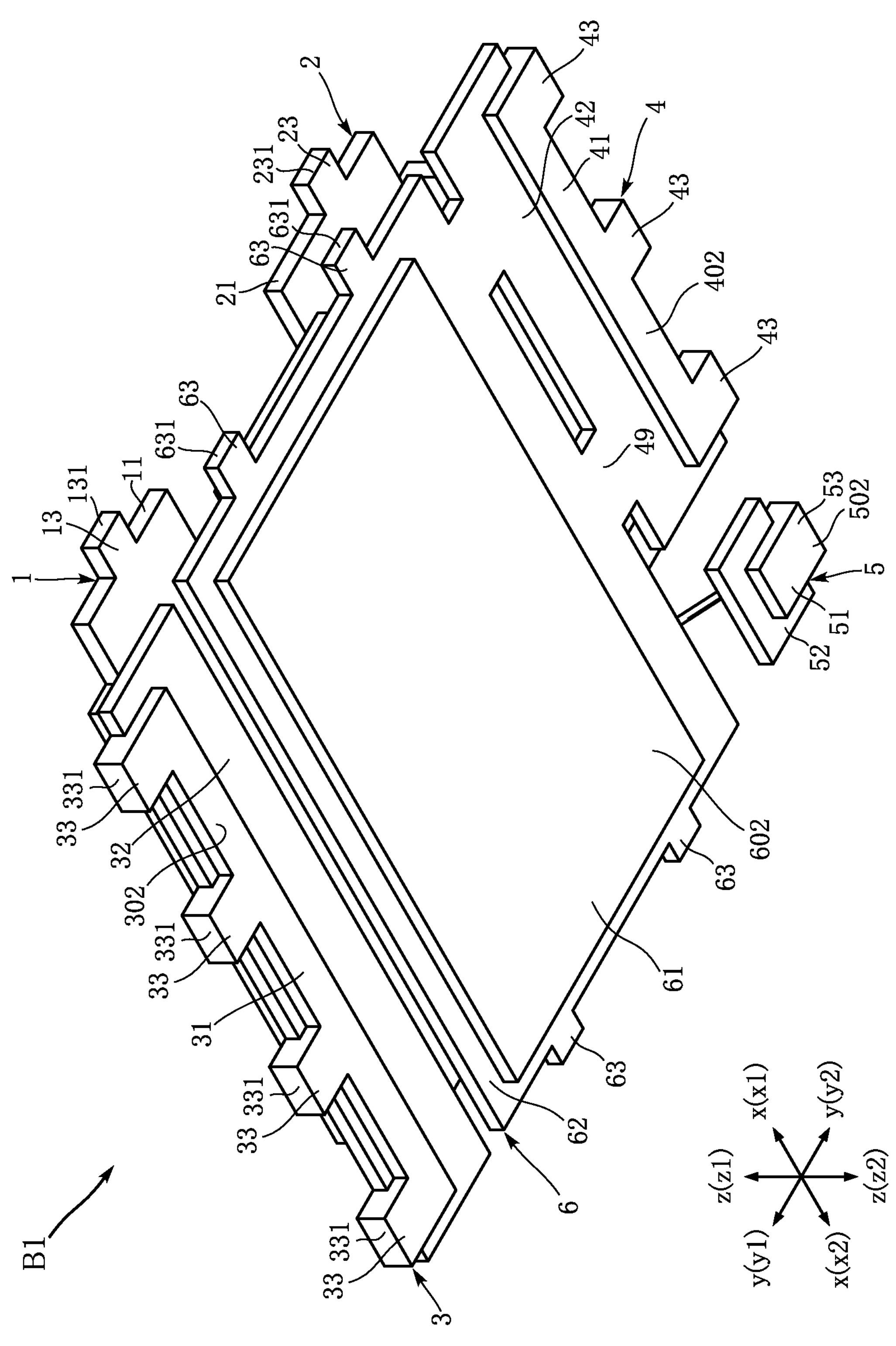
FIG. 43 is a fragmentary perspective view of the semiconductor device according to the third embodiment of the present disclosure.
Figure 51:
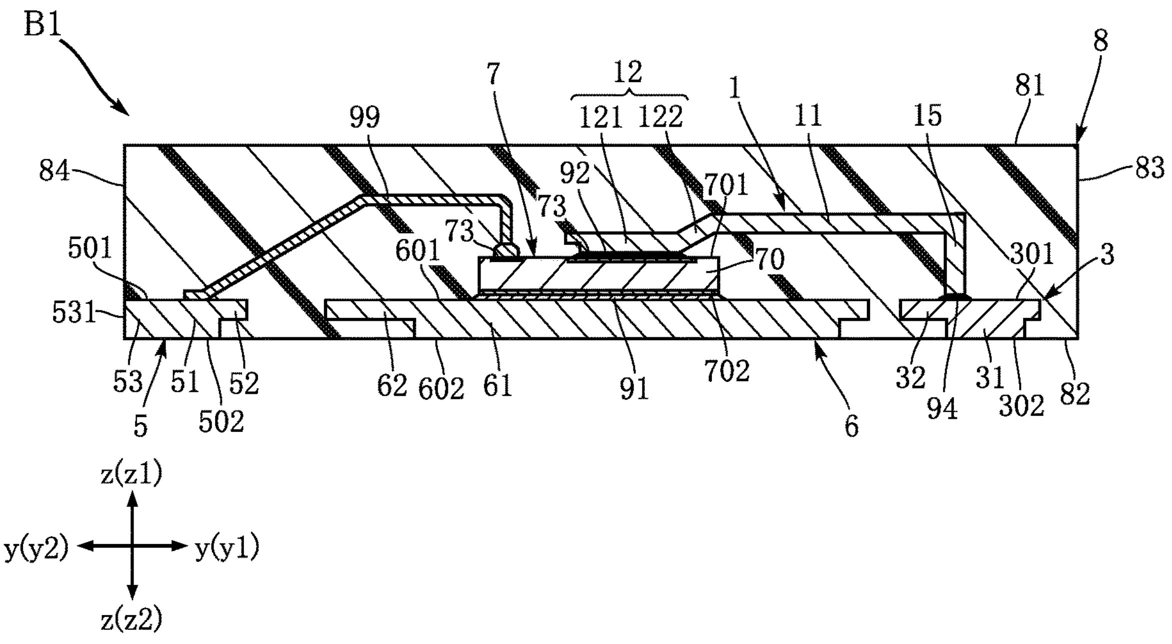
FIG. 51 is a sectional view taken along line LI-LI of FIG. 49.
Figure 52:
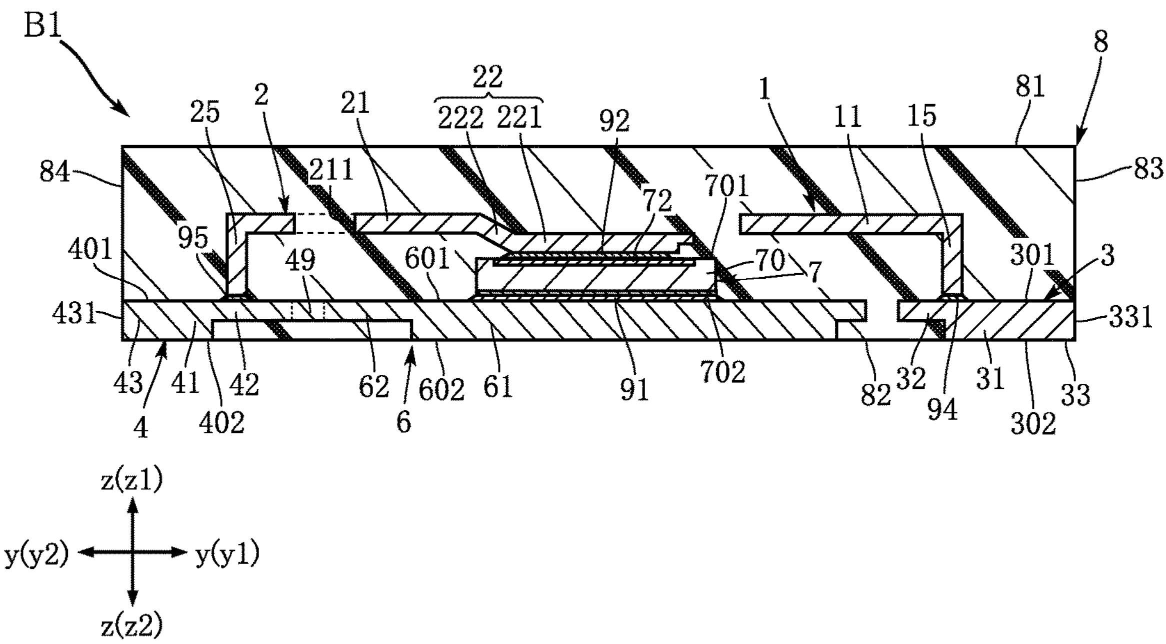
FIG. 52 is a sectional view taken along line LII-LII of FIG. 49.

As shown in FIGS. 42, 51 and 52, the first lead 1 is offset toward the z1 side in the z direction from the third lead 3, the fourth lead 4, the fifth lead 5 and the island lead 6. As shown in FIGS. 40 to 43, 47 to 49, 51 and 52, the first lead 1 of this embodiment includes a first main part 11, a plurality of first prongs 12, a first extended part 13, a third extended part 14 and a first contacting part 15.

The first main part 11 has the shape of a plate extending in the x direction and the y direction. In the illustrated example, the first main part 11 generally has a rectangular shape that is longer in the x direction. In the illustrated example, the first main part 11 has through-holes 111. The through-holes 111 penetrate the first main part 11 in the z direction. The number of the through-holes 111 to be provided is not limited, including one or more than one. In the illustrated example, the first main part 11 is provided with two through-holes 111. The shape of the through-holes 111 is not specifically limited and may be selected from a variety of shapes, including circular, elliptical or oval, rectangular, polygonal shapes as necessary. In the illustrated example, each through-hole 111 as viewed in z direction has an elliptical or oval shape that is longer in the x direction.

The first prongs 12 extend from the first main part 11 toward the y2 side in the y direction. The number of the first prongs 12 to be provided is not limited. In the illustrated example, two first prongs 12 are provided. The first prongs 12 are arranged side by side in the x direction. Each first prong 12 has a tip 121 and a root 122. The tip 121 is offset from the first main part 11 toward the y2 side in the y direction. In the z direction, the tip 121 is offset from the first main part 11 toward the z2 side. The shape of each tip 121 is not specifically limited. In the illustrated example, the tip 121 as viewed in the z direction has a rectangular shape that is longer in the y direction. The tip 121 extends at a right angle to the z direction. In the example shown in FIG. 51, the tip 121 has a thinner portion at the end on the y2 side in the y direction. In a different example, the thickness of the entire tip 121 may uniform. The root 122 of each first prong 12 is located between the tip 121 and the first main part 11, connecting the tip 121 and the first main part 11. The root 122 is inclined toward the semiconductor element 7 in the z direction (toward the z2 side) with approach from the first main part 11 to the tip 121 in the y direction (from the y1 side to the y2 side). In the illustrated example, the two first prongs 12 have different lengths in the y direction. The first prong 12 located on the x1 side in the x direction is longer in the y direction than the first prong 12 located on the x2. The first prong 12 located on the x2 in the x direction is closer to the third electrode 73 and the wire 99, which will be described later.

The first extended part 13 is provided on an end of the first main part 11. The first extended part 13 extends outward in the x direction from the end of the first main part 11 on the x1 side in the x direction. The first extended part 13 has a first end face 131. The first end face 131 faces away from the first main part 11 in the x direction. In other words, the first end face 131 faces outward, which is the x1 side in the x direction. The first end face 131 illustrated in the figures is perpendicular to the x direction. The first end face 131 has the same position in the x direction as the end faces 631 located on the x1 side.

The third extended part 14 is provided on an end of the first main part 11. The third extended part 14 extends outward in the x direction from the end of the first main part 11 on the x2 side in the x direction. The third extended part 14 has a third end face 141. The third end face 141 faces away from the first main part 11 in the x direction. In other words, the third end face 141 faces outward, which is the x2 side in the x direction. The third end face 141 illustrated in the figures is perpendicular to the x direction. The third end face 141 has the same position in the x direction as the end faces 631 located on the x2 side.

The first contacting part 15 is connected to the end of the first main part 11 on the y1 side in the y direction opposite the first prongs 12. The first contacting part 15 extends from the first main part 11 toward the z2 side in the z direction. The shape of the first contacting part 15 is not specifically limited. In the illustrated example, the first contacting part 15 has a rectangular shape that is longer in the x direction. In the illustrated example, the first contacting part 15 has the center in the x direction that coincides with the center of the first main part 11 in the x direction.

As shown in FIGS. 51 and 52, the first contacting part 15 of the first lead 1 has an end on the z2 side in the z direction that is electrically bonded to the third lead 3 via a fourth conductive-bonding part 94. The fourth conductive-bonding part 94 may be made of solder, Ag paste, sintered Ag or sintered Cu, for example.

[Second Lead 2]

Figure 49:
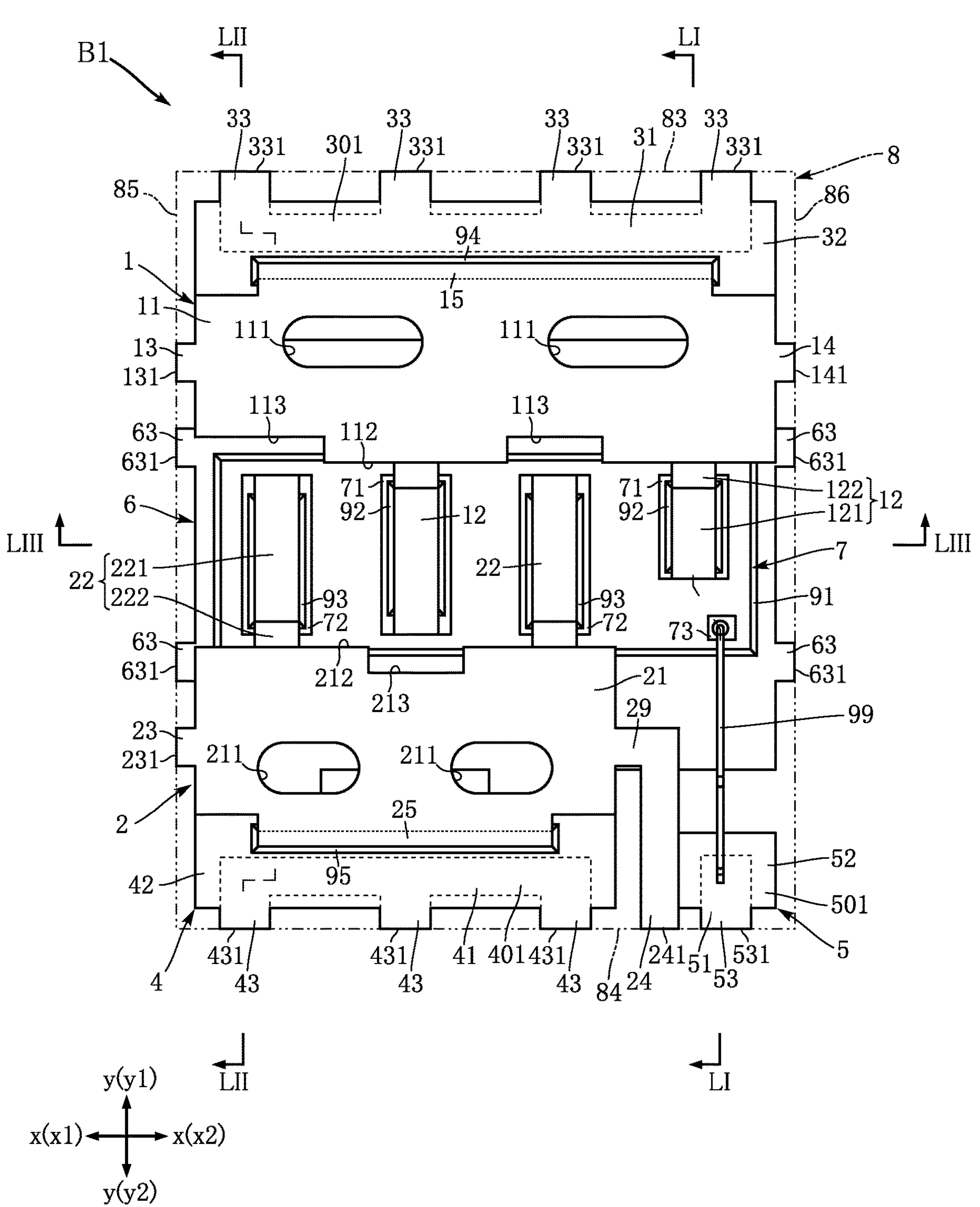
FIG. 49 is a fragmentary plan view of the semiconductor device according to the third embodiment of the present disclosure.

As shown in FIGS. 42, 49 and 52, the second lead 2 is offset toward the z1 side in the z direction from the third lead 3, the fourth lead 4, the fifth lead 5 and the island lead 6. The second lead 2 is offset from the first lead 1 toward the y2 side in the y direction. As shown in FIGS. 40 to 42, 44, 46, 47 49 and 52, the second lead 2 of this embodiment includes a second main part 21, a plurality of second prongs 22, a second extended part 23, a fourth extended part 24, a second contacting part 25 and a connecting part 29.

The second main part 21 has the shape of a plate extending in the x direction and the y direction. In the illustrated example, the second main part 21 generally has a rectangular shape that is longer in the x direction. The first main part 11 and the second main part 21 are located opposite to each other relative to the semiconductor element 7 in the y direction. In the illustrated example, the second main part 21 has through-holes 211. The through-holes 211 penetrate the second main part 21 in the z direction. The number of the through-holes 211 to be provided is not limited, including one or more than one. In the illustrated example, the second main part 21 is provided with two through-holes 211. The shape of the through-holes 211 is not specifically limited and may be selected from a variety of shapes, including circular, elliptical or oval, rectangular, polygonal shapes as necessary. In the illustrated example, each through-hole 211 as viewed in z direction has an elliptical or oval shape that is longer in the x direction. In this embodiment, the second main part 21 has substantially the same position in the z direction as the first main part 11.

The second prongs 22 extend from the second main part 21 toward the y1 side in the y direction. The number of the second prongs 22 to be provided is not limited. In the illustrated example, two second prongs 22 are provided. The second prongs 22 are arranged side by side in the x direction. The first prongs 12 and the second prongs 22 are alternately arranged in the x direction. Each second prong 22 has a tip 221 and a root 222. The tip 221 is offset from the second main part 21 toward the y1 side in the y direction. In the z direction, the tip 221 is offset from the second main part 21 toward the z2 side. The tips 221 have substantially the same position in the z direction as the tips 121. The shape of each tip 221 is not specifically limited. In the illustrated example, the tip 221 as viewed in the z direction has a rectangular shape that is longer in the y direction. The tip 221 extends at a right angle to the z direction. In the example shown in FIG. 52, the tip 221 has a thinner portion at the end on the y1 side in the y direction. In a different example, the thickness of the entire tip 221 may uniform. The root 222 of each second prong 22 is located between the tip 221 and the second main part 21, connecting the tip 221 and the second main part 21. The root 222 is inclined toward the semiconductor element 7 in the z direction (toward the z2 side) with approach from the second main part 21 to the tip 221 in the y direction (from the y2 side to the y1 side). In the illustrated example, the second prongs 22 all have the same x-direction dimension and the same y-direction dimension.

The second extended part 23 is provided on an end of the second main part 21. The second extended part 23 extends outward in the x direction from the end of the second main part 21 on the x1 side in the x direction. The second extended part 23 has a second end face 231. The second end face 231 faces away from the second main part 21 in the x direction. In other words, the second end face 231 faces outward, which is the x1 side in the x direction. The second end face 231 illustrated in the figures is perpendicular to the x direction. The second end face 231 has the same position in the x direction as the first end face 131 and also as the end faces 631 located on the x1 side.

The fourth extended part 24 is connected to the second main part 21 by the connecting part 29. The y-direction dimension of the connecting part 29 is smaller than that of the second main part 21 and the fourth extended part 24. As such, the fourth extended part 24 of the present disclosure is not limited to the structure directly connected to the second main part 21 and may be connected to the second main part 21 via another part. The same applies to the second extended part 23. Similarly, the first extended part 13 and the third extended part 14 are not limited to the structure directly connected to the first main part 11 and may be connected to the first main part 11 via another part. The fourth extended part 24 extends in the y direction. The fourth extended part 24 has a fourth end face 241. The fourth end face 241 faces away from the second main part 21 in the y direction. In other words, the fourth end face 241 faces outward, which is the y2 side in the y direction. The fourth end face 241 illustrated in the figures is perpendicular to the y direction.

The second contacting part 25 is connected to the end of the second main part 21 on the y2 side in the y direction opposite the second prongs 22. The second contacting part 25 extends from the second main part 21 toward the z2 side in the z direction. The shape of the second contacting part 25 is not specifically limited. In the illustrated example, the second contacting part 25 has a rectangular shape that is longer in the x direction. In the illustrated example, the second contacting part 25 has the center in the x direction that coincides with the center of the second main part 21 in the x direction.

As shown in FIG. 52, the second contacting part 25 of the second lead 2 has an end on the z2 side in the z direction that is electrically bonded to the fourth lead 4 via a fifth conductive-bonding part 95. The fifth conductive-bonding part 95 may be made of solder, for example.

In this embodiment, the first main part 11 of the first lead 1 has a first edge 112 and a first recessed edge 113 as shown in FIG. 49. The first edge 112 is located opposite the second main part 21. In the illustrated example, the first edge 112 extends in the x direction as viewed in the z direction. The first prongs 12 extend in the y direction from the first edge 112. The first recessed edge 113 is recessed from the first edge 112. The first recessed edge 113 is recessed in a direction in which the second prongs 22 extend (the y direction in this embodiment) as viewed in the z direction. One first recessed edge 113 is formed for each second prong 22, in the portion of the first edge 112 opposite the second prong 22 as viewed in the z direction. In the illustrated example, the first main part 11 is provided with two first recessed edges 113. In this embodiment, one of the two first recessed edges 113 is formed between the two first prongs 12 in the x direction, and the other first recessed edge 113 is formed on the end of the first edge 112 on the x1 side in the x direction. One or more of the first recessed edges 113 (one in this embodiment) are provided between the two first prongs 12 in the x direction. In the illustrated example, the semiconductor element 7 as viewed in the z direction overlaps with the first edge 112 but not with the first recessed edges 113. Each first recessed edge 113 is composed of a series of edge segments forming a recess in the first main part 11. Each first recessed edge 113 includes a segment extending parallel to the first edge 112 and a segment extending in the y direction. In an example different from the one shown in FIG. 49, each first recessed edge 113 may define a curved recess or a trapezoidal recess as viewed in the z direction.

In this embodiment, the second main part 21 of the second lead 2 has a second edge 212 and a second recessed edge 213 as shown in FIG. 49. The second edge 212 is located opposite the first main part 11. In the illustrated example, the second edge 212 extends in the x direction as viewed in the z direction. The second prongs 22 extend in the y direction from the second edge 212. The second recessed edge 213 is recessed from the second edge 212. The second recessed edge 213 is recessed in a direction in which the first prongs 12 extend (the y direction in this embodiment) as viewed in the z direction. The second recessed edge 213 is formed in the portion of the second edge 212 opposite a first prong 12 as viewed in the z direction. In the illustrated example, the second main part 21 is provided with one second recessed edge 213. In this embodiment, the second recessed edge 213 is provided between the two second prongs 22 in the x direction. In the illustrated example, the semiconductor element 7 as viewed in the z direction overlaps with the second edge 212 but not with the second recessed edges 213. The second recessed edge 213 is composed of a series of edge segments forming a recess in the second main part 21. The second recessed edge 213 includes a segment extending parallel to the second edge 212 and a segment extending in the y direction. In an example different from the one shown in FIG. 49, the second recessed edge 213 may be a curved recess or a trapezoidal recess as viewed in the z direction.

[Third Lead 3]

Figure 50:
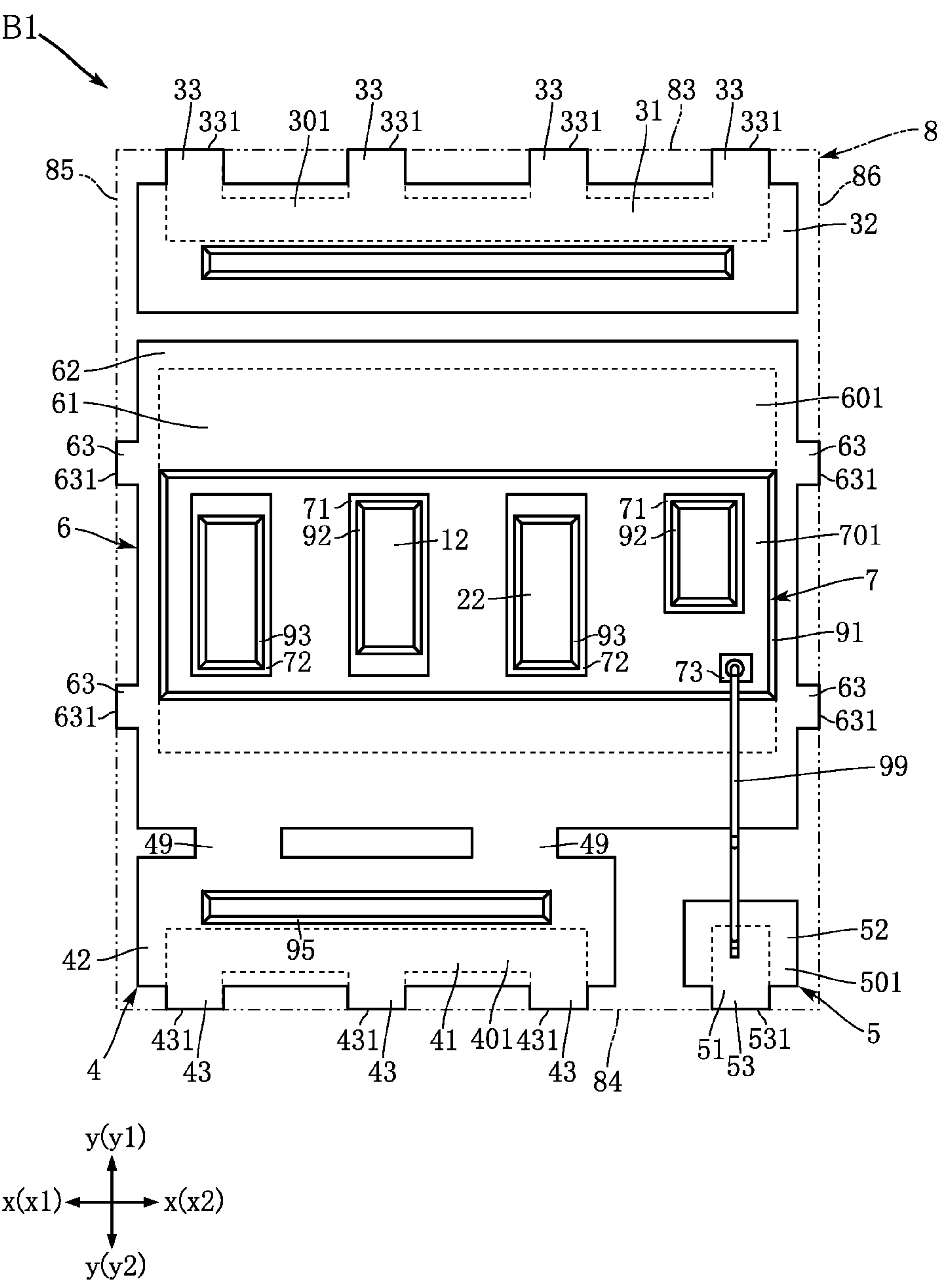
FIG. 50 is a fragmentary plan view similar to FIG. 49 but omitting the first lead and the second lead.

As shown in FIGS. 50 to 52, the third lead 3 is spaced apart from the island lead 6 toward the y1 side in the y direction. The third lead 3 has the center in the x direction that substantially coincides with the center of the island lead 6 in the x direction. As shown in FIGS. 42, 43, 45, 46 and 49 to 52, the third lead 3 has an obverse surface 301, a reverse surface 302, a thick part 31, a thin part 32 and a plurality of extended parts 33.

The obverse surface 301 is on the z1 side in the z direction. In the illustrated example, the obverse surface 301 is a smooth surface perpendicular to the z direction. The third lead 3 may have one or more recesses and/or grooves recessed from the obverse surface 301 as necessary. The first contacting part 15 described above is bonded to the obverse surface 301 via the fourth conductive-bonding part 94. The reverse surface 302 is on the z2 side in the z direction, facing away from the obverse surface 301. In the illustrated example, the reverse surface 302 is a smooth surface perpendicular to the z direction. The reverse surface 302 may be plated with, for example, Ni or Ti as necessary. In this embodiment, the obverse surface 301 has substantially the same position in the z direction as the obverse surface 601, and the reverse surface 302 has substantially the same position in the z direction as the reverse surface 602.

The thick part 31 is a portion where the obverse surface 301 and the reverse surface 302 overlap as viewed in the z direction. In the illustrated example, the thick part 31 as viewed in the z direction has a rectangular shape that is longer in the x direction. Note that the shape of the thick part 31 is not limited to such. The thickness of the thick part 31 in the z direction is equal to the distance between the obverse surface 301 and the reverse surface 302. The thin part 32 is a portion that overlaps with the obverse surface 301 but not with the reverse surface 302 as viewed in the z direction. In the illustrated example, the thin part 32 as viewed in the z direction extends outward from the opposite ends of the thick part 31 in the x direction and also from the end on the y2 side in the y direction. The thin part 32 as viewed in the z direction has a portion extending from the thick part 31 toward the y1 side in the y direction between two extended parts 33 in the x direction. The thickness of the thin part 32 in the z direction is less than the distance between the obverse surface 301 and the reverse surface 302. The thick part 31 and the thin part 32 are not limited to specific thicknesses. In this embodiment, the thick part 31 has substantially the same thickness as the thick part 61, and the thin part 32 has substantially the same thickness as the thin part 62.

The extended parts 33 extend outward from an end of the thick part 31. In the illustrated example, the extended parts 33 extend from the thick part 31 toward the y1 side in the y direction. The number of the extended parts 33 to be provided is not limited, including one or more than one. In the illustrated example, four extended parts 33 are provided. Each extended part 33 has an end face 331. The end face 331 faces away from the thick part 31 in the y direction. In other words, the end face 331 faces outward, which is the y1 side in the y direction. The end face 331 illustrated in the figures is perpendicular to the y direction. The respective end faces 331 have the same position in the y direction.

[Fourth Lead 4]

As shown in FIGS. 42, 49, 50 and 52, the fourth lead 4 is offset from the island lead 6 toward the y2 side in the y direction. The center of the fourth lead 4 in the x direction is offset toward the x1 side from the center of the island lead 6 in the x direction. As shown in FIG. 50, the semiconductor device B1 includes an interconnecting part 49 connecting the fourth lead 4 and the island lead 6. In a different example, the fourth lead 4 may be separated from the island lead 6. As shown in FIGS. 40 to 45, 49, 50 and 52, the fourth lead 4 has an obverse surface 401, a reverse surface 402, a thick part 41, a thin part 42 and a plurality of extended parts 43.

The obverse surface 401 is on the z1 side in the z direction. In the illustrated example, the obverse surface 401 is a smooth surface perpendicular to the z direction. The fourth lead 4 may have one or more recesses and/or grooves recessed from the obverse surface 401 as necessary. The second contacting part 25 described above is bonded to the obverse surface 401 via the fifth conductive-bonding part 95. The reverse surface 402 is on the z2 side in the z direction, facing away from the obverse surface 401. In the illustrated example, the reverse surface 402 is a smooth surface perpendicular to the z direction. The reverse surface 402 may be plated with, for example, Ni or Ti as necessary. In this embodiment, the obverse surface 401 has substantially the same position in the z direction as the obverse surface 601, and the reverse surface 402 has substantially the same position in the z direction as the reverse surface 602.

The thick part 41 is a portion where the obverse surface 401 and the reverse surface 402 overlap as viewed in the z direction. In the illustrated example, the thick part 41 as viewed in the z direction has a rectangular shape that is longer in the x direction. Note that the shape of the thick part 41 is not limited to such. The thickness of the thick part 41 in the z direction is equal to the distance between the obverse surface 401 and the reverse surface 402. In this embodiment, the thick part 41 has a smaller x-direction dimension than the thick part 31. The thin part 42 is a portion that overlaps with the obverse surface 401 but not with the reverse surface 402 as viewed in the z direction. In the illustrated example, the thin part 42 as viewed in the z direction extends outward from the opposite ends of the thick part 41 in the x direction and also from the end on the y1 side in the y direction. The thin part 42 as viewed in the z direction has a portion extending from the thick part 41 toward the y2 side in the y direction between two extended parts 43 in the x direction. The thickness of the thin part 42 in the z direction is less than the distance between the obverse surface 401 and the reverse surface 402. The thick part 41 and the thin part 42 are not limited to specific thicknesses. In this embodiment, the thick part 41 has substantially the same thickness as the thick part 61, and the thin part 42 has substantially the same thickness as the thin part 62.

The extended parts 43 extend outward from an end of the thick part 41. In the illustrated example, the extended parts 43 extend from the thick part 41 toward the y2 side in the y direction. The number of the extended parts 43 to be provided is not limited, including one or more than one. In the illustrated example, three extended parts 43 are provided. The three extended parts 43 have substantially the same position in the x direction as the three extended part 33 provided on the x1 side. Each extended part 43 has an end face 431. The end face 431 faces away from the thick part 41 in the y direction. In other words, the end face 431 faces outward, which is the y1 side in the y direction. The respective end faces 431 illustrated in the figures are perpendicular to the y direction. The end faces 431 have substantially the same position in the y direction. Also, the end faces 431 have the same position in the y direction as fourth the end face 241.

[Fifth Lead 5]

As shown in FIGS. 42, 43, 45 and 49 and 51, the fifth lead 5 is offset from the island lead 6 toward the y2 side in the y direction. The center of the fifth lead 5 in the x direction is offset toward the x2 side from the center of the island lead 6 in the x direction. The fifth lead 5 is offset from the fourth lead 4 toward the x2 side in the x direction. As shown in FIGS. 40 to 45 and 49 to 51, the fifth lead 5 has an obverse surface 501, a reverse surface 502, a thick part 51, a thin part 52 and an extended part 53.

The obverse surface 501 is on the z1 side in the z direction. In the illustrated example, the obverse surface 501 is a smooth surface perpendicular to the z direction. The fifth lead 5 may have one or more recesses and/or grooves recessed from the obverse surface 501 as necessary. The wire 99 is bonded to the obverse surface 501. The reverse surface 502 is on the z2 side in the z direction, facing away from the obverse surface 501. In the illustrated example, the reverse surface 502 is a smooth surface perpendicular to the z direction. The reverse surface 502 may be plated with, for example, Ni or Ti as necessary. In this embodiment, the obverse surface 501 has substantially the same position in the z direction as the obverse surface 601, and the reverse surface 502 has substantially the same position in the z direction as the reverse surface 602.

The thick part 51 is a portion where the obverse surface 501 and the reverse surface 502 overlap as viewed in the z direction. In the illustrated example, the thick part 51 has a rectangular shape as viewed in the z direction. Note that the shape of the thick part 51 is not limited to such. The thickness of the thick part 51 in the z direction is equal to the distance between the obverse surface 501 and the reverse surface 502. In this embodiment, the thick part 51 has a smaller x-direction dimension than the thick part 31 and the thick part 41. The thin part 32 is a portion that overlaps with the obverse surface 301 but not with the reverse surface 302 as viewed in the z direction. In the illustrated example, the thin part 32 as viewed in the z direction extends outward from the opposite ends of the thick part 51 in the x direction and also from the end on the y1 side in the y direction. The thickness of the thin part 52 in the z direction is less than the distance between the obverse surface 501 and the reverse surface 502. The thick part 51 and the thin part 52 are not limited to specific thicknesses. In this embodiment, the thick part 51 has substantially the same thickness as the thick part 61, and the thin part 52 has substantially the same thickness as the thin part 62.

The extended part 53 extends outward from an end of the thick part 51. In the illustrated example, the extended part 53 extends from the thick part 51 toward the y2 side in the y direction. The number of the extended parts 53 to be provided is not limited, including one or more than one. In the illustrated example, one extended part 53 is provided. The extended part 53 has substantially the same position in the x direction as the outermost one of the extended parts 33 on the x2 side. The extended part 53 has an end face 531. The end face 531 faces away from the thick part 51 in the y direction. In other words, the end face 531 faces outward, which is the y2 side in the y direction. The end face 531 illustrated in the figures is perpendicular to the y direction. Also, the end face 531 have the same position in the y direction as the fourth end face 241 and the end faces 431.

[Semiconductor Element 7]

The semiconductor element 7 is a component performing the electrical functions of the semiconductor device B1. The specific configuration of the semiconductor element 7 is not specifically limited. In this embodiment, the semiconductor element 7 is a transistor fabricated using a nitride semiconductor and, more specifically, is a GaN-based HEMT. The material of the semiconductor element 7 is not limited to a nitride semiconductor, and other semiconductor materials such as silicon (Si) and a silicon carbide (SiC) may be useable. In addition, the semiconductor element 7 is not limited to a HEMT and may be fabricated as a different type of transistor, such as a metal-oxide-semiconductor field effect transistor (MOSFET) or an insulated gate bipolar transistor (IGBT). The semiconductor element 7 is mounted on the thick part 61 of the island lead 6. As shown in FIGS. 42, 49 and 51 to 53, the semiconductor element 7 includes an element body 70, a first electrode 71, a second electrode 72 and a third electrode 73.

Figure 53:
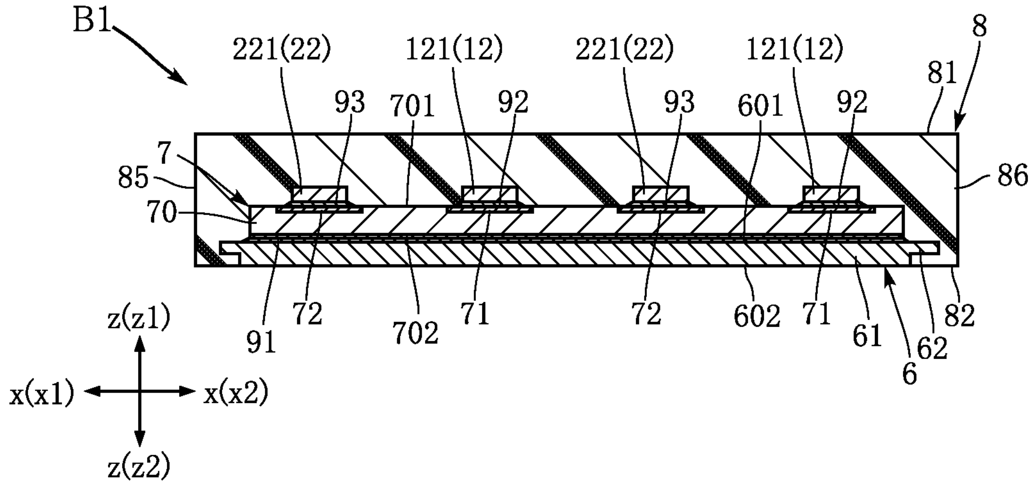
FIG. 53 is a sectional view taken along line LIII-LIII of FIG. 49.

The element body 70 is a laminate of layers, such as a substrate layer, a buffer layer and a nitride layer (the layers not illustrated). The element body 70 has an element obverse surface 701 and an element reverse surface 702. The element obverse surface 701 is on the z1 side in the z direction. The element reverse surface 702 is on the z2 side in the z direction, facing away from the element obverse surface 701. In the illustrated example, the element reverse surface 702 is provided with a metal layer. As shown in FIGS. 51 to 53, the metal layer is bonded to the obverse surface 601 of the island lead 6 via a first conductive-bonding part 91. The first conductive-bonding part 91 may be made of solder, Ag paste, sintered Ag or sintered Cu, for example. The metal layer is provided for bonding by the first conductive-bonding part 91 but this metal layer may be omitted. In a different example, the metal layer may be configured to be at the same potential as e.g. the second electrode 72. In the illustrated example, the semiconductor element 7 as viewed in the z direction overlaps with a portion of the thick part 61 and a portion of the thin part 62 of the island lead 6.

The first electrode 71, the second electrode 72 and the third electrode 73 are disposed on the element obverse surface 701. In this embodiment, a plurality of first electrodes 71 and a plurality of second electrodes 72 are provided. The number of the first electrodes 71 and the second electrodes 72 to be provided are not specifically limited. In the illustrated example, two first electrodes 71 and two second electrodes 72 are provided. That is, as many first electrodes 71 are provided as the first prongs 12 described above, and as many second electrodes 72 are provided as the second prongs 22 described above. Each first electrode 71 serves as a drain electrode. Each second electrode 72 serves as a source electrode. The first electrodes 71 and the second electrodes 72 are alternately arranged in the x direction. In the illustrated example, the first electrodes 71 and the second electrodes 72 have a rectangular shape elongated in the y direction, without being limited to a specific shape.

As shown in FIGS. 51 and 53, the first electrodes 71 are electrically bonded to the tips 121 of the first prongs 12 of the first lead 1 via a second conductive-bonding part 92. The second conductive-bonding part 92 may be made of solder, Ag paste, sintered Ag or sintered Cu, for example. As shown in FIGS. 52 and 53, the second electrodes 72 are electrically bonded to the tips 221 of the second prongs 22 of the second lead 2 via a third conductive-bonding part 93. The third conductive-bonding part 93 may be made of solder, Ag paste, sintered Ag or sintered Cu, for example.

The third electrode 73 serves as a gate electrode. The number of the third electrode 73 to be provided is not limited, including one or more than one. In the illustrated example, one third electrode 73 is provided. The third electrode 73 is disposed on one of the four corners of the element obverse surface 701. In the illustrated example, the third electrode 73 is disposed near the corner of the element obverse surface 701 where the edges on the x2 side and the y2 side meet. The third electrode 73 is disposed on the y2 side in the y direction relative to one of the first electrodes 71 that is located on the x2 side in the x direction. The wire 99 is bonded to the third electrode 73 to electrically connect the third electrode 73 to the fifth lead 5. Instead of the wire 99, a conducting member made from a metal sheet may be used to electrically connect the third electrode 73 and the fifth lead 5.

[Sealing Resin 8]

The sealing resin 8 covers a portion of each of the leads 1 to 6, the semiconductor element 7 and the wire 99 and may be made of an insulating material such as epoxy resin. As shown in FIGS. 40, 41, 44 to 53, the sealing resin 8 of this embodiment has the shape of a rectangular parallelepiped with a first face 81, a second face 82, a third face 83, a fourth face 84, a fifth face 85 and a sixth face 86.

The first face 81 is on the z1 side in the z direction. In the illustrated example, the first face 81 is a flat surface perpendicular to the z direction. The second face 82 is on the z2 side in the z direction. In the illustrated example, the second face 82 is a flat surface perpendicular to the z direction. The third face 83 is on the y1 side in the y direction. In the illustrated example, the third face 83 is a flat surface perpendicular to the y direction. The fourth face 84 is on the y2 side in the y direction. In the illustrated example, the fourth face 84 is a flat surface perpendicular to the y direction. The fifth face 85 is on the x1 side in the x direction. In the illustrated example, the fifth face 85 is a flat surface perpendicular to the x direction. The sixth face 86 is on the x2 side in the x direction. In the illustrated example, the sixth face 86 is a flat surface perpendicular to the x direction.

Figure 45:
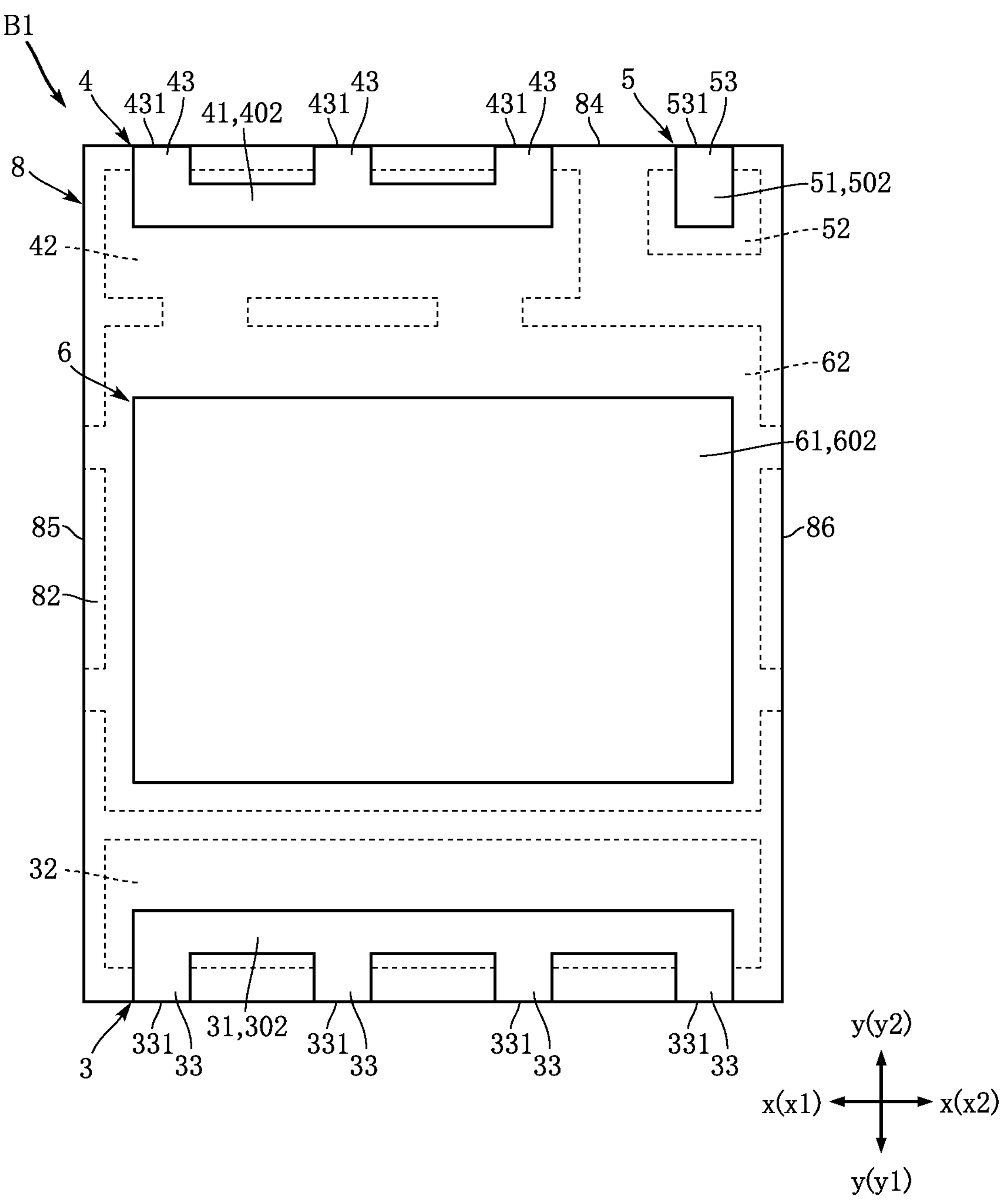
FIG. 45 is a bottom view of the semiconductor device according to the third embodiment of the present disclosure.

As shown in FIG. 45, the second face 82 exposes the reverse surfaces 602, 302, 402 and 502 respectively of the island lead 6, the third lead 3, the fourth lead 4 and the fifth lead 5 toward the z2 side in the z direction. The second face 82 is flush with the reverse surfaces 602, 302, 402 and 502 respectively of the island lead 6, the third lead 3, the fourth lead 4 and the fifth lead 5. It may be acceptable that all or any of the reverse surfaces 602, 302, 402 and 502 respectively of the island lead 6, the third lead 3, the fourth lead 4 and the fifth lead 5 protrudes slightly from the second face 82.

As shown in FIGS. 46, 49 and 50, the third face 83 exposes the end faces 331 of the third lead 3 toward the y1 side in the y direction. The third face 83 is flush with the end faces 331 of the third lead 3. It may be acceptable that all or any of the end faces 331 protrudes slightly from the third face 83.

Figure 44:
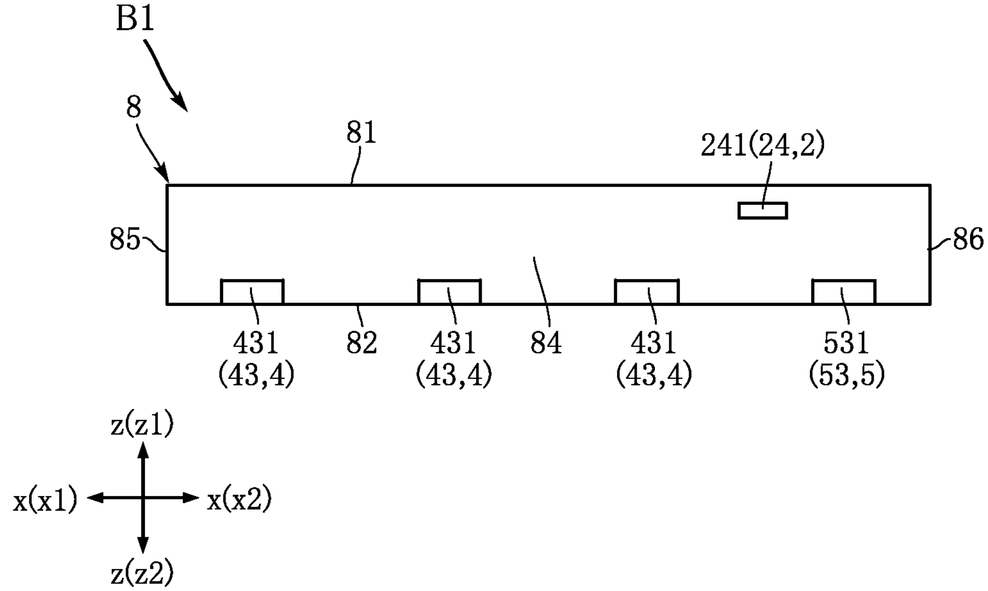
FIG. 44 is a front view of the semiconductor device according to the third embodiment of the present disclosure.

As shown in FIGS. 44, 49 and 50, the fourth face 84 exposes the fourth end face 241 of the second lead 2, the end faces 431 of the fourth lead 4 and the end face 531 of the fifth lead 5 toward the y2 side in the y direction. The fourth face 84 is flush with the fourth end face 241 of the second lead 2, the end faces 431 of the fourth lead 4 and the end face 531 of the fifth lead 5. It may be acceptable that all or any of the fourth end face 241 of the second lead 2, the end faces 431 of the fourth lead 4 and the end face 531 of the fifth lead 5 protrudes slightly from the fourth face 84.

As shown in FIGS. 47, 49 and 50, the fifth face 85 exposes the first end face 131 of the first lead 1, the second end face 231 of the second lead 2 and the end faces 631 of the island lead 6 toward the x1 side in the x direction. The fifth face 85 is flush with the first end face 131 of the first lead 1, the second end face 231 of the second lead 2 and the end faces 631 of the island lead 6. It may be acceptable that all or any of the first end face 131 of the first lead 1, the second end face 231 of the second lead 2 and the end faces 631 of the island lead 6 protrudes slightly from the fifth face 85.

As shown in FIGS. 48, 49 and 50, the sixth face 86 exposes the third end face 141 of the first lead 1 and the end faces 631 of the island lead 6 toward the x2 side in the x direction. The sixth face 86 is flush with the third end face 141 of the first lead 1 and the end faces 631 of the island lead 6. It may be acceptable that all or any of the third end face 141 of the first lead 1 and the end faces 631 of the island lead 6 protrudes slightly from the sixth face 86.

The following describes an example of a method for manufacturing a semiconductor device B1, with reference to FIGS. 54 to 64.

Figure 54:
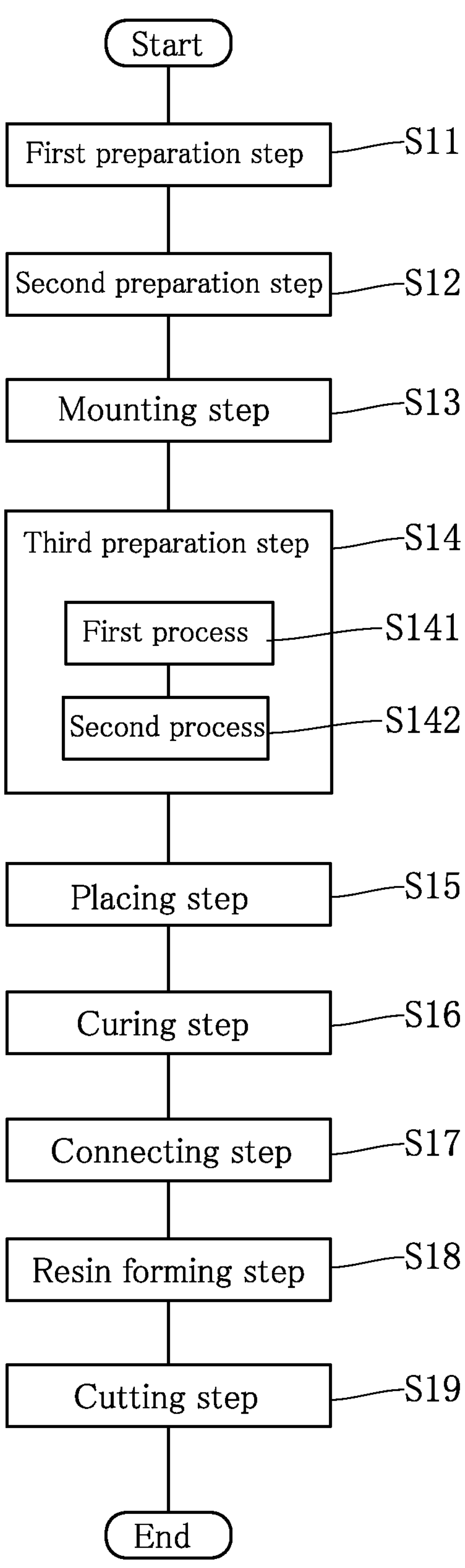
FIG. 54 is a flowchart of a method for manufacturing a semiconductor device according to the third embodiment of the present disclosure.

As shown in FIG. 54, the manufacturing method of this this embodiment includes a first preparation step S11, a second preparation step S12, a mounting step S13, a third preparation step S14, a placing step S15, a curing step S16, a connecting step S17, a resin forming step S18 and a cutting step S19.

[First Preparation Step S11]

Figure 55:
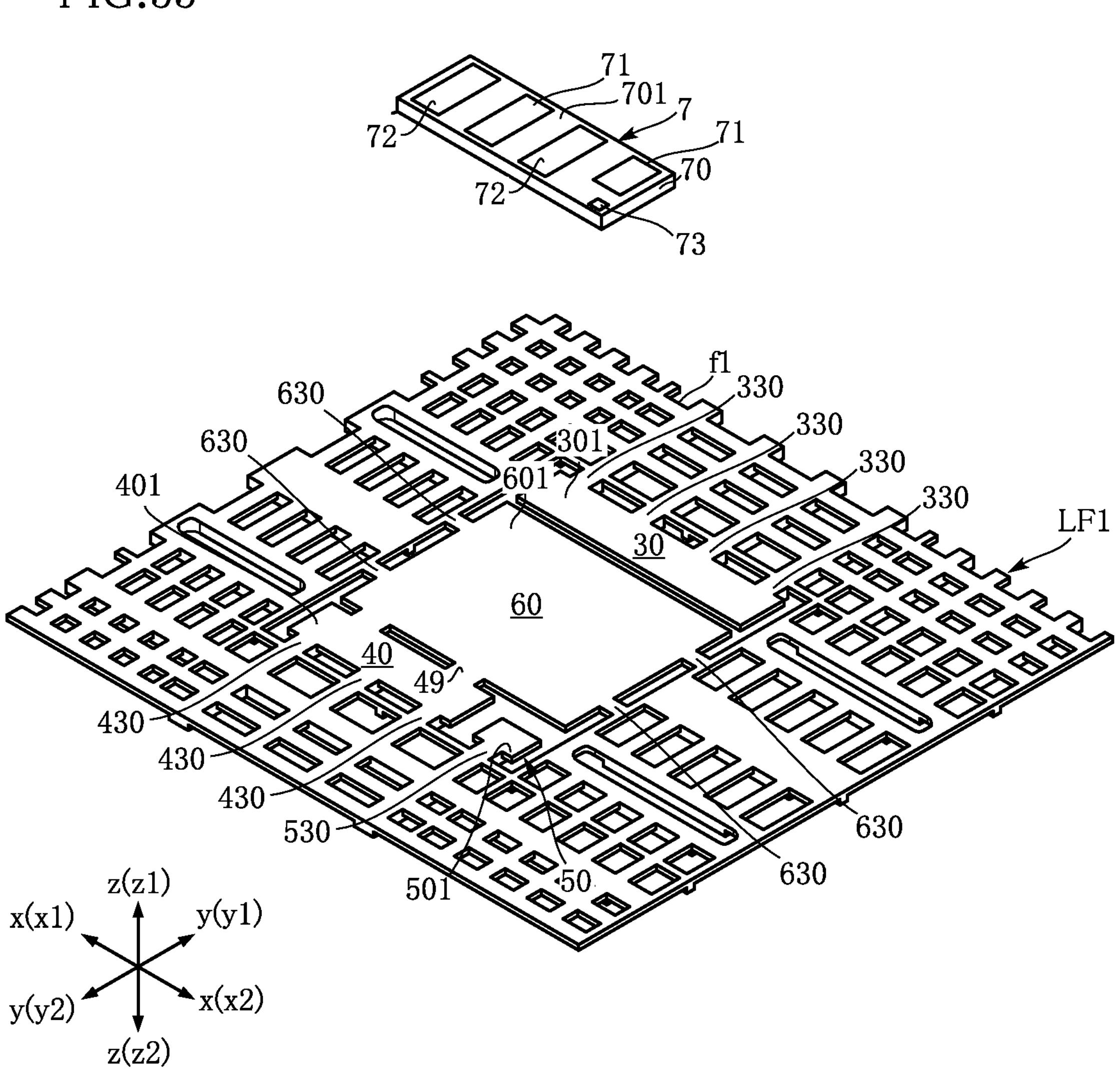
FIG. 55 is a perspective view illustrating a step of the method for manufacturing a semiconductor device according to the third embodiment of the present disclosure.

First, a first leadframe LF1 as shown in FIG. 55 is prepared. The first leadframe LF1 includes a frame part f1, a third part 30, a fourth part 40, a fifth part 50 and an island part 60. The frame part f1 is a portion extending in the x and y directions, surrounding the third part 30, the fourth part 40, the fifth part 50 and the island part 60.

The third part 30 is a portion for forming the thick part 31 and the thin part 32 of the third lead 3 of the semiconductor device B1 described above. The third part 30 is connected to the frame part f1 by a plurality of connecting parts 330. The fourth part 40 is a portion for forming the thick part 41 and the thin part 42 of the fourth lead 4 of the semiconductor device B1 described above. The fourth part 40 is connected to the frame part f1 by a plurality of connecting parts 430. The fifth part 50 is a portion for forming the thick part 51 and the thin part 52 of the fifth lead 5 of the semiconductor device B1 described above. The fifth part 50 is connected to the frame part f1 by a plurality of connecting parts 530. The island part 60 is a portion for forming the thick part 61 and the thin part 62 of the semiconductor device B1 described above. The island part 60 is connected to the frame part f1 by a plurality of connecting parts 630. In the first leadframe LF1, the obverse surfaces 301, 401, 501 and 601 are flush with each other. Similarly, the reverse surfaces 302, 402, 502 and 602 are flush with each other.

[Second Preparation Step S12]

Next, a semiconductor element 7 as shown in FIG. 55 is prepared. The semiconductor element 7 has the configuration as described above regarding the semiconductor device B1. The order in which the first preparation step S11 and the second preparation step S12 are performed is not specifically limited.

[Mounting Step S13]

Figure 56:
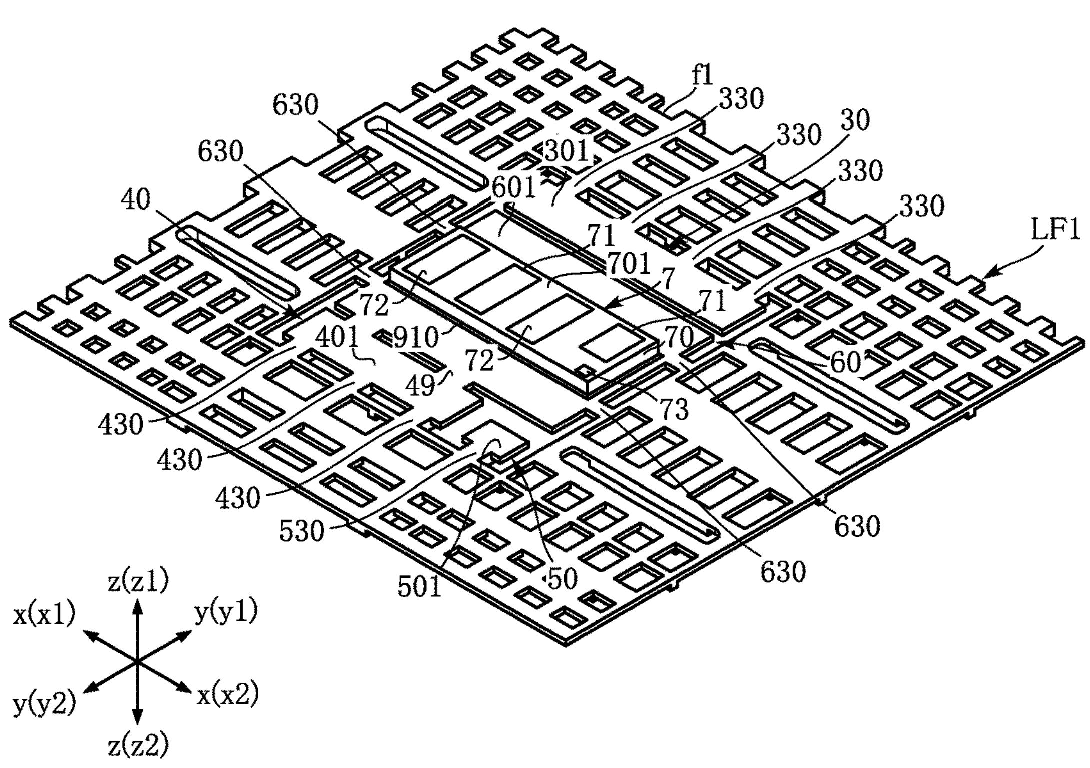
FIG. 56 is a perspective view illustrating a step of the method for manufacturing a semiconductor device according to the third embodiment of the present disclosure.

Next, as shown in FIG. 56, the semiconductor element 7 is mounted on the island part 60. In the mounting step S13, a first conductive paste 910 is interposed between the element reverse surface 702 of the semiconductor element 7 and the obverse surface 601 of the island part 60. The first conductive paste 910 may be a solder paste, for example.

[Third Preparation Step S14]

Figure 57:
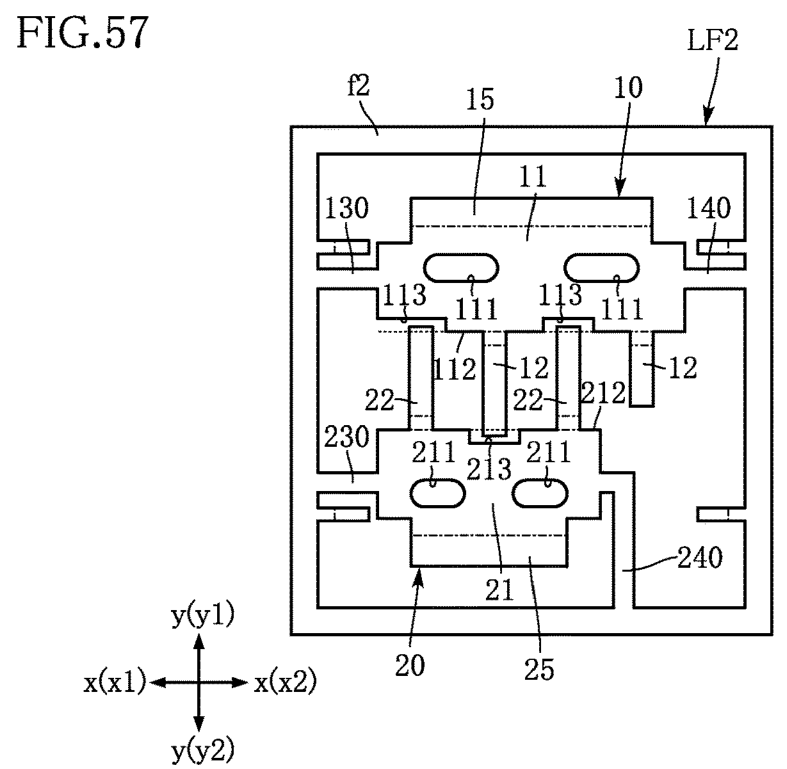
FIG. 57 is a plan view illustrating a step of the method for manufacturing a semiconductor device according to the third embodiment of the present disclosure.
Figure 58:
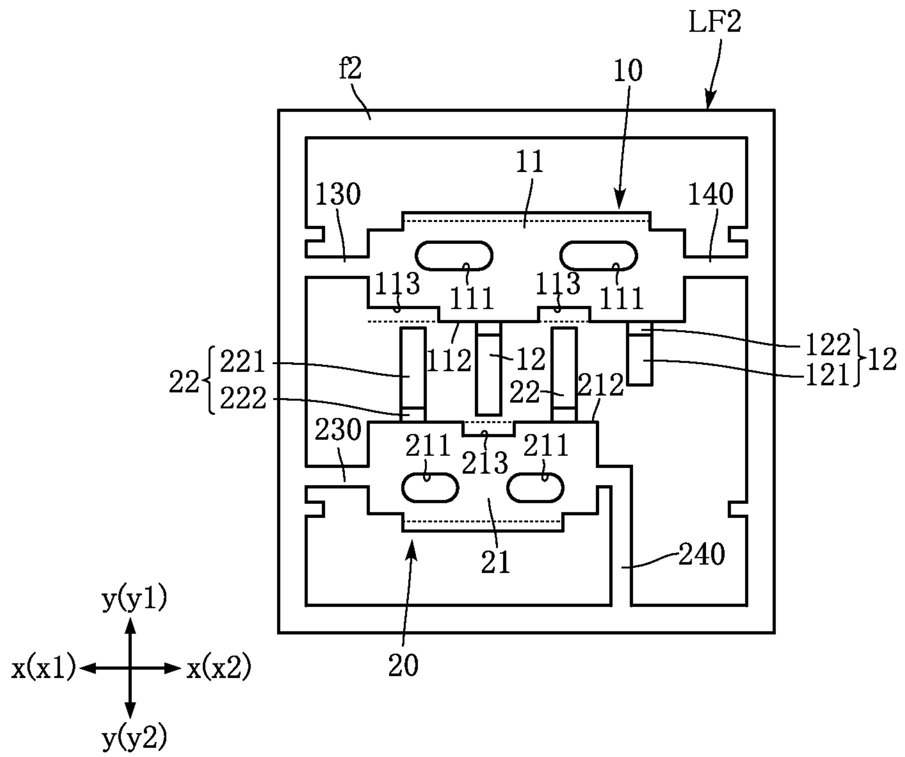
FIG. 58 is a plan view illustrating a step of the method for manufacturing a semiconductor device according to the third embodiment of the present disclosure.
Figure 59:
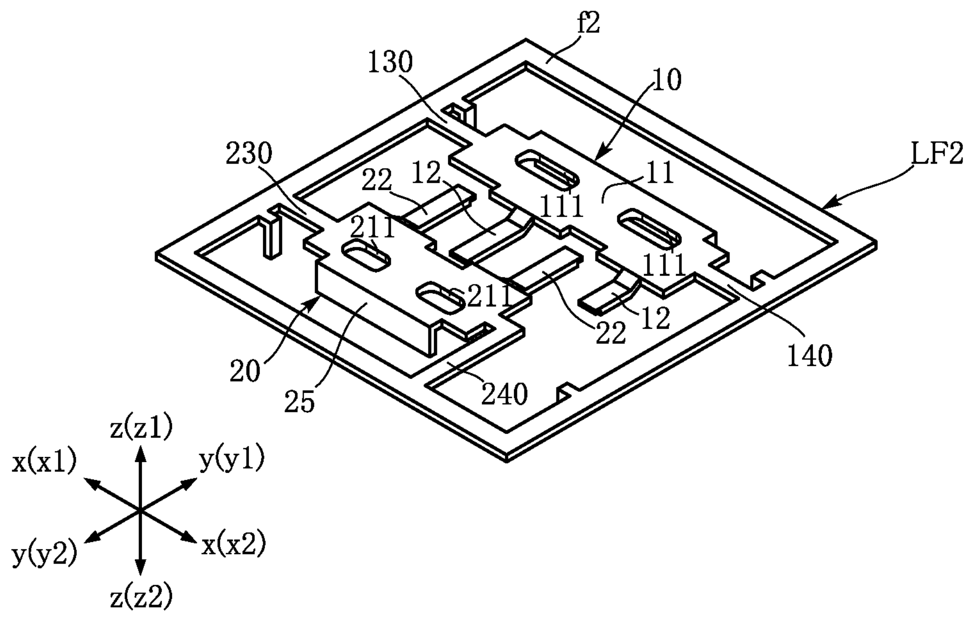
FIG. 59 is a perspective view illustrating a step of the method for manufacturing a semiconductor device according to the third embodiment of the present disclosure.

Next, the second leadframe LF2 is placed as shown in FIGS. 57 to 59. The second leadframe LF2 includes a frame part f2, a first part 10 and a second part 20. The frame part f2 is a portion surrounding the first part 10 and the second part 20. As shown in FIG. 54, the third preparation step S14 includes a first process S141 and a second process S142.

The first process S141 includes preparing a metal sheet, and applying a stamping operation to the metal sheet to form the second leadframe LF2 shown in FIG. 57. The first process S141 involves forming recesses on the first edge 112 (the edge closer to the second main part 21 in the y direction) of the first main part 11, thereby forming the first recessed edges 113 on the first edge 112 of the first main part 11. The first process S141 also involves forming a recess on the second edge 212 (the edge closer to the first main part 11 in the y direction) of the second main part 21, thereby forming the second recessed edge 213 on the second edge 212 of the second main part 21.

The second leadframe LF2 as processed in the first process S141 has the first prongs 12 and the second prongs 22 without bends, extending flat in the xy plane. As shown in FIG. 57, one of the two first prongs 12 (the one located between the two second prongs 22) extends from the first edge 112 to the recessed region (the first recessed edge 113) of the second main part 21. Similarly, the two second prongs 22 extend from the second edge 212 to the recessed regions (the second recessed edges 213) of the first main part 11. The second leadframe LF2 as processed in the first process S141 also has the first contacting part 15 extending from the first main part 11 toward the y1 side in the y direction, and the second contacting part 25 extending from the second main part 21 toward the y2 in the y direction.

The second process S142 involves a bending operation on the second leadframe LF2 as processed in the first process S141 (the second leadframe LF2 shown in FIG. 57) to form the geometry of the second leadframe LF2 shown in FIGS. 58 and 59. For example, the second process S142 involves making a bend along a dot-dash line shown in FIG. 57, toward the z2 side in the z direction. Thus, the second process S142, the first prongs 12, the first contacting part 15, the second prongs 22 and the second contacting part 25 after the second process have the configurations described above regarding the semiconductor device B1. As for the first part 10, the tips 121 of the first prongs 12 are offset from the first main part 11 toward the z2 side, and the first contacting part 15 extends from the first main part 11 toward the z2 side in the z direction. As for the second part 20, the tips 221 of the second prongs 22 are offset from the second main part 21 toward the z2 side in the z direction, and the second contacting part 25 extends from the second main part 21 toward the z2 side in the z direction.

[Placing Step S15]

Figure 60:
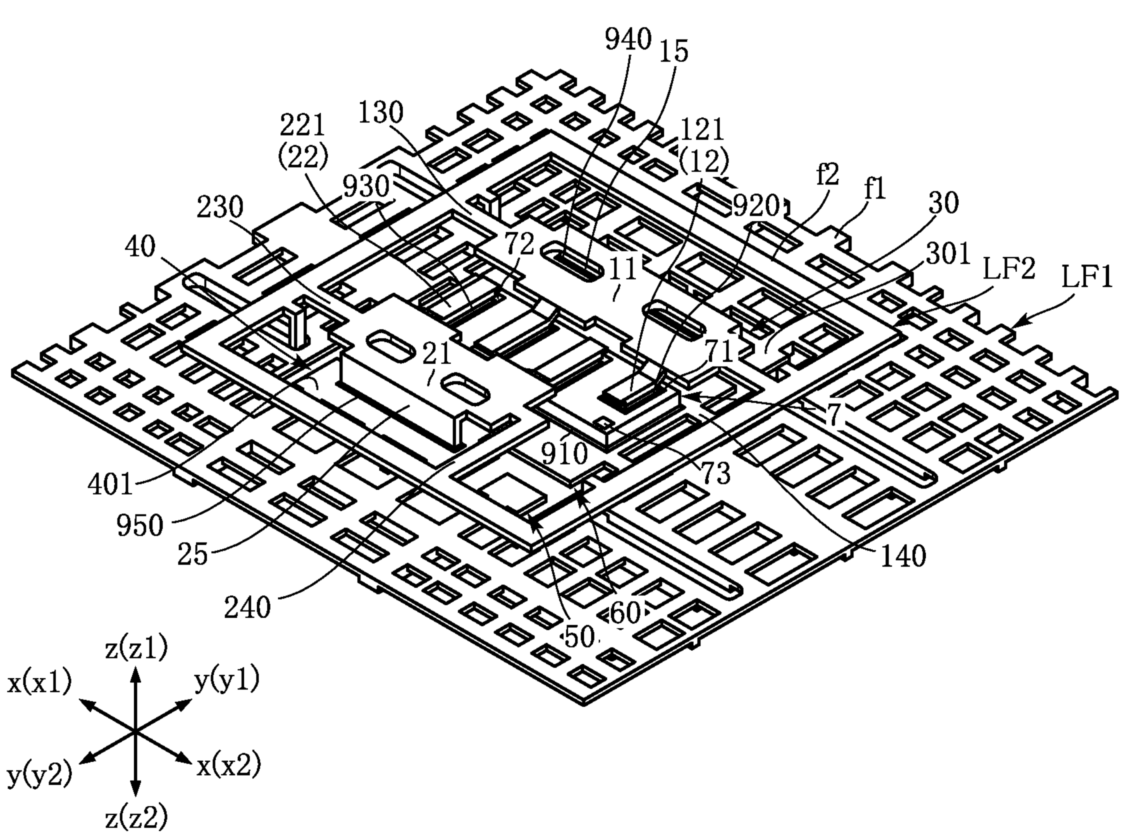
FIG. 60 is a perspective view illustrating a step of the method for manufacturing a semiconductor device according to the third embodiment of the present disclosure.
Figure 61:
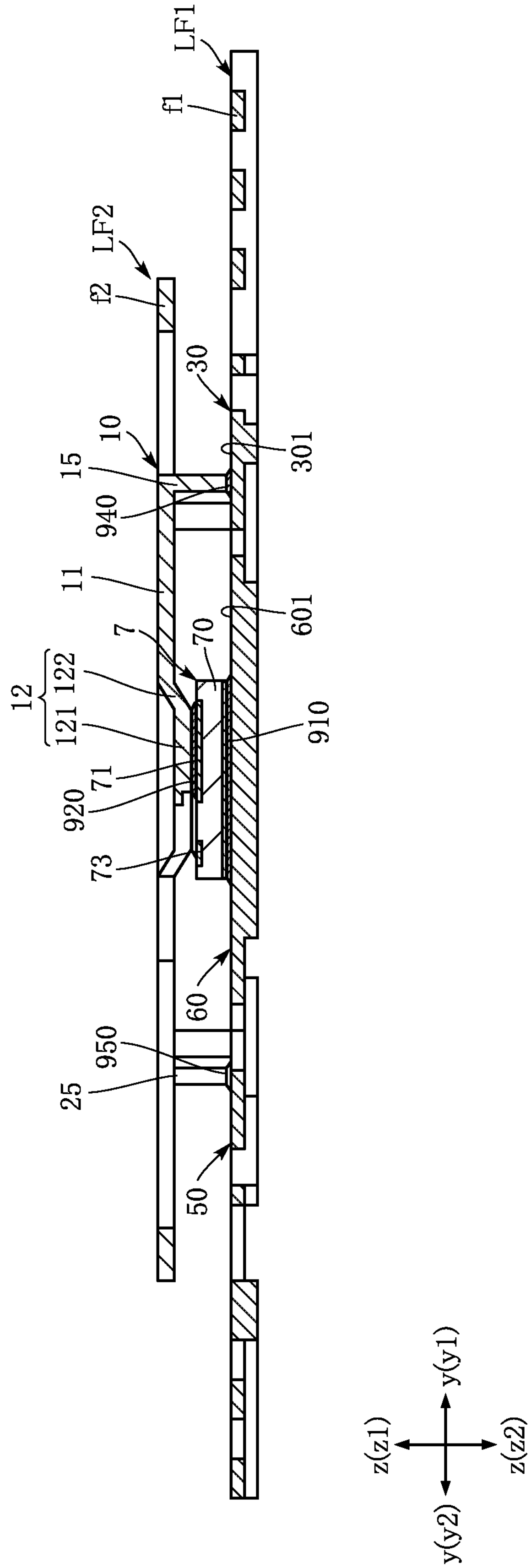
FIG. 61 is a sectional view illustrating a step of the method for manufacturing a semiconductor device according to the third embodiment of the present disclosure.
Figure 62:
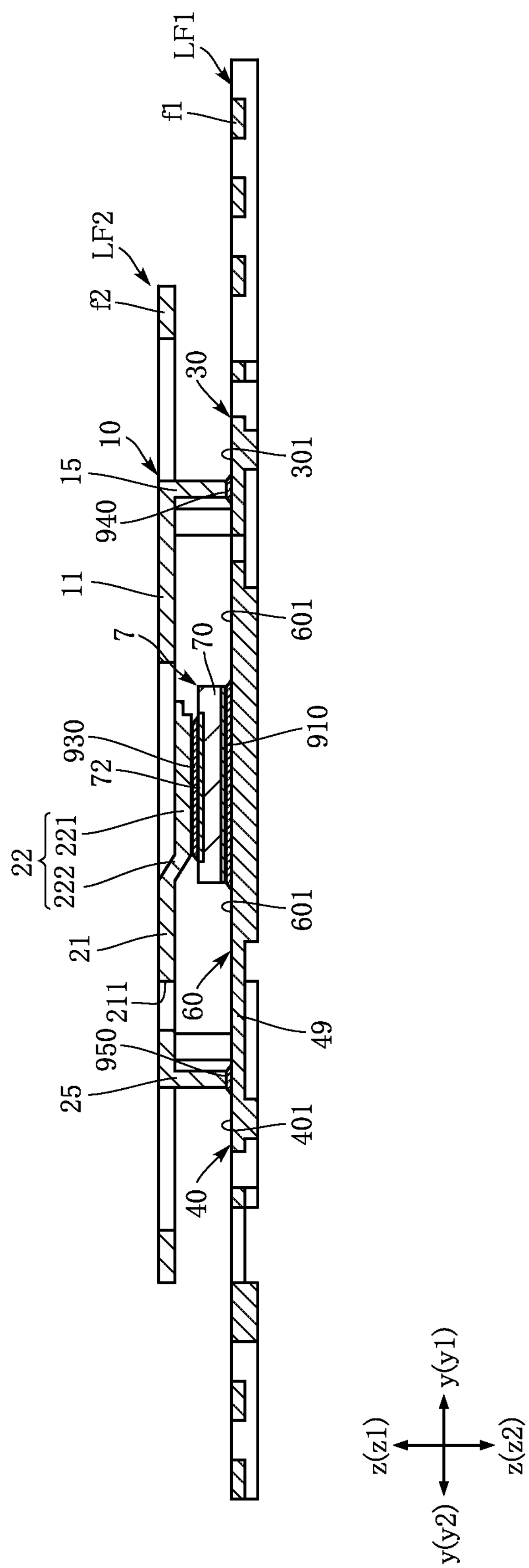
FIG. 62 is a sectional view illustrating a step of the method for manufacturing a semiconductor device according to the third embodiment of the present disclosure.

Next, the second leadframe LF2 is placed as shown in FIGS. 60 to 62. FIG. 61 shows a section taken along the yz plane intersecting a first prong 12. FIG. 62 shows a section taken along the yz plane that intersecting a second prong 22. In the placing step S15, the second conductive paste 920 is interposed between the tip 121 of each first prong 12 of the first part 10 and a corresponding first electrode 71 of the semiconductor element 7. In addition, the third conductive paste 930 is interposed between the tip 221 of each second prong 22 of the second part 20 and a corresponding second electrode 72 of the semiconductor element 7. The second conductive paste 920 and the third conductive paste 930 may be a solder paste, for example. In addition, a fourth conductive paste 940 is interposed between the obverse surface 301 of the third part 30 and the end of the first contacting part 15 of the first part 10 on the z2 side in the z direction. In addition, a fifth conductive paste 950 is interposed between the obverse surface 401 of the fourth part 40 and the end of the second contacting part 25 of the second part 20 on the z2 side in the z direction. The fourth conductive paste 940 and the fifth conductive paste 950 may be a solder paste, for example.

[Curing Step S16]

The next step is to cure the first conductive paste 910, the second conductive paste 920, the third conductive paste 930, the fourth conductive paste 940 and the fifth conductive paste 950. The curing is performed after the placing step S15 and by heating the first leadframe LF1, the second leadframe LF2 and the semiconductor element 7 in a reflow furnace to a predetermined temperature, followed by cooling. The respective pastes 910, 920, 930, 940 and 950 cured in this way form the first conductive-bonding part 91, the second conductive-bonding part 92, the third conductive-bonding part 93, the fourth conductive-bonding part 94 and the fifth conductive-bonding part 95 of the semiconductor device B1 described above. Then, the first leadframe LF1, the second leadframe LF2 and the semiconductor element 7 are electrically connected to each other by bonding appropriate portions. The curing step S16 of this embodiment simultaneously cures the first conductive paste 910, the second conductive paste 920, the third conductive paste 930, the fourth conductive paste 940 and the fifth conductive paste 950. In a different example, the first conductive paste 910 may be cured after the semiconductor element 7 is mounted and before the other pastes are cured.

[Connecting Step S17]

Figure 63:
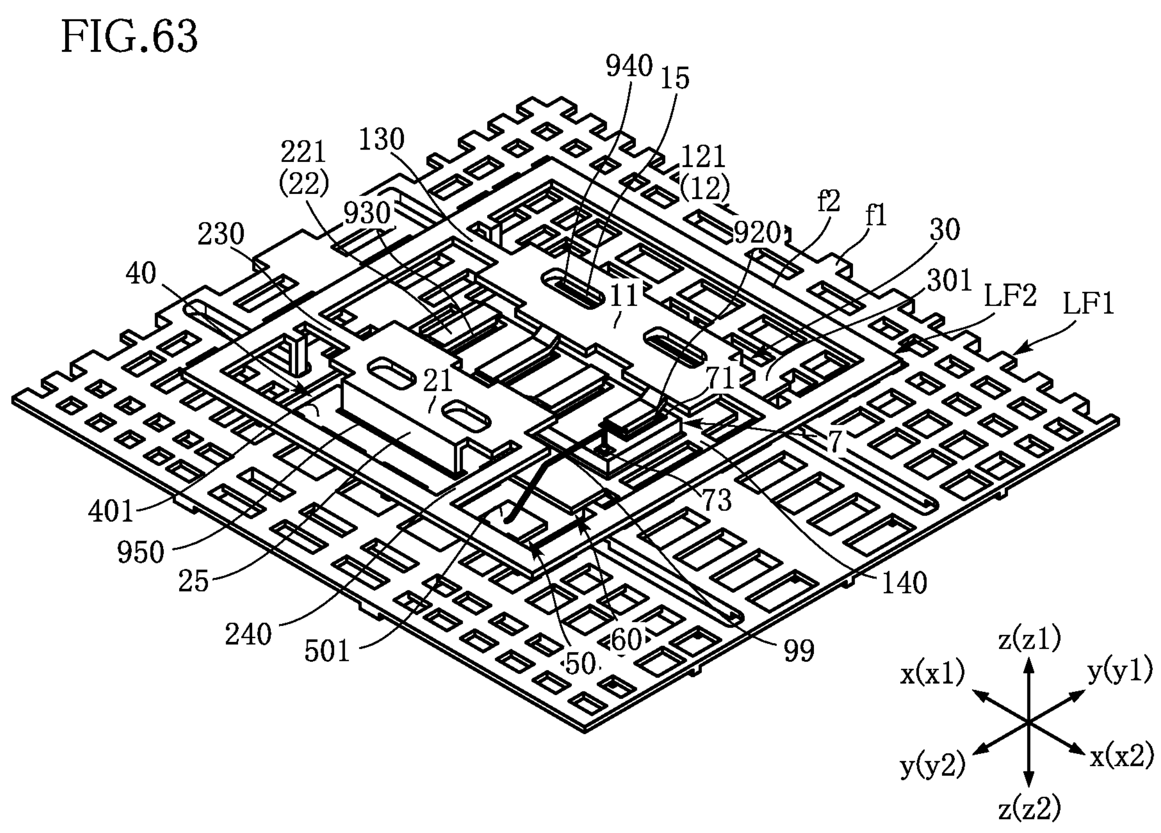
FIG. 63 is a perspective view illustrating a step of the method for manufacturing a semiconductor device according to the third embodiment of the present disclosure.

Next, as shown in FIG. 63, a wire 99 is bonded to the third electrode 73 and the obverse surface 501 of the fifth lead 5 to electrically connect the third electrode 73 and the fifth lead 5. Instead of the wire 99, a conducting member made from a metal plate may be used to electrically connect the third electrode 73 and the obverse surface 501.

[Resin Forming Step S18]

Figure 64:
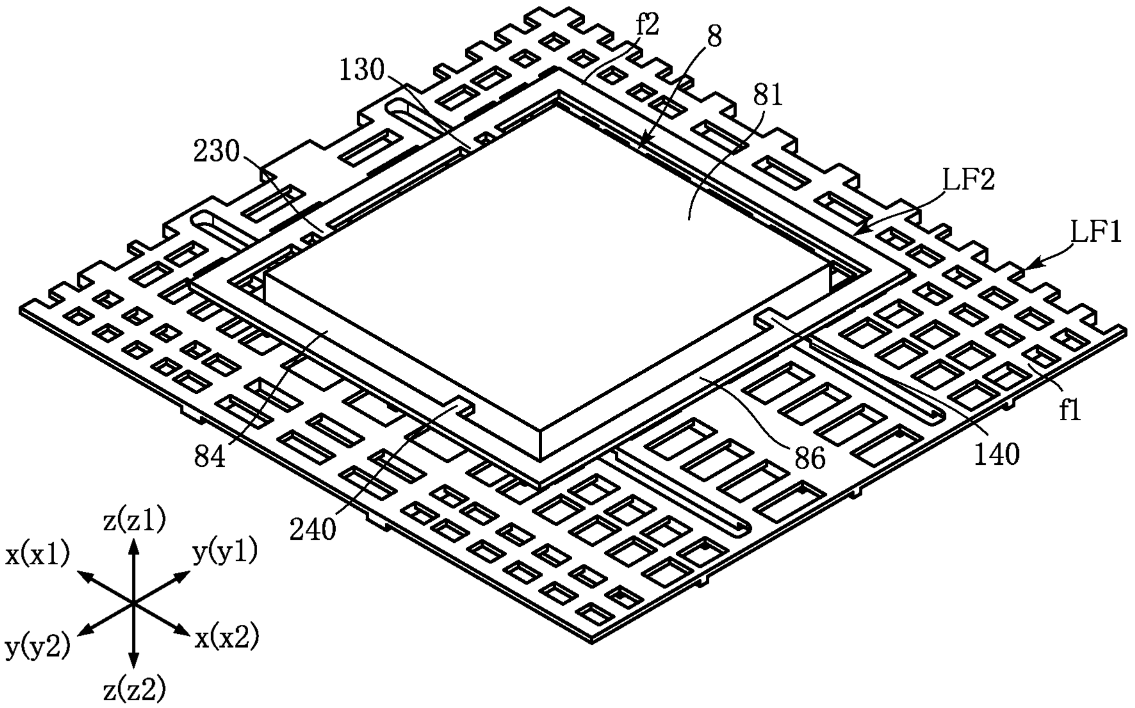
FIG. 64 is a perspective view illustrating a step of the method for manufacturing a semiconductor device according to the third embodiment of the present disclosure.

Next, a sealing resin 8 is formed as shown in FIG. 64 to encapsulate a portion of the first leadframe LF1, a portion of the second leadframe LF2 and the semiconductor element 7 and the wire 99. The resin forming step S18 may involves molding of a resin.

[Cutting Step S19]

Then, the first connecting part 130, the third connecting part 140, the second connecting part 230, the fourth connecting part 240 and the connecting parts 330, 430, 530 and 630 are cut off outside the sealing resin 8. As a result, portions of the first connecting part 130, the third connecting part 140, the second connecting part 230, the fourth connecting part 240 and the connecting parts 330, 430, 530 and 630 are left within the sealing resin 8, and these remaining portions form the first extended part 13, the third extended part 14, the second extended part 23, the fourth extended part 24 and the extended parts 33, 43, 53 and 63 described above. In addition, the cut surfaces of the respective connecting parts provide the first end face 131, the third end face 141, the second end face 231, the fourth end face 241 and the end faces 331, 431, 531 and 631.

Through the above steps, the semiconductor device B1 is obtained.

Next, the following describes advantages of the semiconductor device B1 and the method for manufacturing the semiconductor device B1.

The method for manufacturing the semiconductor device B1 employs the second leadframe LF2 as shown in FIGS. 58 and 59, where the first part 10 and the second part 20 are connected to the frame part f2 respectively by the first connecting part 130 and the second connecting part 230. This can prevent undesirable displacement of the first part 10 and the second part 20 when the first conductive paste 910, the second conductive paste 920 and the third conductive paste 930 are in the molten state in the placing step S15 and the subsequent curing step S16 shown in FIG. 60. The present embodiment can therefore enable more precise placement of the conducting members, namely the first lead 1 (the first part 10) and the second lead 2 (the second part 20).

The first main part 11 of the semiconductor device B1 is provided with a first recessed edge 113 recessed from the first edge 112. The first recessed edge 113 may be formed in the first process S141 of the third preparation step S14, for example. The second leadframe LF2 as processed in the first process S141 has a second prong 22 extending to the recess formed by the first recessed edge 113. The presence of a first recessed edge 113 permits the second prong 22 to be longer (in the y direction) than without. The tip 221 of such a second prong 22 has a larger area that can be bonded to a second electrode 72. The present embodiment can therefore ensure better electric connection between the second lead 2 and the second electrode 72. In the manufacturing method of the semiconductor device B1, in addition, the resin injected in the resin forming step S18 can flow through the recess formed by the first recessed edge 113 to reach the region below the first main part 11. This promotes the resin flow into the region covered by the first main part 11. In this way, the present embodiment can secure the path for the resin to flow into the region below the first main part 11, thereby avoiding the formation of a void or a region not filled with the sealing resin 8.

The second main part 21 of the semiconductor device B1 is provided with a second recessed edge 213 recessed from the second edge 212. The second recessed edge 213 may be formed in the first process S141 of the third preparation step S14, for example. The second leadframe LF2 as processed in the first process S141 has a first prong 12 extending to the recess formed by the second recessed edge 213. The presence of a second recessed edge 213 permits the first prong 12 to be longer (in the y direction) than without. The tip 121 of such a first prong 12 has a larger area that can be bonded to a first electrode 71. The present embodiment can therefore ensure better electric connection between the first lead 1 and the first electrode 71. In the manufacturing method of the semiconductor device B1, in addition, the resin injected in the resin forming step S18 can flow through the recess formed by the second recessed edge 213 to reach the region below the second main part 21. This promotes the resin flow into the region covered by the second main part 21. In this way, the present embodiment can secure the path for the resin to flow into the region below the second main part 21, thereby avoiding the formation of a void or a region not filled with the sealing resin 8.

The first main part 11 of the semiconductor device B1 is provided with a first edge 112 and a first recessed edge 113. The first prongs 12 extend from the first edge 112. This configuration makes it possible to reduce the area of the first main part 11 without the need to reduce the length of the second prongs 22. Similarly, the second main part 21 is provided with a second edge 212 and a second recessed edge 213. The second prongs 22 extend from the second edge 212. This configuration makes it possible to reduce the area of the second main part 21 without the need to reduce the length of the first prongs 12. The placing step S15 may involve holding by suction the first main part 11 and the second main part 21 of the second leadframe LF2, for transporting the second leadframe LF2 to above the first leadframe LF1. For the stability during the transposition, applying a suction force over a larger area is preferable. The first main part 11 and the second main part 21 of this embodiment are not required to be smaller in area and thus desirable for stable transfer of the second leadframe LF2 in the placing step S15.

The semiconductor device B1 includes the first electrodes 71 and the second electrodes 72 that are alternately arranged in the x direction, so that the first prongs 12 and the second prongs 22 are provided alternately in the x direction. Precise placement of the first part 10 and the second part 20 is therefore desirable for electrically bonding the first electrodes 71 and the second electrode 72 to the first prongs 12 and the second prongs 22 properly. For example, the present embodiment can avoid placing the first prongs 12 undesirably close to the second prongs 22.

The method for manufacturing a semiconductor device and the semiconductor device of the present disclosure are not limited to the embodiments described above. Various design changes can be made to the specific configuration of each part of the method for manufacturing a semiconductor device and the semiconductor device.

Clause A1.

A method for manufacturing a semiconductor device, the method comprising:

a first preparation step of preparing a first leadframe that includes an island part;

a second preparation step of preparing a semiconductor element that includes an element obverse surface and an element reverse surface respectively facing in a first sense and a second sense of a thickness direction, the element obverse surface being provided with at least one first electrode and at least one second electrode;

a mounting step of mounting the semiconductor element on the island part with a first conductive paste interposed between the element reverse surface and the island part;

a third preparation step of preparing a second leadframe that includes a first part, a second part, a frame part, a first connecting part connecting the first part and the frame part, and a second connecting part connecting the second part and the frame part;

a placing step of placing the second leadframe with a second conductive paste interposed between the first part and the at least one first electrode and with a third conductive paste interposed between the second part and the at least one second electrode; and a curing step of curing the first conductive paste, the second conductive paste and the third conductive paste.

Clause A2.

The method according to Clause A1, further comprising:

a sealing resin forming step of forming, after the curing step, a sealing resin covering the semiconductor element, the first part, the second part, a portion of the first connecting part and a portion of the second connecting part; and a cutting step of cutting the first connecting part and the second connecting part.

Clause A3.

The method according to Clause A1 or A2, wherein the at least one first electrode comprises a plurality of first electrodes, the at least one second electrode comprises a plurality of second electrodes, the plurality of first electrodes and the plurality of second electrodes are alternately arranged in a first direction perpendicular to the thickness direction, the first part includes a first main part and a plurality of first prongs connected to the first main part, the second part includes a second main part and plurality of second prongs connected to the second main part, and in the placing step, the second conductive paste is interposed between the plurality of first prongs and the plurality of first electrodes, and the third conductive paste is interposed between the plurality of second prongs and the plurality of second electrodes.

Clause A4.

The method according to Clause A3, wherein the first main part is offset in a first sense of a second direction perpendicular to the thickness direction and the first direction, and the second main part is offset from the first main part in a second sense of the second direction.

Clause A5.

The method according to Clause A4, wherein the semiconductor element includes a third electrode disposed on the element obverse surface, and the third electrode is offset from the plurality of first electrodes in the second sense of the second direction and from the plurality of second electrodes in a first sense of the first direction.

Clause A6.

The method according to Clause A5, wherein the second leadframe includes a third connecting part connecting the first part and the frame part, the first connecting part extends from the first part in a second sense of the first direction, and the third connecting part extends from the first part in the first sense of the first direction.

Clause A7.

The method according to Clause A6, wherein the second leadframe includes a fourth connecting part connecting the second part and the frame part, the second connecting part extends from the second part in the second sense of the first direction, and the fourth connecting part extends from the second part in the second sense of the second direction.

Clause A8.

The method according to any one of Clauses A5 to A7, wherein the first leadframe includes a third part and a fourth part, the first part includes a first contacting part that is connected to the first main part from a side in the first sense of the second direction and extends in the second sense of the thickness direction, the second part includes a second contacting part that is connected to the second main part from a side in the second sense of the second direction and extends in the second sense of the thickness direction, and in the placing step, the second leadframe is placed with a fourth conductive paste interposed between the first contacting part and the third part and with a fifth conductive paste interposed between the second contacting part and the fourth part.

Clause A9.

The method according to any one of Clauses A5 to A8, further comprising bonding, after the curing step, a conducting member to the third electrode and the first leadframe.

Clause A10.

The method according to Clause A9, wherein the third electrode is located opposite in the second sense of the second direction from an outermost one of the plurality of first electrodes in the first sense of the first direction.

Clause A11.

A semiconductor device comprising:

a plurality of leads;

a semiconductor element; and a sealing resin covering a portion of each of the plurality of leads and the semiconductor element, wherein the plurality of leads include an island lead, a first lead and a second lead that are spaced apart from each other, the semiconductor element includes an element obverse surface and an element reverse surface respectively facing in a first sense and a second sense of a thickness direction, the element obverse surface being provided with at least one first electrode and at least one second electrode, the element reverse surface and the island lead are bonded to each other by a first conductive-bonding part, the first lead includes a first main part, at least one first prong and a first extended part, the second lead includes a second main part, at least one second prong and a second extended part, the at least one first prong and the at least one first electrode are bonded to each other by a second conductive-bonding part, the at least one second prong and the at least one second electrode are bonded to each other by a third conductive-bonding part, the first extended part includes a first end face exposed from the sealing resin, and the second extended part includes a second end face exposed from the sealing resin.

Clause A12.

The semiconductor device according to Clause A11, wherein the at least one first electrode comprises a plurality of first electrodes, the at least one second electrode comprises a plurality of second electrodes, the plurality of first electrodes and the plurality of second electrodes are alternately arranged in a first direction perpendicular to the thickness direction, the at least one first prong comprises a plurality of first prongs, and the at least one second prong comprises a plurality of second prongs.

Clause A13.

The semiconductor device according to Clause A12, wherein the first main part is offset in a first sense of a second direction perpendicular to the thickness direction and the first direction, and the second main part is offset from the first main part in a second sense of the second direction.

Clause A14.

The semiconductor device according to Clause A13, wherein the semiconductor element includes a third electrode disposed on the element obverse surface, and the third electrode is offset from the plurality of first electrodes in the second sense of the second direction and from the plurality of second electrodes in a first sense of the first direction.

Clause A15.

The semiconductor device according to Clause A14, wherein the first lead includes a third extended part, the first extended part extends from the first main part in a second sense of the first direction, and the third connecting part extends from the first main part in the first sense of the first direction.

Clause A16.

The semiconductor device according to Clause A15, wherein the second lead includes a fourth extended part, the second extended part extends from the second main part in the second sense of the first direction, and the fourth extended part extends from the second main part in the second sense of the second direction.

Clause A17.

The semiconductor device according to any one of clauses A14 to A16, wherein the plurality of leads include a third lead and a fourth lead, the first lead includes a first contacting part that is connected to the first main part from a side in the first sense of the second direction and extends in the second sense of the thickness direction, the second lead includes a second contacting part that is connected to the second main part from a side in the second sense of the second direction and extends in the second sense of the thickness direction, the first contacting part and the third lead are bonded to each other by a fourth conductive-bonding part, and the second contacting part and the fourth lead are bonded to each other by a fifth conductive-bonding part.

Clause A18.

The semiconductor device according to any one of clauses A14 to A17, further comprising a conducting member, wherein the plurality of leads include a fifth lead, and the conducting member is bonded to the third electrode and the fifth lead.

Clause A19.

The semiconductor device according to Clause A18, wherein the third electrode is located opposite in the second sense of the second direction from an outermost one of the plurality of first electrodes in the first sense of the first direction.

Clause B1.

A method for manufacturing a semiconductor device, the method comprising: a first preparation step of preparing a first leadframe that includes an island part;

a second preparation step of preparing a semiconductor element that includes an element obverse surface and an element reverse surface respectively facing in a first sense and a second sense of a thickness direction, the element obverse surface being provided with a first electrode and a second electrode;

a mounting step of mounting the semiconductor element on the island part with a first conductive paste interposed between the element reverse surface and the island part;

a third preparation step of preparing a second leadframe that includes a first part, a second part, a frame part, a first connecting part connecting the first part and the frame part, and a second connecting part connecting the second part and the frame part;

a placing step of placing the second leadframe with a second conductive paste interposed between the first part and the first electrode and with a third conductive paste interposed between the second part and the second electrode; and a curing step of curing the first conductive paste, the second conductive paste and the third conductive paste, wherein the first part includes a first main part and a first prong extending from the first main part, the second part includes a second main part and a second prong extending from the second main part toward the first main part as viewed in the thickness direction, the third preparation step includes forming a first recessed edge in a first edge of the first main part opposite the second main part, the first recessed edge being recessed in a direction in which the second prong extends as viewed in the thickness direction, and in the placing step, the second conductive paste is interposed between the first prong and the first electrode, and the third conductive paste is interposed between the second prong and the second electrode.

Clause B2.

The method according to Clause B1, wherein the first prong extends from the first main part toward the second main part as viewed in the thickness direction, and the third preparation step includes forming a second recessed edge in a second edge of the second main part opposite the first main part, the second recessed edge being recessed in a direction in which the first prong extends as viewed in the thickness direction.

Clause B3.

The method according to Clause B2, wherein the third preparation step includes a first process of stamping the second leadframe out of a metal sheet and a second process of bending a portion of the second leadframe after the first process.

Clause B4.

The method according to Clause B3, wherein the first recessed edge and the second recessed edge are formed in the first process.

Clause B5.

The method according to Clause B3 or B4, wherein the first prong and the second prong are bent in the second process.

Clause B6.

The method according to any one of Clauses B1 to B5, wherein the first electrode and the second electrode are arranged in a first direction perpendicular to the thickness direction, the first main part and the second main part are located opposite to each other relative to the semiconductor element in a second direction perpendicular to the thickness direction and the first direction, the first prong extends in the second direction from the first main part as viewed in the thickness direction, and the second prong extends in the second direction from the second main part as viewed in the thickness direction.

Clause B7.

The method according to Clause B6, wherein the first leadframe includes a third part and a fourth part, the first part includes a first contacting part that is connected to the first main part on an opposite side in the second direction from the first prong and extends in the second sense of the thickness direction, the second part includes a second contacting part that is connected to the second main part on an opposite side in the second direction from the second prong and extends in the second sense of the thickness direction, and in the placing step, the second leadframe is placed with a fourth conductive paste interposed between the first contacting part and the third part and with a fifth conductive paste interposed between the second contacting part and the fourth part.

Clause B8.

The method according to any one of Clauses B1 to B7, wherein the semiconductor element includes a third electrode disposed on the element obverse surface, and the method further comprises a step of bonding, after the curing step, a conducting member to the third electrode and the first leadframe.

Clause B9.

The method according to any one of Clauses B1 to B8, further comprising:

a sealing resin forming step of forming, after the curing step, a sealing resin covering the semiconductor element, the first part, the second part, a portion of the first connecting part, and a portion of the second connecting part; and a cutting step of cutting the first connecting part and the second connecting part.

Clause B10.

A semiconductor device comprising:

a plurality of leads;

a semiconductor element; and a sealing resin covering a portion of each of the plurality of leads and the semiconductor element, wherein the plurality of leads include an island lead, a first lead and a second lead that are spaced apart from each other, the semiconductor element includes an element obverse surface and an element reverse surface respectively facing in a first sense and a second sense of a thickness direction, the element obverse surface being provided with a first electrode and a second electrode;

the element reverse surface is bonded to the island lead, the first lead includes a first main part and a first prong extending from the first main part and bonded to the first electrode, the second lead includes a second main part and a second prong extending from the second main part toward the first main part as viewed in the thickness direction and bonded to the first electrode, and the first main part includes a first edge opposite the second main part and a first recessed edge recessed from the first edge in a direction in which the second prong extends as viewed in the thickness direction.

Clause B11.

The semiconductor device according to Clause B10, wherein the second main part includes a second edge opposite the first main part and a second recessed edge recessed from the second edge in a direction in which the first prong extends as viewed in the thickness direction.

Clause B12.

The semiconductor device according to Clause B10 or B11, wherein the first electrode and the second electrode are arranged in a first direction perpendicular to the thickness direction, the first main part and the second main part are located opposite to each other relative to the semiconductor element in a second direction perpendicular to the thickness direction and the first direction, the first prong extends in the second direction from the first main part as viewed in the thickness direction, and the second prong extends in the second direction from the second main part as viewed in the thickness direction.

Clause B13.

The semiconductor device according to Clause B12, wherein the plurality of leads include a third lead and a fourth lead, the first lead includes a first contacting part that is connected to the first main part on an opposite side in the second direction from the first prong and extends in the second sense of the thickness direction, the second lead includes a second contacting part that is connected to the second main part on an opposite side in the second direction from the second prong and extends in the second sense of the thickness direction, the first contacting part is bonded to the third lead, and the second contacting part is bonded to the fourth lead.

Clause B14.

The semiconductor device according to any one of Clauses B10 to B13, further comprising a conducting member, wherein the plurality of leads include a fifth lead, the semiconductor element includes a third electrode disposed on the element obverse surface, and the conducting member is bonded to the third electrode and the fifth lead.

REFERENCE NUMERALS

A1, A11, A2, B1: Semiconductor device
1: First lead
2: Second lead
3: Third lead
4: Fourth lead
5: Fifth lead
6: Island lead
7: Semiconductor element
8: Sealing resin
10: First part
11: First main part
12: First prong
13: First extended part
14: Third extended part
15: First contacting part
16: First projection
17: First recess
20: Second part
21: Second main part
22: Second prong
23: Second extended part
24: Fourth extended part
25: Second contacting part
26: Second projection
27: Second recess
29: Connecting part
30: Third part
31, 41, 51, 61: Thick part
32, 42, 52, 62: Thin part
33, 43, 53, 63: Extended part
40: Fourth part
49: Interconnecting part
50: Fifth part
60: Island part
70: Element body
71: First electrode
72: Second electrode
73: Third electrode
91: First conductive-bonding part

92: Second conductive-bonding part
93: Third conductive-bonding part
94: Fourth conductive-bonding part
95: Fifth conductive-bonding part
99: Wire
111, 211: Through-hole
112: First edge
113: First recessed edge
121, 221: Tip
122, 222: Root
130: First connecting part
131: First end face
140: Third connecting part
141: Third end face
212: Second edge
213: Second recessed edge
230: Second connecting part
231: Second end face
240: Fourth connecting part
241: Fourth end face
301, 401, 501, 601: Obverse surface
302, 402, 502, 602: Reverse surface
321, 421: Recess
330, 430, 530, 630: Connecting part
331, 431, 531, 631: End face
701: Element obverse surface
702: Element reverse surface
910: First conductive paste
920: Second conductive paste
930: Third conductive paste
940: Fourth conductive paste
950: Fifth conductive paste
LF1: First leadframe
LF2: Second leadframe
f1, f2: Frame part

The invention claimed is:

1. A method for manufacturing a semiconductor device, the method comprising:

a first preparation step of preparing a first leadframe that includes an island part;

a second preparation step of preparing a semiconductor element that includes an element obverse surface and an element reverse surface respectively facing in a first sense and a second sense of a thickness direction, the element obverse surface being provided with at least one first electrode and at least one second electrode;

a mounting step of mounting the semiconductor element on the island part with a first conductive paste interposed between the element reverse surface and the island part;

a third preparation step of preparing a second leadframe that includes a first part, a second part, a frame part, a first connecting part connecting the first part and the frame part, and a second connecting part connecting the second part and the frame part;

a placing step of placing the second leadframe with a second conductive paste interposed between the first part and the at least one first electrode and with a third conductive paste interposed between the second part and the at least one second electrode; and a curing step of curing the first conductive paste, the second conductive paste and the third conductive paste, wherein the first leadframe includes a third part and a fourth part, the first part includes a first main part and a first contacting part that is connected to the first main part and extends in the second sense of the thickness direction, the second part includes a second main part and a second contacting part that is connected to the second main part and extends in the second sense of the thickness direction, and in the placing step, the second leadframe is placed with a fourth conductive paste interposed between the first contacting part and the third part and with a fifth conductive paste interposed between the second contacting part and the fourth part.

2. The method according to claim 1, further comprising:

a sealing resin forming step of forming, after the curing step, a sealing resin covering the semiconductor element, the first part, the second part, a portion of the first connecting part and a portion of the second connecting part; and a cutting step of cutting the first connecting part and the second connecting part.

3. The method according to claim 1, wherein the at least one first electrode comprises a plurality of first electrodes, the at least one second electrode comprises a plurality of second electrodes, the plurality of first electrodes and the plurality of second electrodes are alternately arranged in a first direction perpendicular to the thickness direction, the first part includes a plurality of first prongs connected to the first main part, the second part includes a plurality of second prongs connected to the second main part, and in the placing step, the second conductive paste is interposed between the plurality of first prongs and the plurality of first electrodes, and the third conductive paste is interposed between the plurality of second prongs and the plurality of second electrodes.

4. The method according to claim 3, wherein the first main part is offset from the second main part in a first sense of a second direction perpendicular to the thickness direction and the first direction, and the second main part is offset from the first main part in a second sense of the second direction.

5. The method according to claim 4, wherein the semiconductor element includes a third electrode disposed on the element obverse surface, and the third electrode is offset from the plurality of first electrodes in the second sense of the second direction and from the plurality of second electrodes in a first sense of the first direction.

6. The method according to claim 5, wherein the second leadframe includes a third connecting part connecting the first part and the frame part, the first connecting part extends from the first part in a second sense of the first direction, and the third connecting part extends from the first part in the first sense of the first direction.

7. The method according to claim 6, wherein the second leadframe includes a fourth connecting part connecting the second part and the frame part, the second connecting part extends from the second part in the second sense of the first direction, and the fourth connecting part extends from the second part in the second sense of the second direction.

8. The method according to claim 5, wherein the first contacting part is connected to the first main part from a side of the first main part in the first sense of the second direction, and the second contacting part is connected to the second main part from a side of the second main part in the second sense of the second direction.

9. The method according to claim 5, further comprising bonding, after the curing step, a conducting member to the third electrode and the first leadframe.

10. The method according to claim 9, wherein the third electrode is located opposite in the second sense of the second direction from an outermost one of the plurality of first electrodes in the first sense of the first direction.

11. The method according to claim 3, wherein the plurality of second prongs extend from the second main part toward the first main part as viewed in the thickness direction, the third preparation step includes a process of forming a recessed edge in an edge of the first main part opposite the second main part as viewed in the thickness direction, and the recessed edge is recessed from the edge in a direction in which the plurality of second prongs extend as viewed in the thickness direction.

12. The method according to claim 1, wherein the first contacting part and the second contacting part are each elongated in a first direction perpendicular to the thickness direction, the first part includes a first projection that is spaced apart from the first contacting part in the first direction, that is connected to the first main part, and that extends from the first main part in the second sense of the thickness direction, the first projection includes a first-projection end in the thickness direction, and the first contacting part includes a first-contacting-part end in the thickness direction, the first-projection end being offset from the first-contacting-part end in the second sense of the thickness direction, the second part includes a second projection that is spaced apart from the second contacting part in the first direction, that is connected to the second main part, and that extends from the second main part in the second sense of the thickness direction, the second projection includes a second-projection end in the thickness direction, and the second contacting part includes a second-contacting-part end in the thickness direction, the second-projection end being offset from the second-contacting-part end in the second sense of the thickness direction.

13. A semiconductor device comprising:

a plurality of leads;

a semiconductor element; and a sealing resin covering a portion of each of the plurality of leads and the semiconductor element, wherein the plurality of leads includes an island lead, a first lead and a second lead spaced apart from each other, the semiconductor element includes an element obverse surface and an element reverse surface respectively facing in a first sense and a second sense of a thickness direction, the element obverse surface being provided with at least one first electrode and at least one second electrode, the element reverse surface and the island lead are bonded to each other by a first conductive-bonding part, the first lead includes a first main part, at least one first prong and a first extended part, the second lead includes a second main part, at least one second prong and a second extended part, the at least one first prong and the at least one first electrode are bonded to each other by a second conductive-bonding part, the at least one second prong and the at least one second electrode are bonded to each other by a third conductive-bonding part, the first extended part includes a first end face exposed from the sealing resin, the second extended part includes a second end face exposed from the sealing resin, the plurality of leads includes a third lead and a fourth lead, the first lead includes a first contacting part that is connected to the first main part and extends in the second sense of the thickness direction, the second lead includes a second contacting part that is connected to the second main part and extends in the second sense of the thickness direction, the first contacting part and the third lead are bonded to each other by a fourth conductive-bonding part, and the second contacting part and the fourth lead are bonded to each other by a fifth conductive-bonding part.

14. The semiconductor device according to claim 13, wherein the at least one first electrode comprises a plurality of first electrodes, the at least one second electrode comprises a plurality of second electrodes, the plurality of first electrodes and the plurality of second electrodes are alternately arranged in a first direction perpendicular to the thickness direction, the at least one first prong comprises a plurality of first prongs, and the at least one second prong comprises a plurality of second prongs.

15. The semiconductor device according to claim 14, wherein the first main part is offset from the second main part in a first sense of a second direction perpendicular to the thickness direction and the first direction, and the second main part is offset from the first main part in a second sense of the second direction.

16. The semiconductor device according to claim 15, wherein the semiconductor element includes a third electrode disposed on the element obverse surface, and the third electrode is offset from the plurality of first electrodes in the second sense of the second direction and from the plurality of second electrodes in a first sense of the first direction.

17. The semiconductor device according to claim 16, wherein the first lead includes a third extended part, the first extended part extends from the first main part in a second sense of the first direction, and the third extended part extends from the first main part in the first sense of the first direction.

18. The semiconductor device according to claim 17, wherein the second lead includes a fourth extended part, the second extended part extends from the second main part in the second sense of the first direction, and the fourth extended part extends from the second main part in the second sense of the second direction.

19. The semiconductor device according to claim 16, wherein the first contacting part is connected to the first main part from a side of the first main part in the first sense of the second direction, and the second contacting part is connected to the second main part from a side of the second main part in the second sense of the second direction.

20. The semiconductor device according to claim 16, further comprising a conducting member, wherein the plurality of leads includes a fifth lead, and the conducting member is bonded to the third electrode and the fifth lead.

21. The semiconductor device according to claim 20, wherein the third electrode is located opposite in the second sense of the second direction from an outermost one of the plurality of first electrodes in the first sense of the first direction.

22. The semiconductor device according to claim 13, wherein the at least one second prong extends from the second main part toward the first main part as viewed in the thickness direction, and the first main part includes an edge opposite the second main part as viewed in the thickness direction and a recessed edge recessed from the edge in a direction in which the at least one second prong extends.

23. The semiconductor device according to claim 13, wherein the first contacting part and the second contacting part are each elongated in a first direction perpendicular to the thickness direction, the first lead includes a first projection that is spaced apart from the first contacting part in the first direction, that is connected to the first main part, and that extends from the first main part in the second sense of the thickness direction, the first projection includes a first-projection end in the thickness direction, and the first contacting part includes a first-contacting-part end in the thickness direction, the first-projection end being offset from the first-contacting-part end in the second sense of the thickness direction, the second lead includes a second projection that is spaced apart from the second contacting part in the first direction, that is connected to the second main part, and that extends from the second main part in the second sense of the thickness direction, the second projection includes a second-projection end in the thickness direction, and the second contacting part includes a second-contacting-part end in the thickness direction, the second-projection end being offset from the second-contacting-part end in the second sense of the thickness direction.

* * * * *